United States Patent
Li et al.

(10) Patent No.: US 8,053,159 B2
(45) Date of Patent: *Nov. 8, 2011

(54) ANTIREFLECTIVE COATINGS FOR VIA FILL AND PHOTOLITHOGRAPHY APPLICATIONS AND METHODS OF PREPARATION THEREOF

(75) Inventors: Bo Li, San Jose, CA (US); Joseph Kennedy, San Jose, CA (US); Nancy Iwamoto, Ramona, CA (US); Victor Lu, Santa Cruz, CA (US); Roger Leung, San Jose, CA (US); Mark A. Fradkin, Portland, OR (US); Makarem A. Hussein, Beaverton, OR (US); Michael D. Goodner, Hillsboro, OR (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/717,028

(22) Filed: Nov. 18, 2003

(65) Prior Publication Data
US 2005/0171277 A1   Aug. 4, 2005

(51) Int. Cl.
*G03C 1/00*   (2006.01)
*C04B 41/50*   (2006.01)
*D06M 15/643*   (2006.01)
*C07F 7/18*   (2006.01)

(52) U.S. Cl. .............. 430/270.1; 106/287.1; 106/287.11; 106/287.13

(58) Field of Classification Search ............... 430/270.1; 528/544; 106/287.1, 287.11, 287.13
See application file for complete search history.

(56) References Cited

U.S. PATENT DOCUMENTS

| | | | |
|---|---|---|---|
| 31,987 A * | 4/1861 | Nozaki et al. ................. 33/342 |
| 58,929 A * | 10/1866 | Adams et al. ............ 292/341.19 |
| 106,376 A * | 8/1870 | Kennedy et al. ............... 172/157 |
| 172,896 A * | 2/1876 | Adams et al. ................... 91/168 |
| 3,884,702 A | 5/1975 | Koshimo et al. |
| 4,191,571 A | 3/1980 | Nonogaki et al. |
| 4,299,938 A | 11/1981 | Green et al. |
| 4,413,052 A | 11/1983 | Green et al. |

(Continued)

FOREIGN PATENT DOCUMENTS
EP   0494744 A1   7/1992

(Continued)

OTHER PUBLICATIONS
U.S. Appl. No. 90/008,360, Shipley Company, L.L.C.

(Continued)

*Primary Examiner* — Cynthia Kelly
*Assistant Examiner* — Connie P Johnson
(74) *Attorney, Agent, or Firm* — Sandra Poteat Thompson; Buchalter Nemer

(57) ABSTRACT

An absorbing composition is described herein that includes at least one inorganic-based compound, at least one absorbing compound, and at least one material modification agent. In addition, methods of making an absorbing composition are also described that includes: a) combining at least one inorganic-based compound, at least one absorbing compound, at least one material modification agent, and one or more solvents to form a reaction mixture, wherein the at least one material modification agent comprises at least one acid and water; and b) heating the reaction mixture to form an absorbing material, a coating or a film.

16 Claims, 31 Drawing Sheets

U.S. PATENT DOCUMENTS

| | | | |
|---|---|---|---|
| 4,430,153 A | 2/1984 | Gleason et al. | |
| 4,587,138 A | 5/1986 | Yau et al. | 427/88 |
| 4,863,827 A | 9/1989 | Jain et al. | |
| 4,863,829 A | 9/1989 | Furuta et al. | |
| 4,910,122 A | 3/1990 | Arnold et al. | 430/313 |
| 4,935,583 A | 6/1990 | Kyle | |
| 4,943,511 A | 7/1990 | Lazarus et al. | |
| 4,950,583 A | 8/1990 | Brewer et al. | |
| 5,100,503 A * | 3/1992 | Allman et al. | 438/694 |
| 5,126,289 A | 6/1992 | Ziger | |
| 5,152,834 A | 10/1992 | Allman | |
| 5,302,849 A | 4/1994 | Cavasin | |
| 5,403,680 A | 4/1995 | Otagawa et al. | |
| 5,674,648 A | 10/1997 | Brewer et al. | |
| 5,693,691 A | 12/1997 | Flaim et al. | 523/436 |
| 5,759,625 A | 6/1998 | Laubacher et al. | |
| 5,851,730 A | 12/1998 | Thackeray et al. | |
| 5,851,738 A | 12/1998 | Thackeray et al. | |
| 6,040,053 A | 3/2000 | Scholz et al. | |
| 6,165,697 A | 12/2000 | Thackeray et al. | |
| 6,268,108 B1 | 7/2001 | Iguchi et al. | 430/271.1 |
| 6,268,457 B1 * | 7/2001 | Kennedy et al. | 528/39 |
| 6,280,911 B1 * | 8/2001 | Trefonas, III | 430/326 |
| 6,313,257 B1 * | 11/2001 | Abbey | 528/109 |
| 6,365,765 B1 * | 4/2002 | Baldwin et al. | 556/440 |
| 6,368,400 B1 | 4/2002 | Baldwin et al. | 106/481 |
| 6,399,269 B2 | 6/2002 | Mizutani et al. | |
| 6,451,503 B1 | 9/2002 | Thackeray et al. | |
| 6,472,128 B2 | 10/2002 | Thackeray et al. | |
| 6,506,497 B1 * | 1/2003 | Kennedy et al. | 428/447 |
| 6,528,235 B2 | 3/2003 | Thackeray et al. | |
| 6,605,362 B2 | 8/2003 | Baldwin et al. | |
| 6,677,392 B2 * | 1/2004 | Ravichandran et al. | 524/86 |
| 6,740,685 B2 * | 5/2004 | Li et al. | 521/52 |
| 6,908,722 B2 * | 6/2005 | Ebata et al. | 430/270.1 |
| 6,956,097 B2 * | 10/2005 | Kennedy et al. | 528/31 |
| 7,012,125 B2 * | 3/2006 | Kennedy et al. | 528/26 |
| 7,014,982 B2 | 3/2006 | Thackeray et al. | |
| 2002/0068181 A1 * | 6/2002 | Baldwin et al. | 428/447 |
| 2003/0091838 A1 * | 5/2003 | Hayashi et al. | 428/447 |
| 2003/0199633 A1 * | 10/2003 | Leon et al. | 524/800 |
| 2004/0122197 A1 * | 6/2004 | Putzer | 528/17 |
| 2004/0166434 A1 * | 8/2004 | Dammel et al. | 430/270.1 |
| 2006/0110682 A1 | 5/2006 | Thackeray et al. | |
| 2006/0155594 A1 | 7/2006 | Almeida et al. | |
| 2007/0272123 A1 * | 11/2007 | Kennedy et al. | 106/287.1 |
| 2009/0029145 A1 * | 1/2009 | Thies et al. | 428/315.7 |

FOREIGN PATENT DOCUMENTS

| | | |
|---|---|---|
| JP | 59109565 A | 6/1984 |
| JP | 6056560 A | 3/1994 |
| JP | 6095385 A | 4/1994 |
| JP | 9183853 A | 7/1997 |
| JP | 10502461 T | 3/1998 |
| JP | 10161315 A | 6/1998 |
| JP | 2001-92122 | 4/2001 |
| JP | 2006-241407 A | 9/2006 |
| WO | 0077575 A | 12/2000 |
| WO | WO 02/06402 | 1/2002 |
| WO | 02/16477 A2 | 2/2002 |
| WO | 03/044078 A | 5/2003 |
| WO | 03/044600 A1 | 5/2003 |
| WO | 03/070809 A2 | 8/2003 |
| WO | 03/089992 A1 | 10/2003 |
| WO | WO 03088343 A1 * | 10/2003 |
| WO | WO -03088344 A1 * | 10/2003 |
| WO | WO 03088344 A1 * | 10/2003 |

OTHER PUBLICATIONS

Brewer, T. et al., "The Reduction of the Standing Wave Effect in Positive Photoresists," Jour. Appl. Photogr. Eng., vol. 7, No. 6, 184-186 (Dec. 1981).

Crivello et al., J. Polym. Sci.: Polym. Chem. 21 (1983), 97-109.

Degussa, "Silanes for Adhesives and Sealants," 18-19, available at www.dynasylan.com.

Lamola, A. et al., "Chemically Amplified Resists," Solid State Technology, 53-60 (Aug. 1991).

Y.-C. Lin et al., "Some Aspects of Anti-Reflective Coating for Optical Lithography," Advances in Resist Technology and Processing, Proc., SPIE vol. 469, 30-37 (1984).

McKean et al., "Characterization of a Novolac-Based Three-Component Deep-UV Resist," Chem. Mater. (1990) 2, 619-624.

Nalamasu et al., "Development of a Chemically Amplified Positive (CAMP) Resist Material for Single Layer Deep-UV Lithography," Advances in Resist Technology and Processing VII, SPIE 1262, 32-41 (1990).

Silverstein et al., "Spectrometric Identification of Organic Compounds," 4th Ed. John Wiley & Sons 1991, 309-311.

Willson, C.G., "Organic Resist Materials—Theory and Chemistry," Introduction to Microlithography, American Chemical Society, 87-159 (1983).

Hawley's Condensed Chemical Dictionary, 11th ed., 85-86.

"HD Micro Puts Out Positive Polyamide," Electronic News, Jun. 19, 2000.

Jaskol et al., Toxicological Sciences, 22(1): 103-112 (1994).

Yusuke Izumi, et al., "Hydrosilyation of Carbonyl Compounds Catalyzed by Solid Acids and Bases," Tetrahedron Letters, vol. 32, No. 36, pp. 4744 (1991).

* cited by examiner anthraflavic acid
1

9-anthracene carboxylic acid
2

9-anthracene methanol
3

9-anthracene ethanol
4

9-anthracene propanol
5

9-anthracene butanol
6 alizarin
7 quinizarin
8 primuline
9

4-methoxyphenylazobenzene-4-carboxy
propyl triethoxysilane
41

FIG. 1B
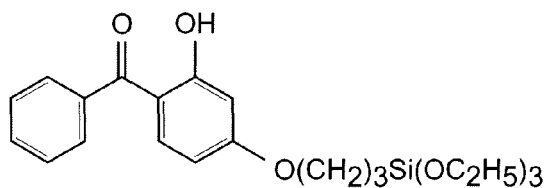
2-hydroxy-4-(3-triethoxysilylpropoxy)-
diphenylketone
10
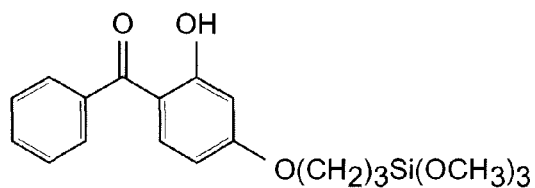
2-hydroxy-4-(3-trimethoxysilylpropoxy)-
diphenylketone
11
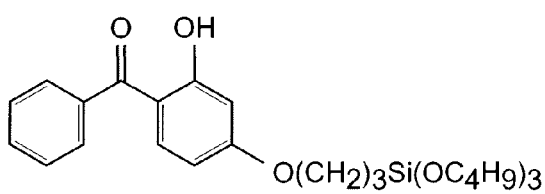
2-hydroxy-4-(3-tributoxysilylpropoxy)-
diphenylketone
12
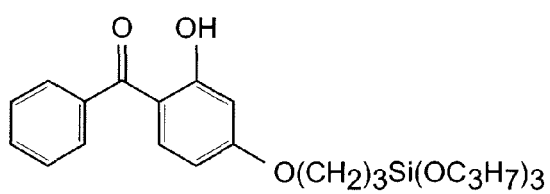
2-hydroxy-4-(3-tripropoxysilylpropoxy)-
diphenylketone
13
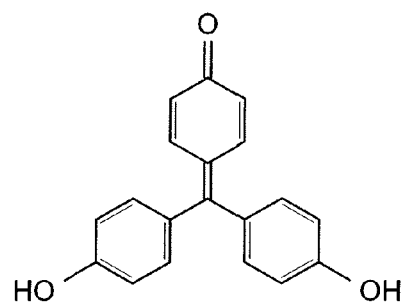
rosolic acid
14
triethoxysilylpropyl-1,8-naphthalimide
15
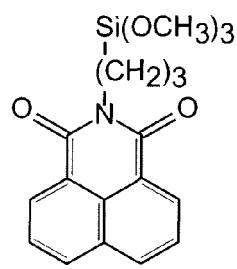
trimethoxysilylpropyl-1,8-naphthalimide
16
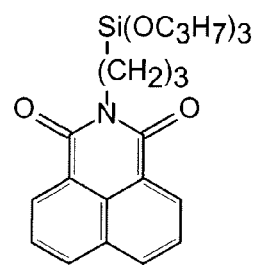
tripropoxysilylpropyl-1,8-naphthalimide
17

FIG. 1C

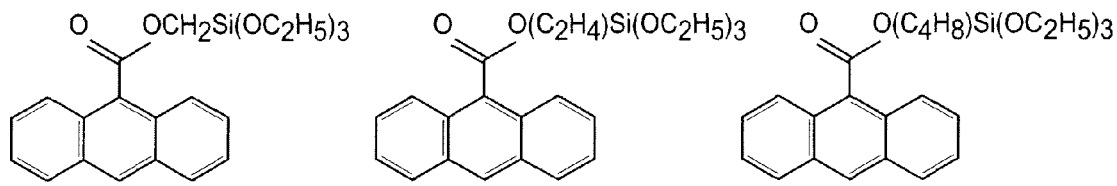

9-anthracene carboxy-methyl triethoxysilane (TESAC)
18

9-anthracene carboxy-ethyl triethoxysilane
19

9-anthracene carboxy-butyl triethoxysilane
20

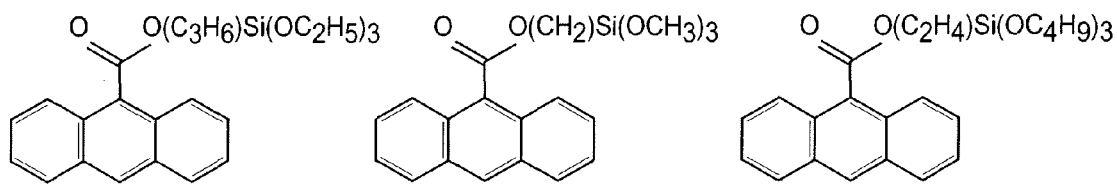

9-anthracene carboxy-propyl triethoxysilane (TESAC)
21

9-anthracene carboxy-methyl trimethoxysilane
22

9-anthracene carboxy-ethyl tributoxysilane
23

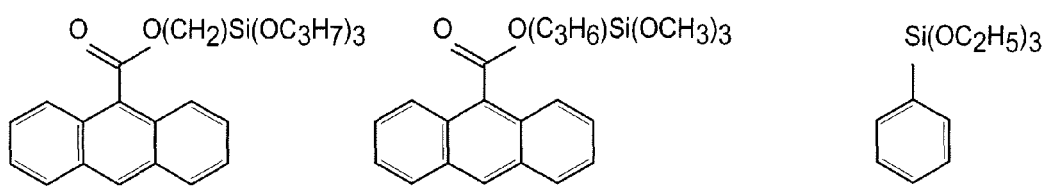

9-anthracene carboxy-methyl tripropoxysilane
24

9-anthracene carboxy-methyl trimethoxysilane
25 phenyltriethoxysilane
26

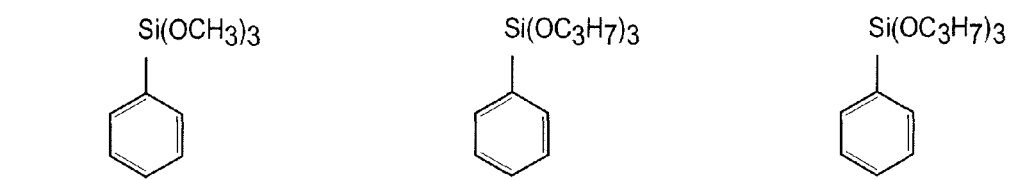

phenyltrimethoxysilane
27 phenyltripropoxysilane
28 phenyltriethoxysilane
29

FIG. 1D
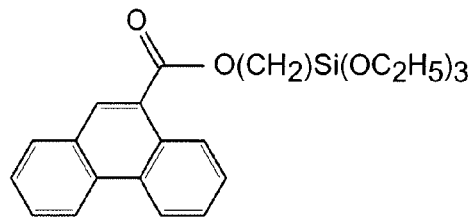
10-phenanthrene carboxy-methyl
triethoxysilane
29
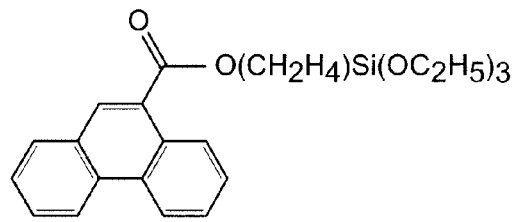
10-phenanthrene carboxy-ethyl
triethoxysilane
30
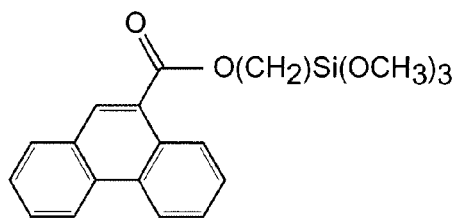
10-phenanthrene carboxy-methyl
trimethoxysilane
31
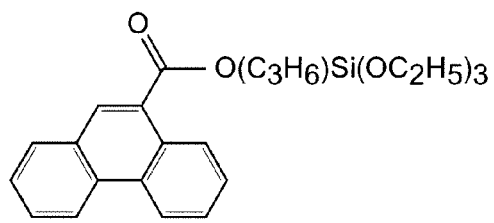
10-phenanthrene carboxy-propyl
triethoxysilane
32
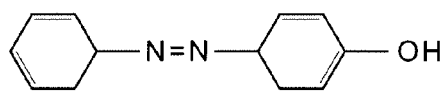
4-phenylazophenol
33
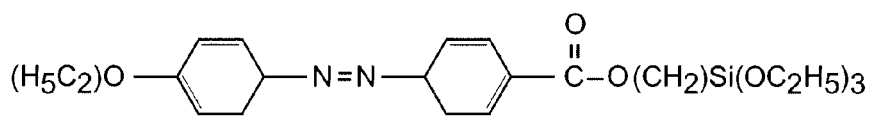
4-ethoxyphenylazobenzene-4-carboxy
methyl triethoxysilane
34
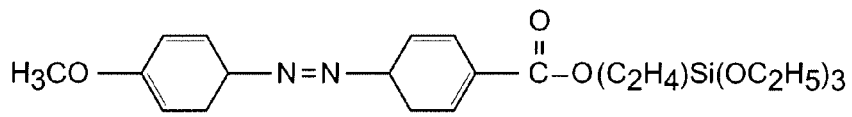
4-methoxyphenylazobenzene-4-carboxy
ethyl triethoxysilane
35

FIG. 1E
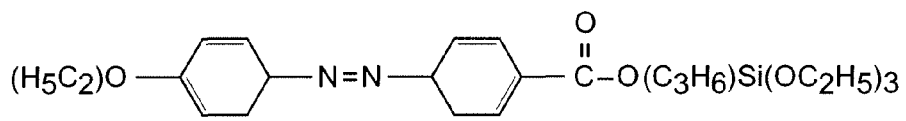
4-ethoxyphenylazobenzene-4-carboxy
propyl triethoxysilane
36
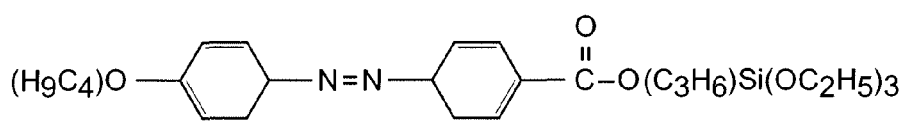
4butoxyphenylazobenzene-4-carboxy
propyl triethoxysilane
37
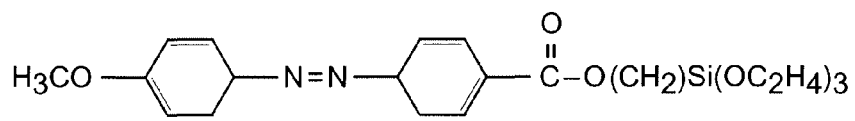
4-methoxyphenylazobenzene-4-carboxy
methyl triethoxysilane
38
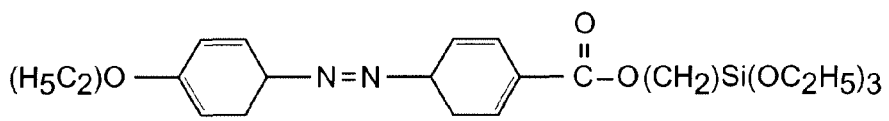
4-ethoxyphenylazobenzene-4-carboxy
methyl triethoxysilane
39
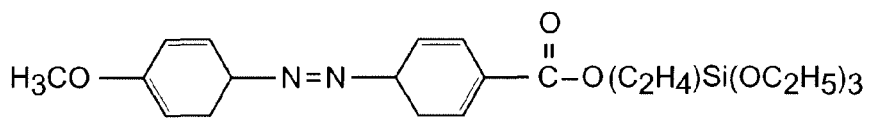
4-methoxyphenylazobenzene-4-carboxy
ethyl triethoxysilane
40

- Although water clearly present at 130/150 C bake, the WER is still quite low. SiOH is clearly present at 925 cm-1.

FIG. 17   193 Absorb. Composition Stabilized TMAA -vs- TMAN: Mn -vs- Aging

193 Absorb. Composition Stabilized TMAA -vs- TMAN: Water Contact Angle -vs- Aging

ANTIREFLECTIVE COATINGS FOR VIA FILL AND PHOTOLITHOGRAPHY APPLICATIONS AND METHODS OF PREPARATION THEREOF

FIELD OF THE INVENTION

The present invention relates generally to anti-reflective/absorbing compositions and coating materials and more specifically to anti-reflective/absorbing compositions and coating materials for use in photolithography and via-fill applications and methods of producing the materials.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

Organic polymer films, particularly those that absorb at the i-line (365 nm) and g-line (436 nm) wavelengths conventionally used to expose photoresists, and at the recently used 157 nm, 193 nm, 248 nm wavelengths, have been employed or are being tested as anti-reflective coatings. However, the fact that the organic ARC's share many chemical properties with the organic photoresists can limit usable process sequences. Furthermore, ARC's, including both organic and inorganic ARC's, may intermix with photoresist layers. Organic and inorganic ARC's can mix with photoresist layers if they are not sufficiently baked or cured.

One solution to avoid intermixing is to introduce thermosetting binders as additional components of organic ARC's, as described for example in U.S. Pat. No. 5,693,691 to Flaim et al. Dyes may also be incorporated in organic ARC's, as well as, optionally, additional additives such as wetting agents, adhesions promoters, preservatives, and plasticizers, as described in U.S. Pat. No. 4,910,122 to Arnold et al. Another attempt to avoid intermixing is found in U.S. Pat. No. 6,268,108 issued to Iguchi et al. However, the compositions for forming antireflective coatings found in Iguchi must be irradiated with actinic rays in order to produce an acid, which in turn activates a crosslinking reaction. Even though these previous patents may address some of the issues with intermixing, the problem of the lack of 86- to 90-degree uniformity on the resist edges because of the coupled ARC layer has not been addressed in the prior art.

Photoresists and anti-reflective coatings can also influence one another to the extent that the chemical properties of the anti-reflective coating and/or the resist material can lead the resist to "fall over" once a pattern has been developed into the resist. In other words, the patterned resist sidewall can't maintain an approximate 90-degree angle with respect to the anti-reflective coating after photoresist developing. Instead the resist will take on a 120-degree or an 80-degree angle with respect to the anti-reflective coating. These imperfections are also an indication that photoresist materials and anti-reflective coatings are not necessarily chemically, physically or mechanically compatible.

Photoresists and anti-reflective coatings can also have substandard or unacceptable etch selectivity or stripping selectivity. Poor etch selectivity and/or stripping selectivity can lead to low etch rates for the film. Poor etch selectivity can also lead to poor transfer of critical dimensions from the printing step(s) through the etch step(s). Attempts have been made at improving the etch rate by providing highly absorbing substances with subsititution groups that can condense the silane compound to specific silane compounds, as seen in JP Patent Application No.: 2001-92122 published on Apr. 6, 2001. However, the etch selectivity obtained with these reactive compounds are not sufficient for most photoresists and anti-reflective coatings and require additional chemical reaction steps that may not be necessary.

In addition, photoresists and anti-reflective coatings often have difficulty with fill bias and voiding in via structures to the point where any planarization of the surface is severely compromised. Oftentimes, the two goals of increasing etch selectivity and minimizing fill bias and voiding directly conflict with one another, which is why it's important to review and understand the goals of each group of applications. Also, to sufficiently fill and planarize via arrays requires that a relatively thick anti-reflective coating exist. If the ARC coating is organic, such a thick coating will further compromise the accurate transfer of the as patterned critical dimension through the film stack.

Via first trench last (VFTL) copper dual damascene patterning through a low dielectric constant (less than about 3) material or ultra low dielectric constant (less than about 2) material can be very difficult. One of the problems with this type of patterning is the selective removal of the sacrificial fill material from the low dielectric constant materials. Previous work has shown that Si—O fill materials (either UV absorbing or transparent) are the optimum materials platform, if the dielectric layer is Si—O based.

In order to improve the removal selectivity of the sacrificial fill material it can be chemically weakened relative to the dielectric material. A porogen or a high boiling solvent can be added to the fill material to weaken it; however, in order to achieve photoresist developer resistance the Si—O based fill material either needs to be baked to or at a sufficiently high temperature to ensure crosslinking or the porogen content needs to be lowered. Both of these methods designed to achieve photoresist developer resistance work with respect to strengthening the fill material, but the removal selectivity of the fill material is significantly decreased.

A class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MoO_4$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition. Also, even though these ARC's are chemically different than the previously mentioned organic ARC's, the coupled resist layers can still suffer from "falling over" after being developed, as based on the chemical, physical, and mechanical incompatibility of the ARC layer and the resist layer—which is a common problem when trying to couple resist materials and anti-reflective coatings.

In developing anti-reflective coatings that can a) absorb strongly and uniformly in the ultraviolet spectral region; b) keep the resist material from "falling over" and expanding outside or contracting inside of the intended resist line and c) be impervious to photoresist developers and methods of production of spin-on glass anti-reflective coatings, Baldwin et al developed several anti-reflective coatings that are superior to conventional anti-reflective coatings, including those materials and coatings found in US Issued U.S. Pat. Nos. 6,268,457 issued on Jul. 31, 2001; 6,365,765 issued on Apr. 2, 2002; 6,368,400 issued on Apr. 9, 2002; U.S. patent application Ser. Nos. 09/491,166 filed Jan. 26, 2000; 10/012,651 filed Nov. 5, 2001; 10/012,649 filed Nov. 5, 2001; 10/001,143 filed Nov. 15, 2001; PCT Applications Serial Nos: PCT/US00/15772 filed on Jun. 8, 2000; WO 02/06402 filed on Jul. 12, 2001; PCT/US01/45306 filed on Nov. 15, 2001; Pending PCT Application Serial No.: PCT/US02/35101 filed on Oct. 31, 2002; European Patent Applications Serial No. 00941275.0 filed on Jun. 6, 2000; and 01958953.0 filed on Jul. 17, 2001, which are all commonly assigned and incorporated herein by reference in their entirety. However, with all of these materials, it would be beneficial to be able to modify the materials, coatings and films described therein to improve etch selectivity and/or stripping selectivity, improve the lithography performance and to minimize fill bias.

Therefore, an absorbing/anti-reflective coating and lithography material that a) absorbs strongly and uniformly in the ultraviolet spectral region, b) can keep the resist material from "falling over" and expanding outside or contracting inside of the intended resist line, c) would be impervious to photoresist developers and methods of production of the SOG anti-reflective coating described; d) can satisfy any goals of increasing etch selectivity and/or stripping selectivity and e) can satisfy any goals of minimizing fill bias and voiding in via structures; f) can form solutions that are stable and have a good shelf life; g) is compatible to various lithographic patterning techniques, including those that utilize ArF; h) can be applied to a surface by any suitable application method, such as spin-on coating or chemical vapor deposition (CVD); i) is capable of via fill and planarization; j) has good wet etch and dry etch rates; and k) can be utilized in a number of applications, components and materials, including logic applications and flash applications.

SUMMARY OF THE INVENTION

An absorbing composition is described herein that includes at least one inorganic-based compound, at least one absorbing compound, and at least one material modification agent.

In addition, methods of making an absorbing composition are also described that includes: a) combining at least one inorganic-based compound, at least one absorbing compound, at least one material modification agent, an acid/water mixture, and one or more solvents to form a reaction mixture; and b) allowing the reaction mixture to form the absorbing composition at room temperature.

Another method of making an absorbing composition includes: a) combining at least one inorganic-based compound, at least one absorbing compound, at least one material modification agent, an acid/water mixture, and one or more solvents to form a reaction mixture; and b) heating the reaction mixture to form the absorbing composition.

Yet another method of making an absorbing composition is described that includes: a) combining at least one inorganic-based compound, at least one absorbing compound, at least one material modification agent, and one or more solvents to form a reaction mixture, wherein the at least one material modification agent comprises at least one acid and water; and b) heating the reaction mixture to form an absorbing material, a coating or a film.

In other methods of making an absorbing composition described herein, those methods include: a) combining at least one inorganic-based compound, at least one absorbing compound, at least one material modification agent, and one or more solvents to form a reaction mixture, wherein the at least one material modification agent comprises at least one acid and water; and b) allowing the reaction mixture to form an absorbing material, a coating or a film.

BRIEF DESCRIPTION OF THE TABLES

Figure 1A:
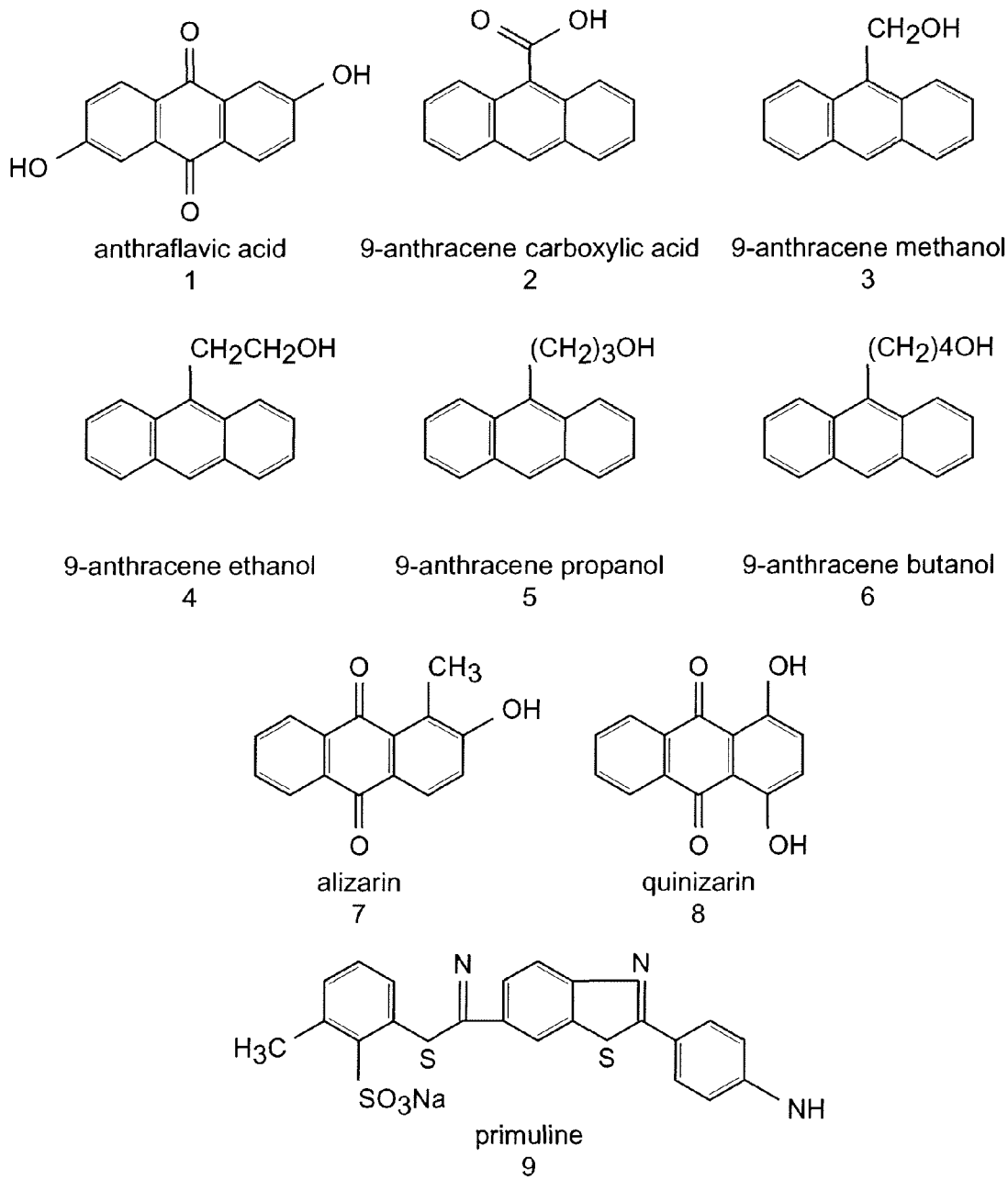
FIG. 1 shows chemical formulae of contemplated absorbing compounds.
Figure 1F:
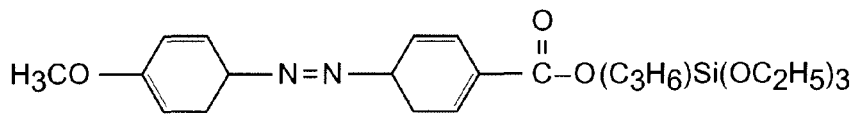
Figure 2:
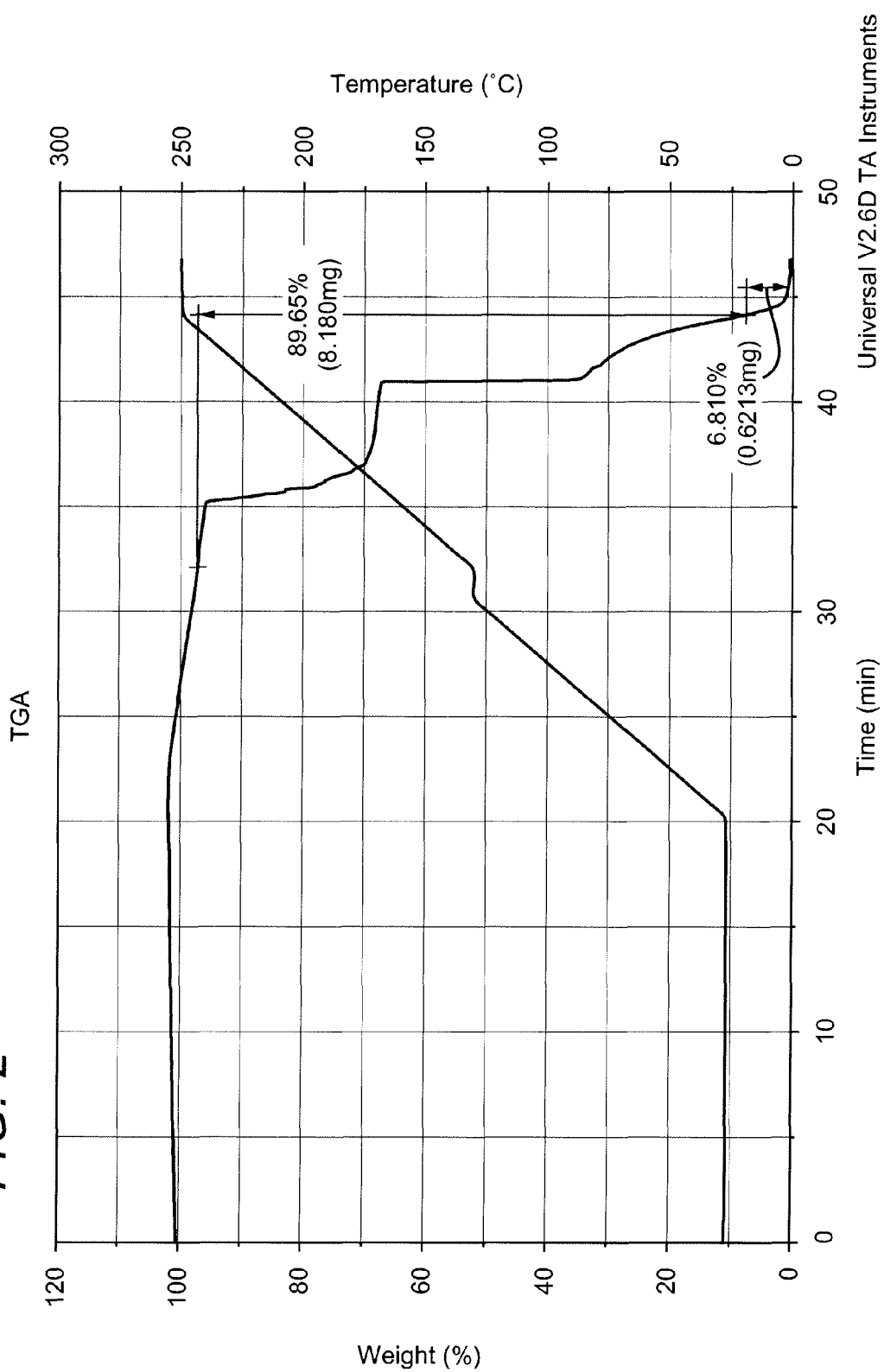
FIG. 2 shows TGA analysis data for a contemplated embodiment.
Figure 3:
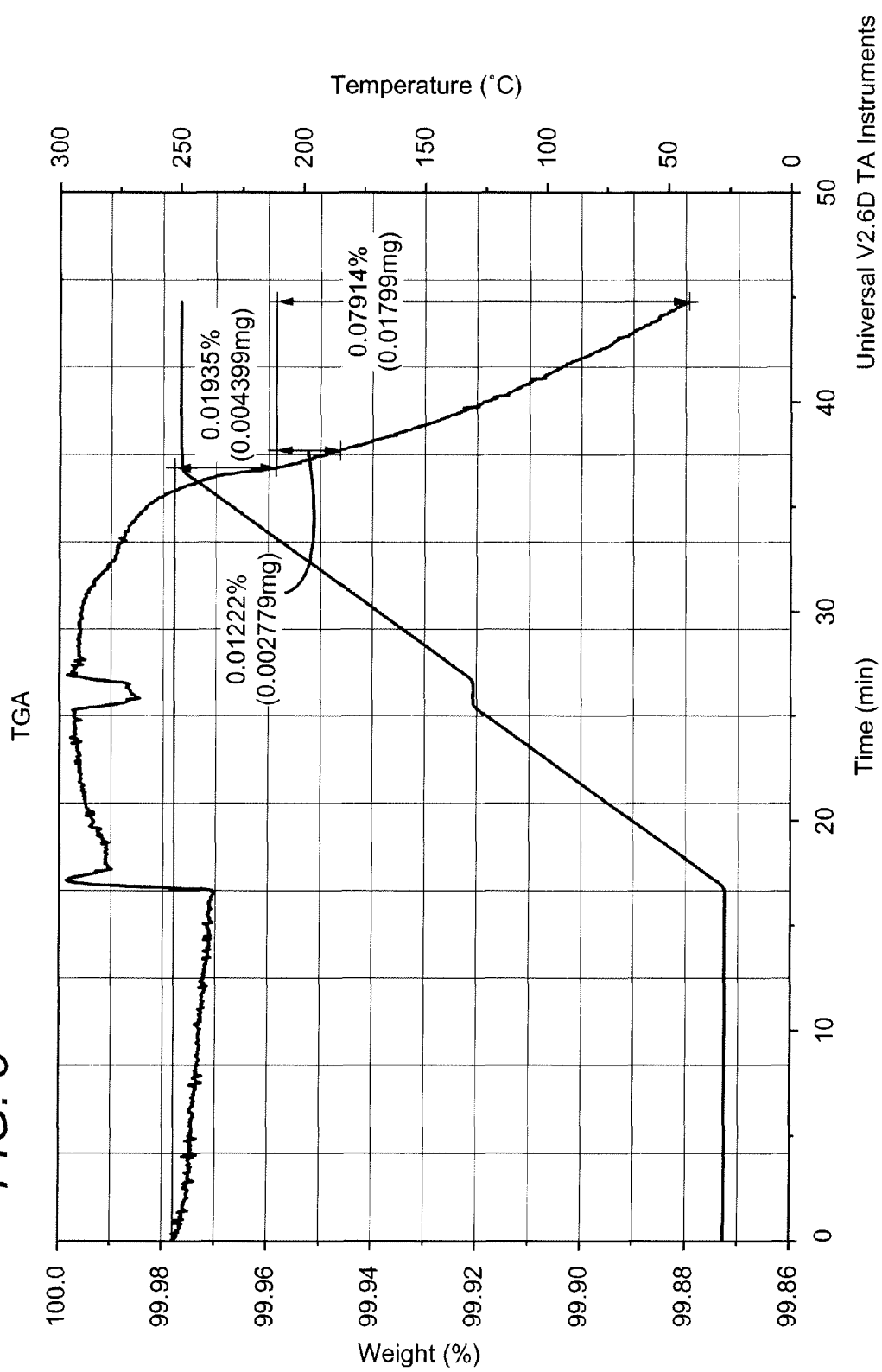
FIG. 3 shows TGA analysis data for a contemplated embodiment.
Figure 4:
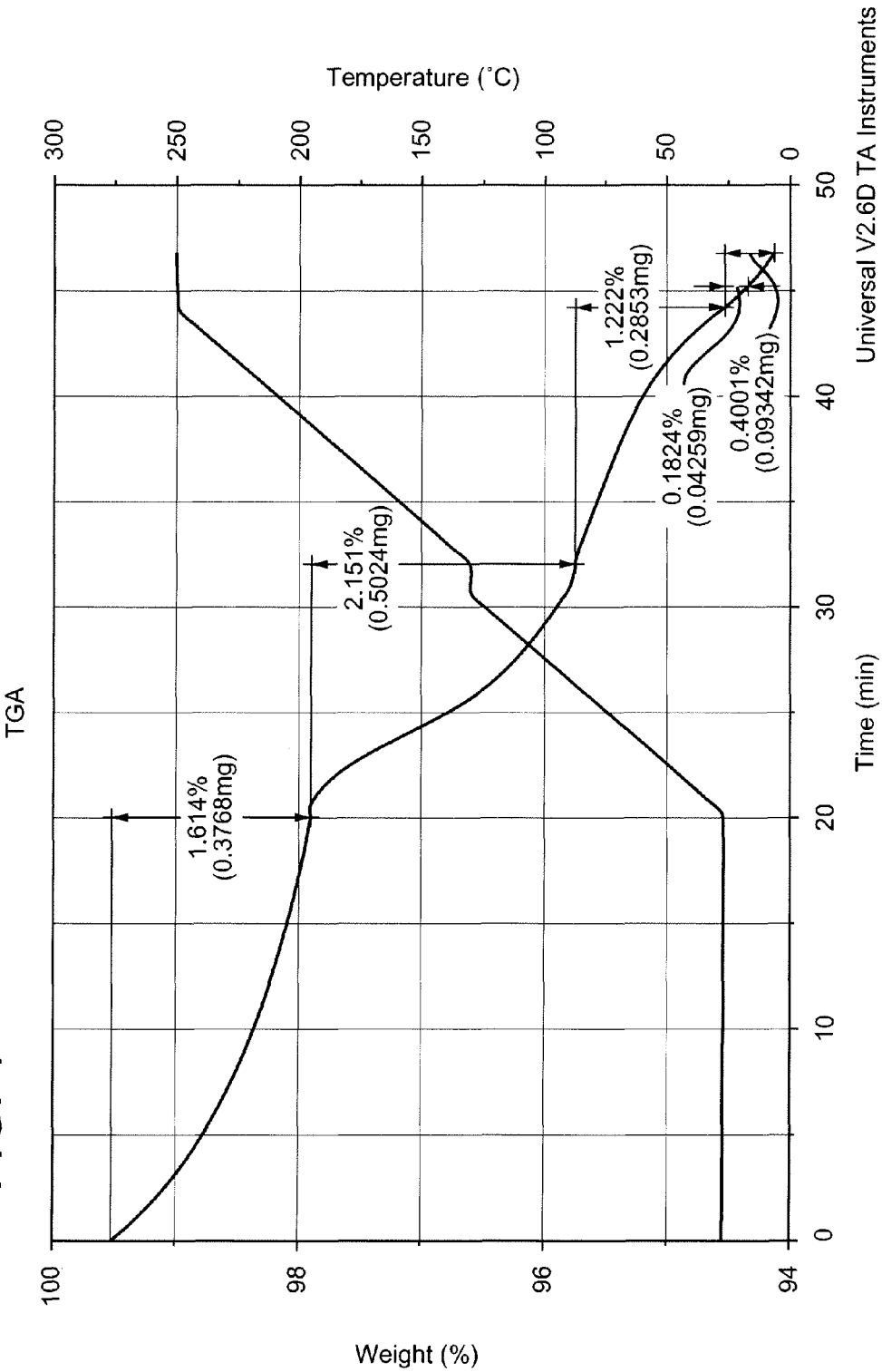
FIG. 4 shows TGA analysis data for a contemplated embodiment.
Figure 5:
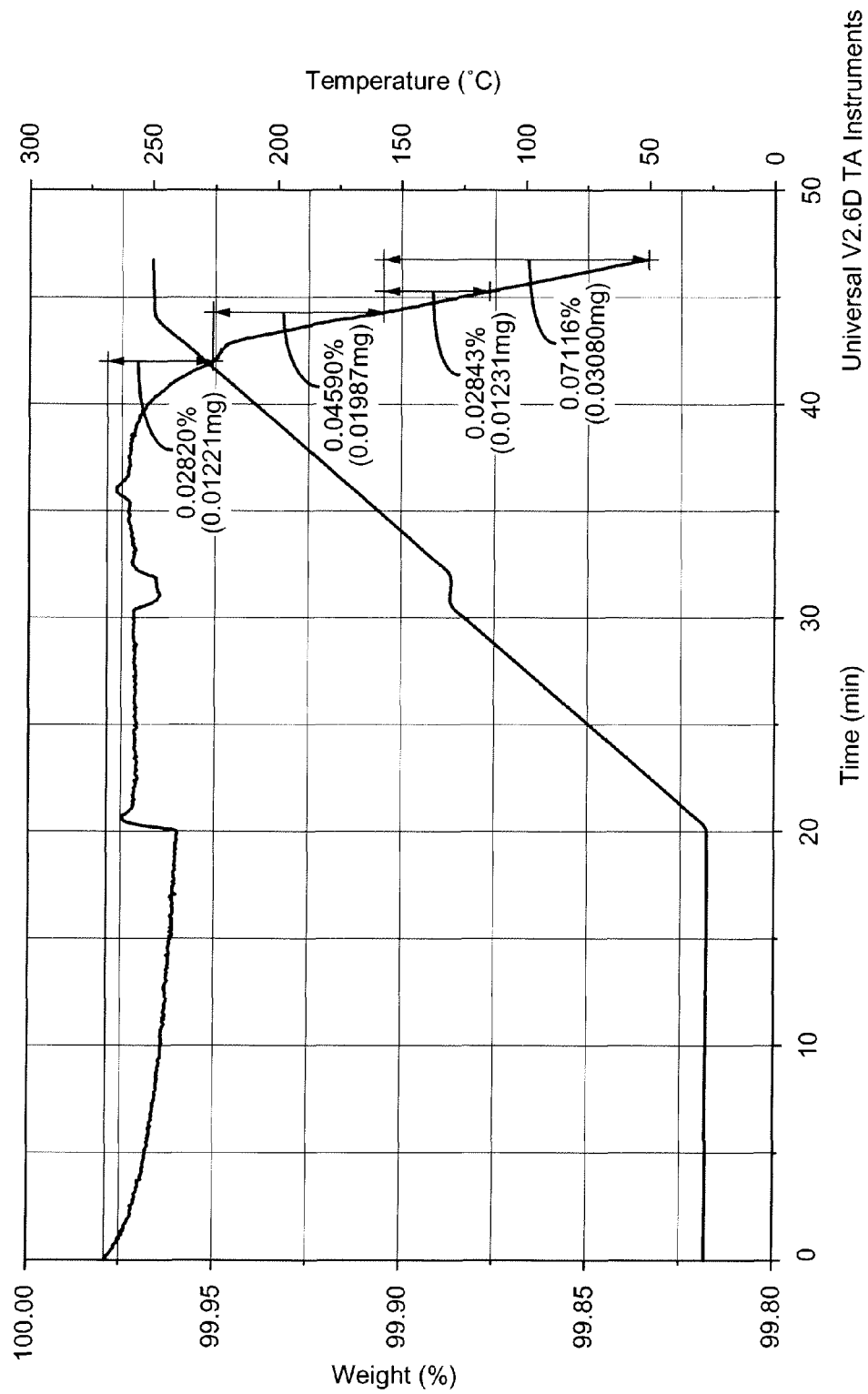
FIG. 5 shows TGA analysis data for a contemplated embodiment.

Table 1 shows temperature matrices developed using several contemplated absorbing compositions.

Table 2 shows temperature matrices developed using several contemplated absorbing compositions.

Table 3 shows temperature matrices developed using several contemplated absorbing compositions.

Table 4 shows temperature matrices developed using several contemplated absorbing compositions.

Table 5 shows temperature matrices developed using several contemplated absorbing compositions.

Table 6 shows temperature matrices developed using several contemplated absorbing compositions.

Table 7 shows temperature matrices developed using several contemplated absorbing compositions.

Table 8 shows temperature matrices developed using several contemplated absorbing compositions.

Table 9 shows temperature matrices developed using several contemplated absorbing compositions.

Table 10 shows raw data collected showing wet etch rates for contemplated absorbing compositions.

Table 11 shows raw data collected showing wet etch rates for contemplated absorbing compositions.

Table 12 shows nitrogen content of a contemplated absorbing composition.

Table 13 shows wet etch rate data and film property data for several contemplated absorbing compositions.

Table 14 shows solution aging study results for contemplated absorbing compositions.

Table 15 shows film aging study results for contemplated absorbing compositions.

Table 16 shows film aging study results for contemplated absorbing compositions.

Table 17 shows wet etch rate study data for contemplated absorbing compositions.

Table 18 shows wet etch rate study data for contemplated absorbing compositions.

Table 19 shows wet etch rate study data for contemplated absorbing compositions.

Table 20 shows molecular weight growth and aging studies for contemplated absorbing compositions.

Table 21 shows wet etch rate study data for contemplated absorbing compositions.

Table 22 shows water contact angle, n & k data and molecular weight data for a contemplated embodiment.

Table 23 shows water contact angle, n & k data and molecular weight data for a contemplated embodiment.

Table 24 shows wet etch rate study data for contemplated absorbing compositions.

DETAILED DESCRIPTION

Absorbing/anti-reflective coatings and lithography materials have now been developed that a) absorbs strongly and uniformly in the ultraviolet spectral region, b) keeps the resist material from "falling over" and expanding outside or contracting inside of the intended resist line, c) is impervious to photoresist developers and methods of production of the SOG anti-reflective coating described; d) satisfies goals of increasing etch selectivity and/or stripping selectivity and e) satisfies goals of minimizing fill bias and voiding in via structures; f) forms solutions that are stable and have a good shelf life; g) is compatible to various lithographic patterning techniques, including those that utilize ArF; h) can be applied to a surface by any suitable application method, such as spin-on coating or chemical vapor deposition (CVD); i) is capable of via fill and planarization; j) has good wet etch and dry etch rates; and k) can be utilized in a number of applications, components and materials, including logic applications and flash applications.

An absorbing composition and/or coating material contemplated herein comprise at least one inorganic compound and/or material, at least one absorbing compound and/or material and at least one material modification agent. The at least one material modification agent may include any compound or composition that can modify the coating material to improve the photolithographic, compatibility and/or physical quality of the resulting film or layered material, such as by improving the etch selectivity and/or stripping selectivity, by minimizing the fill bias, by facilitating removal and/or by improving the stability or shelf life of the material/composition. The at least one material modification agent may comprise at least one adhesion promoter, at least one pH tuning agent, at least one porogen, at least one leveling agent, at least one high-boiling solvent, at least one crosslinking agent, at least one catalyst, at least one capping agent and/or combinations thereof. Surprisingly, at least in some embodiments, the material modification agent (such as the at least one adhesion promoter) comprises a compound or composition that is conventionally viewed as a poisoning agent for lithography and thus avoided by the industry, but its use in the embodiments described herein improves the adhesion of the lithography composition without poisoning the composition.

In contemplated embodiments, the addition of the material modification agent will improve at least one of the etching rate, the shelf life, the ability of the composition to planarize and/or via fill, or the measurable lithography properties by at least 25% over those same compositions without the additional material modification agent. In other contemplated embodiments, the addition of the material modification agent will improve at least one of the etching rate, the shelf life, the ability of the composition to planarize and/or via fill, or the measurable lithography properties by at least 50% over those same compositions without the additional material modification agent. In yet other contemplated embodiments, the addition of the material modification agent will improve at least one of the etching rate, the shelf life, the ability of the composition to planarize and/or via fill, or the measurable lithography properties by at least 75% over those same compositions without the additional material modification agent.

Inorganic-Based Materials and Inorganic Compounds

Inorganic-based compounds and/or materials and/or contemplated spin-on inorganic-based compounds and/or materials, such as silicon-based, gallium-based, germanium-based, arsenic-based, boron-based compounds or combinations thereof are contemplated herein. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, silicate polymers, silsilic acid derivaties, and mixtures thereof. A contemplated silazane polymer is perhydrosilazane, which has a "transparent" polymer backbone.

As used herein, inorganic-based materials, inorganic compounds and spin-on-glass materials also include siloxane polymers and block polymers, hydrogensiloxane polymers of the general formula $(H_{0-1.0}SiO_{1.5-2.0})_x$, hydrogensilsesquioxane polymers, which have the formula $(HSiO_{1.5})_x$, where x is greater than about four and derivatives of silsilic acid. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$ and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof.

As used herein, the phrases "spin-on material", "spin-on composition" and "spin-on inorganic composition" may be used interchangeable and refer to those solutions and compositions that can be spun-on to a substrate or surface. It is further contemplated that the phrase "spin-on-glass materials" refers to a subset of "spin-on inorganic materials", in that spin-on glass materials refer to those spin-on materials that comprise silicon-based compounds and/or polymers in whole or in part. It should be understood however that these contemplated materials and compositions may be applied to a surface by any suitable method or apparatus, including spin-on deposition, vapor deposition, chemical vapor deposition and the like.

In some contemplated embodiments, specific organohydridosiloxane resins utilized herein have the following general formulas:

         Formula (1)

$[H\!-\!Si_{1.5}]_n[R\!-\!SiO_{1.5}]_m$

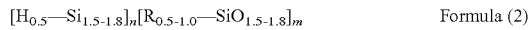         Formula (2)

$[H_{0.5}\!-\!Si_{1.5\text{-}1.8}]_n[R_{0.5\text{-}1.0}\!-\!SiO_{1.5\text{-}1.8}]_m$

         Formula (3)

$[H_{0\text{-}1.0}\!-\!Si_{1.5}]_n[R\!-\!SiO_{1.5}]_m$

         Formula (4)

$[H\!-\!Si_{1.5}]_x[R\!-\!SiO_{1.5}]_y[SiO_2]_z$ wherein:
the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof, and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Several contemplated polymers comprise a polymer backbone encompassing alternate silicon and oxygen atoms. In contrast with previously known organosiloxane resins, some of the polymers and inorganic-based compositions and materials utilized herein have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formulae 1, 2, 3 and 4. By attaching only hydrogen and/or R groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon hydrogen bonds, the shelf life of the organohydridosiloxane resin solutions described herein is enhanced as compared to previously known hydridosiloxane resins.

Some of the contemplated compounds and methods of producing those compounds previously mentioned are taught by commonly assigned U.S. Pat. No. 6,143,855 and pending U.S. Ser. No. 10/078,919 filed Feb. 19, 2002; Honeywell International Inc.'s commercially available HOSP® product; nanoporous silica such as taught by commonly assigned U.S. Pat. No. 6,372,666; Honeywell International Inc.'s commercially available NANOGLASS®E product; organosilsesquioxanes taught by commonly assigned WO 01/29052; and fluorosilsesquioxanes taught by commonly assigned U.S. Pat. No. 6,440,550, incorporated herein in their entirety. Other contemplated compounds are described in the following issued patents and pending applications, which are herein incorporated by reference in their entirety: (PCT/US00/15772 filed Jun. 8, 2000; U.S. application Ser. No. 09/330,248 filed Jun. 10, 1999; U.S. application Ser. No. 09/491,166 filed Jun. 10, 1999; U.S. Pat. No. 6,365,765 issued on Apr. 2, 2002; U.S. Pat. No. 6,268,457 issued on Jul. 31, 2001; U.S. application Ser. No. 10/001,143 filed Nov. 10, 2001; U.S. application Ser. No. 09/491,166 filed Jan. 26, 2000; PCT/US00/00523 filed Jan. 7, 1999; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; U.S. application Ser. No. 09/611,528 filed Mar. 20, 1998; and U.S. Application Ser. No. 60/043,261). Silica compounds contemplated herein are those compounds found in US Issued U.S. Pat. Nos. 6,022,812; 6,037,275; 6,042,994; 6,048,804; 6,090,448; 6,126,733; 6,140,254; 6,204,202; 6,208,041; 6,318,124 and 6,319,855.

In some contemplated embodiments, the polymer backbone conformation is a cage configuration. Accordingly, there are only very low levels or reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein. As used herein, the term "backbone" refers to a contiguous chain of atoms or moieties forming a polymeric strand that are covalently bound such that removal of any of the atoms or moiety would result in interruption of the chain.

As used herein, the term "monomer" refers to any chemical compound that is capable of forming a covalent bond with itself or a chemically different compound in a repetitive manner. The repetitive bond formation between monomers, such as through radical polymerization, condensation polymerization, addition polymerization and the like, may lead to a linear, branched, super-branched, or three-dimensional product. Furthermore, monomers may themselves comprise repetitive building blocks, and when polymerized the polymers formed from such monomers are then termed "block polymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In some contemplated embodiments, the molecular weight (either $M_W$ or $M_N$) of the inorganic-based compound may be changed in order to change the solubility of the material. In turn, changing the solubility of the material helps to prevent voiding and increases the planarization ability of the material.

Absorbing Compounds

As mentioned earlier, contemplated materials comprise at least one absorbing compound and/or material. Many naphthalene-, phenanthrene- and anthracene-based compounds have significant absorption at 248 nm and below. Benzene-based, equivalently termed here phenyl-based, compounds have significant absorption at wavelengths shorter than 200 nm. While these naphthalene-, anthracene-, phenanthrene- and phenyl-based compounds are frequently referred to as dyes, the term absorbing compound is used here because the absorptions of these compounds are not limited to wavelengths in the visible region of the spectrum. However, not all such absorbing compounds can be incorporated into inorganic-based materials for use as anti-reflective coating materials. Preferred absorbing compounds suitable for use have a definable absorption peak centered around wavelengths such as 248 nm, 193 nm, 157 nm or other ultraviolet wavelengths, such as 365 nm, that may be used in photolithography. It is contemplated that a suitable "definable absorption peak" is one that is at least 0.5 nm in width, wherein width is calculated by those methods commonly known in the art of photolithography. In more preferred embodiments, the definable absorption peak is at least 1 nm in width. In even more preferred embodiments, the definable absorption peak is at least 5 nm in width. In most preferred embodiments, the definable absorption peak is at least 10 nm in width.

The chromophores of suitable absorbing compounds typically have at least one benzene ring, and where there are two or more benzene rings, the rings may or may not be fused. Incorporatable absorbing compounds have an accessible reactive group attached to the chromophore, wherein the reactive groups include hydroxyl groups, amine groups, carboxylic acid groups, and substituted silyl groups with silicon bonded to one, two, or three "leaving groups," such as alkoxy groups, acetoxy groups or halogen atoms. Ethoxy or methoxy groups or chlorine atoms are frequently used as leaving groups. Contemplated reactive groups comprise silicon-alkoxy, silicondialkoxy and silicontrialkoxy groups, such as siliconethoxy, silicondiethoxy, silicontriethoxy, siliconmethoxy, silicondimethoxy, and silicontrimethoxy groups and halosilyl groups, such as chlorosilyl, dichlorosilyl, and trichlorosilyl groups, and acetoxy groups like methyltriacetoxysilane, tetraacetoxysilane.

The reactive groups may be directly bonded to the chromophore, as, for example, in phenyltriethoxysilane, or the reactive groups may be attached to the chromophore through an ester, a ketone and/or oxygen linkage or a hydrocarbon bridge, as, for example, in 9-anthracene carboxy-alkyl trialkoxysilane. The inclusion of silicontrialkoxy groups on chromophores has been found to be advantageous, especially for promoting stability of the absorbing SOG films. Other useful absorbing compounds are those compounds that contain an azo group, —N═N—, and an accessible reactive group, particularly those containing an azo group linking benzene rings, especially when absorption around 365 nm is desired for the particular application. Azo groups may be included as part of a straight-chain molecule, a cyclic molecule or a hybrid straight-chain/cyclic molecule.

The absorbing compounds may be incorporated interstitially in the inorganic-based material matrix. The absorbing compounds may also be chemically bonded to the inorganic-based material or polymer. In some contemplated embodiments, the incorporatable absorbing compounds form bonds with the inorganic-based material backbone or polymer backbone via the accessible reactive groups.

Absorbing compounds and materials may also comprise a silicon-based compound and an incorporatable absorbing compound that absorbs light at wavelengths less than about 375 nm. Further, it is contemplated that in other embodiments at least one of the silicon-based compound or the incorporatable absorbing compound comprises at least one alkyl group, alkoxy group, ketone group, acetoxy group, or azo group.

Examples of absorbing compounds suitable for use include those absorbing compounds that have a definable absorption peak around wavelengths less than about 375 nm, such as 365 nm, 248 nm, 193 nm and 157 nm, which include compounds such as anthraflavic acid (1), 9-anthracene carboxylic acid (2), 9-anthracene methanol (3), 9-anthracene ethanol (4), 9-anthracene propanol (5), 9-anthracene butanol (6), alizarin (7), quinizarin (8), primuline (9), 2-hydroxy-4-(3-triethoxysilylpropoxy)-diphenylketone (10), 2-hydroxy-4-(3-trimethoxysilylpropoxy)-diphenylketone (11), 2-hydroxy-4-(3-tributoxysilylpropoxy)-diphenylketone (12), 2-hydroxy-4-(3-tripropoxysilylpropoxy)-diphenylketone (13), rosolic acid (14), triethoxysilylpropyl-1,8-naphthalimide (15), trimethoxysilylpropyl-1,8-naphthalimide (16), tripropoxysilylpropyl-1,8-naphthalimide (17), 9-anthracene carboxy-methyl triethoxysilane (18), 9-anthracene carboxyethyl triethoxysilane (19), 9-anthracene carboxy-butyl triethoxysilane (20), 9-anthracene carboxypropyl triethoxysilane (21), 9-anthracene carboxy-methyl trimethoxysilane (22), 9-anthracene carboxy-ethyl tributoxysilane (23), 9-anthracene carboxy-methyl tripropoxysilane (24), 9-anthracene carboxy-propyl trimethoxysilane (25), phenyltriethoxysilane (26), phenyltrimethoxysilane (27), phenyltripropoxysilane (28), 10-phenanthrene carboxy-methyl triethoxysilane (29), 10-phenanthrene carboxy-ethyl triethoxysilane (30), 10-phenanthrene carboxy-methyl trimethoxysilane (31), 10-phenanthrene carboxy-propyl triethoxysilane (32), 4-phenylazophenol, (33), 4-ethoxyphenylazobenzene-4-carboxy-methyl triethoxysilane (34), 4-methoxyphenylazobenzene-4-carboxy-ethyl triethoxysilane (35), 4-ethoxyphenylazobenzene-4-carboxy-propyl triethoxysilane (36), 4-butoxyphenylazobenzene-4-carboxy-propyl triethoxysilane (37), 4-methoxyphenylazobenzene-4-carboxy-methyl triethoxysilane (38), 4-ethoxyphenylazobenzene-4-carboxy-methyl triethoxysilane (39), 4-methoxyphenylazobenzene-4-carboxy-ethyl triethoxysilane (40), 4-methoxyphenylazobenzene-4-carboxy-propyl triethoxysilane (41), and combinations, thereof. Chemical formulas of absorbing compounds 1-41 are illustrated in FIGS. 1a-1f. Advantageous results have been obtained, for example, with 9-anthracene carboxy-methyl triethoxysilane (18) with combinations of 9-anthracene methanol (3), 2-hydroxy-4-(3-triethoxysilylpropoxy)-diphenylketone (10), and rosolic acid (14), and with phenyltriethoxysilane (26). It should be appreciated, however, that this list of specific compounds is not an exhaustive list, and that contemplated compounds can be selected from the broader chemical compound classes that comprise these specific compounds. It should also be appreciated that suitable absorbing compounds may be organic-based or inorganic-based compounds. In some contemplated embodiments, the absorbing compound may be organic-based, as long as the ARC doesn't share the same chemical properties with the photoresist, which can limit the useable process sequences. However, the class of photoresist materials can be broad because the addition of a material modification agent to the absorbing composition and/or coating material, such as a pH tuning agent, makes it possible to match any photolithographic resist material with an absorbing material and/or absorbing coating material and make them compatible with one another. Examples of some contemplated photolithographic resist materials comprise acrylate-based resist materials, epoxy-based chemically amplified resists, fluoropolymer resists (which are especially useful when contemplating a 157 nm absorption wavelength), poly (norbornene-maleic anhydride) alternating co-polymers, polystyrene systems and diazonaphthoquinone/novolac resists.

Absorbing compounds 1-25 and 29-41 are available commercially, for example, from Aldrich Chemical Company (Milwaukee, Wis.). 9-anthracene carboxy-alkyl trialkoxysilanes are synthesized using esterification methods, as described in detail in PCT Patent Application Serial No. PCT/US02/36327 filed on Nov. 12, 2002, which is commonly-owned and incorporated herein in its entirety by reference, including all related and commonly-owned foreign and domestic issued patents and patent applications. Absorbing compounds 26-28 is available commercially from Gelest, Inc. (Tullytown, Pa.). Examples of phenyl-based absorbing compounds in addition to absorbing compounds (26-28), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds. Alkoxybenzoic acids may also be used as absorbing compounds, including methoxybenzoic acid.

A general method of synthesizing 9-anthracene carboxy-alkyl trialkoxysilane compounds comprises using 9-anthracene carboxylic acid and a chloromethyl trialkoxysilane compound as reactants. Specifically, a method of synthesizing 9-anthracene carboxy-methyl triethoxysilane (18) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture that is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (18) as a dark amber oily liquid, which may be purified. This method is significant because it is suitable to use to produce any compound in the class of 9-anthracene carboxy-alkyl trialkoxysilanes, including 9-anthracene carboxy-ethyl triethoxysilane, 9-anthracene carboxy-propyl trimethoxysilane, and 9-anthracene carboxy-propyl triethoxysilane.

Material Modification Agents

As mentioned, the absorbing compositions and/or coating materials contemplated herein comprise at least one material modification agent. The at least one material modification agent may include any compound or composition that can modify the coating material to improve the photolithographic, compatibility and/or physical quality of the resulting film or layered material, such as by improving the etch selectivity, the stability or shelf life of the composition, the adhesive properties and/or stripping selectivity or by minimizing the fill bias. The at least one material modification agent may comprise at least one adhesion promoter, at least one pH tuning agent, at least one porogen, at least one high-boiling solvent, at least one crosslinking agent, at least one catalyst, at least one capping agent and/or a combination thereof.

Adhesion Promoters

In some contemplated embodiments, the at least one adhesion promoter comprises at least one of the following characteristics: a) is thermally stable after heat treatment, such as baking, at temperatures generally used for electronic and semiconductor component manufacture (see Example 2 and FIGS. 2-5); b) has a relatively low catalytic ability, in that the donor does not initiate significant crosslinking activity in the composition to which it is added; c) is relatively neutral, so that the composition retains a low pH; d) is acidic, in order to lower the pH of the composition; e) does not initiate or propagate reactions that increase the molecular weight of species in the composition to which it is added; f) can surprisingly act as an adhesion promoter by promoting electrostatic and coulombic interactions between layers of materials, as opposed to conventionally understood Van der Waals interactions.

Adhesion to an organic resist polymer designed for low absorptivity in the UV is inherently difficult because such resists are designed with low polarity and few functional groups with which to interact adhesively. The adhesion mechanisms of silica-based formulations specifically to these organic resist polymers follows one of two pathways: a) adhesion promotion due to reduction in silanol content and increase in Van der Waals interactions and b) adhesion promotion due to an increase in the ionic contributions such as electrostatic and coulombic interaction.

Surprisingly, it has been found that the latter mechanism is dominant, although both play a role. In a contemplated embodiment, the addition of at least one adhesion promoter, such as at least one weak acid/weak base, at least one weak acid/strong base, at least one strong acid/strong base, at least one strong acid/weak base, at least one amine base, at least one amine salt or a combination thereof increases the electrostatic and coulombic interaction. Both modeled and experimental results indicate that the salt and not the neutral (non-ionic) form of the amine enhance adhesion sufficiently with the resist to avoid collapse of lithographically defined resist lines. This adhesion enhancement is demonstrated in the successful use of higher pH amine formulations (for example pH 5.5 formulations) where and APTEOS nitrate salt has been formed. This mechanism can also be found when using other amine salts such as: APTEOS acetate, APTEOS sulfonate, APTEOS methanesulfonate, APTEOS triflate, APTEOS tosylate, APTEOS nonafluorobutane-1-sulfonate (nfbs), tetramethylammonium hydroxide, tetramethylammonium acetate, tetramethylammonium nitrate, tetramethylammonium sulfate, tetramethylammonium methanesulfonate, tetramethylammonium triflate, tetramethylammonium tosylate, tetramethylammonium nfbs, tetramethylammonium triflate, ammonium nitrate, ammonium acetate, ammonium triflate, ammonium tosylate, ammonium sulfonate, ammonium methanesulfonate, or any other amine salt or combination of amine salts. Suitable amine bases comprise ammonium, pyridine, aniline, TMAH, CTAH, TBAH, APTEOS or a combination thereof. The modeled adhesion energies indicates that the higher ionic salts (higher charged centers) increase the adhesion better than those in which the charge may be more distributed, such as in ammonium centers with large R groups. (see Table 1 below) Mechanisms and apparatus used for the modeling experiments are those found in U.S. Pat. No. 6,544,650 issued to Nancy Iwamoto, and U.S. application Ser. Nos. 09/543,628; 10/113,461; 10/326,233 and related PCT Applications, such as PCT/US03/07607, and foreign applications, all of which are commonly owned by Honeywell International Inc. and which are incorporated herein in their entirety.

TABLE 1

|  | Adhesion J/m2 Lo j/m2 |
| --- | --- |
| Adhesion of hi silanol content DUV193 to Norbornene-based Resist | 3.74 |
| Adhesion of lo silanol content DUV193 to Norbornene-based Resist | 5.66 |
| Additives to hi silanol content DUV 193 | Adhesion J/m2 |
| trivinylsilane | 4.05 |
| cetyltrimethylammonium hydroxide | 2.57 |
| tmah added (tmah nitrate) | 5.18 |
| py nitrate | 5.72 |
| trimethylsulfonium methylsulfate | 4.70 |
| tetramethylammonium methanesulfonate | 5.50 |
| tetramethylammonium benzenesulfonate | 5.20 |
| tetramethylammonium toluenesulfonate | 3.9 |
| tetramethylammonium triflate (trifluoromethanesulfonate) | 4.5 |
| apteos triflate (trifluoromethanesulfonate) | 5.2 |
| apteos methanesulfonate | 5.2 |
| NH4 triflate | 6 |
| NH4 nitrate | 6 |
| NH4 toluenesulfonate | 4.8 |
| NH4 methanesulfonate | 5.3 |
| apteos nitrate | 4.9 |
| apteos toluene sulfonate | 2.9 |
| NH4 OH | 3.8 |
| apteos triflate (trifluoromethanesulfonate) 5 molecules water | 3.82 |
| NH4 triflate (5 molecules water) | 3.88 |
| NH4 triflate (2 molecules water) | 5.85 |
| apteos nitrate added but not bonded | 3.85 |
| apteos no salt, bonded (compare to apteos nitrate salt at 4.9) | 3.08 |
| ammonium trflate + ammonium triflate | 8.3 |
| apteos triflate + ammonium triflate | 6.1 |
| apteos triflate + apteos triflate | 5.1 |

The phrase "adhesion promoter" as used herein means any component that when used with a target composition, improves the adhesion of the target composition to substrates and/or surfaces as compared to using the target composition alone. Preferably the at least one adhesion promoter is used with coating material or composition described herein, wherein the at least one adhesion promoter acts as a material modification agent. The target composition may comprise any composition that can be or is applied to a substrate, surface, layered surface, electronic or semiconductor component, including an absorbing composition, a coating material and/or a thermally degradable polymer. The adhesion promoter may be a co-monomer reacted with a thermally degradable polymer precursor or an additive to a thermally degradable polymer precursor. Examples of several useful adhesion promoters are disclosed in commonly assigned pending U.S. application Ser. No. 10/158,513 filed May 30, 2002 incorporated herein in its entirety.

In addition, enhancement of the adhesion is concentation controlled, so that any procedure that helps to concentrate the amine salt at the interface of the silca-resist will help adhesion. A simple solution is increasing the amount of salt species introduced into the formulation. Another solution is a "prewet" of a concentrated salt solution before deposition of the resist. Such other procedures include: solvation control of the salt by control of solvent; evaporation control of the solvent during spin coat or bake; addition of solubility control agents which control solubility of the salt, and addition of ammonium species to the resist.

Modeling indicates that salt mixture can be used with the same effectiveness as a single component. These mixed salt adhesion promotion schemes can be used when an increase in organic amine is required for solvent compatibility. In this case, a larger R group on the substituted ammonium center may be used, but the loss in adhesion can be compensated by addition of a more charged center such as ammonium.

As mentioned, a contemplated adhesion promoter may comprise nitrogen, phosphorus or any other similarly characterized atom. Contemplated adhesion promoters may comprise a neutral or acidic compound or molecule, such as amines salts, methylammonium nitrate, tetramethylammonium acetate (TMAA), tetrabutylammonium acetate (TBAA), cetyltrimethylammonium acetate (CTAA), and tetramethylammonium nitrate (TMAN). TMAN can be obtained by either dissolving TMAN in water or by converting TMAA or TMAH to TMAN by using nitric acid. Contemplated salts comprise those salts from strong acids and primary, secondary, tertiary or tetraamines.

In some embodiments, the ratio of "mole of nitrogen/Si-compound weight (ppm)" in nitrogen containing absorbing compositions and/or coating materials is greater than about 0.01. In other embodiments, the ratio of "mole of nitrogen/Si-compound weight (ppm)" in nitrogen containing absorbing compositions and/or coating materials is greater than about 3. In yet other embodiments, the ratio of "mole of nitrogen/Si-compound weight (ppm)" in nitrogen containing absorbing compositions and/or coating materials is greater than about 4. The optimum ratio depends on an evaluation of several properties by the skilled artisan of the coating material/composition, such as the amount of organic moiety present in the material/composition, the degree of crosslinking present in the material/composition and the pH of the material/composition; however, it should be understood that the ratio influences the lithography properties and via fill properties moreso than any other previously mentioned material/composition property with respect to nitrogen-containing compositions. It should also be understood that depending on the amount of organic moiety present, the degree of crosslinking present and/or the pH of the material/composition, a suitable mole/weight ratio can be recognized and used to produce the absorbing compositions and/or coating materials contemplated herein. These properties are shown in the following Table 2:

TABLE 2

|  | N mole/wt (ppm) | BOE wet strip rate (A/min) | Water contact angle |
|---|---|---|---|
| 193 nm absorbing composition with a pH of about 5.5 (1070 ppm apteos) | 4.834 | ~560 | 67 |
| Modified Silane pH 5.5 (1070 ppm) | 4.834 | <100 | 74 |
| 193 nm absorbing composition with a pH of about 1.5 + 600 ppm AS_TMAA | 4.505 | ~200 | 77.5 |
| Modified Silane pH 3.0 (400 ppm) | 1.807 | ~100 | 72 |
| 193 nm absorbing composition with a pH of about 3 (400 ppm) | 1.807 | >800 (Estimate) | ~71 |
| 193 nm absorbing composition with a pH of about 2 (130 ppm) | 0.587 | >800 (Estimate) | 69.5 |
| 193 nm absorbing composition with a pH of about 1.5 + 30 ppm TMAA | 0.225 | ~500 | 69 |
| 193 nm absorbing composition with a pH of about 1.5 | 0.000 | >1000 | 64 |

The addition of at least one adhesion promoter as a material modification agent can improve lithography, wet etching and via fill, as shown from Table 2. The Examples section that follows shows additional data related to these contemplated embodiments also. As mentioned, it should be understood that the at least one adhesion promoter can also function as a crosslinking agent or a catalyst.

Adhesion promoters contemplated herein may also comprise compounds having at least bifunctionality wherein the bifunctionality may be the same or different and at least one of the first functionality and the second functionality is selected from the group consisting of Si-containing groups; N-containing groups; C bonded to O-containing groups; hydroxyl groups; and C double bonded to C-containing groups. The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds.

In some embodiments of the at least one adhesion promoter, preferably at least one of the first functionality and the second functionality is selected from Si-containing groups; N-containing groups; C bonded to O-containing groups; hydroxyl groups; and C double bonded to C-containing groups. Preferably, the Si-containing groups are selected from Si—H, Si—O, and Si—N; the N-containing groups are selected from such as C—NH₂ or other secondary and tertiary amines, imines, amides, and imides; the C bonded to O-containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C-containing groups are selected from allyl and vinyl groups. For semiconductor applications, the more preferred functional groups include the Si-containing groups; C bonded to O-containing groups; hydroxyl groups; and vinyl groups.

Contemplated adhesion promoters may also comprise an organic resin-based material that further comprises phenolic-containing resins, novolac resins, such as CRJ-406 or HRJ-11040 (both from Schenectady International, Inc.), organic acrylate and/or a styrene resins. Other adhesion promoters may comprise polydimethylsiloxane materials, ethoxy or hydroxy-containing silane monomers, vinyl-containing silane monomers, acrylated silane monomers, or silyl hydrides.

An example of a contemplated adhesion promoter having Si-containing groups is silanes of the Formula I: $(R_{14})_k(R_{15})_l Si(R_{16})_m(R_{17})_n$ wherein $R_{14}$, $R_{15}$, $R_{16}$, and $R_{17}$ each independently represents hydrogen, hydroxyl, unsaturated or saturated alkyl, substituted or unsubstituted alkyl where the substituent is amino or epoxy, saturated or unsaturated alkoxyl, unsaturated or saturated carboxylic acid radical, or aryl; at least two of $R_{14}$, $R_{15}$, $R_{16}$, and $R_{17}$ represent hydrogen, hydroxyl, saturated or unsaturated alkoxyl, unsaturated alkyl, or unsaturated carboxylic acid radical; and $k+l+m+n \leq 4$. Examples include vinylsilanes such as $H_2C=CHSi(CH_3)_2H$ and $H_2C=CHSi(R_{18})_3$ where $R_{18}$ is $CH_3O$, $C_2H_5O$, AcO, $H_2O=CH$, or $H_2C=C(CH_3)O$—, or vinylphenylmethylsilane; allylsilanes of the formula $H_2C=CHCH_2$—Si$(OC_2H_5)_3$ and $H_2C=CHCH_2$—Si(H)(OCH$_3$)$_2$ glycidoxypropylsilanes such as (3-glycidoxypropyl)methyldiethoxysilane and (3-glycidoxypropyl)trimethoxysilane; methacryloxypropylsilanes of the formula $H_2C=(CH_3)COO(CH_2)_3$—Si$(OR_{19})_3$ where $R_{19}$ is an alkyl, preferably methyl or ethyl; aminopropylsilane derivatives including $H_2N(CH_2)_3Si(OCH_2CH_3)_3$, $H_2N(CH_2)_3Si(OH)_3$, or $H_2N(CH_2)_3OC(CH_3)_2CH=CHSi(OCH_3)_3$. The aforementioned silanes are commercially available from Gelest.

An example of a preferred adhesion promoter having C bonded to O-containing groups is glycidyl ethers including but not limited to 1,1,1-tris-(hydroxyphenyl)ethane tri-glycidyl ether which is commercially available from TriQuest. An example of a preferred adhesion promoter having C bonded to O-containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing adhesion promoters are commercially available from Sartomer.

An example of a preferred adhesion promoter having vinyl groups is vinyl cyclic pyridine oligomers or polymers wherein the cyclic group is pyridine, aromatic, or heteroaromatic. Useful examples include but not limited to 2-vinylpyridine and 4-vinylpyridine, commercially available from Reilly; vinyl aromatics; and vinyl heteroaromatics including but not limited to vinyl quinoline, vinyl carbazole, vinyl imidazole, and vinyl oxazole.

An example of a preferred adhesion promoter having Si-containing groups is the polycarbosilane disclosed in commonly assigned copending allowed U.S. patent application Ser. No. 09/471,299 filed Dec. 23, 1999 incorporated herein by reference in its entirety. The polycarbosilane is that shown in Formula II:

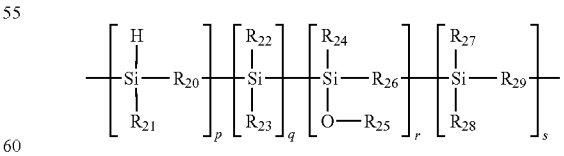

in which $R_{20}$, $R_{26}$, and $R_{29}$ each independently represents substituted or unsubstituted alkylene, cycloalkylene, vinylene, allylene, or arylene; $R_{21}$, $R_{22}$, $R_{23}$, $R_{24}$, $R_{27}$, and $R_{28}$ each independently represents hydrogen atom or organo group comprising alkyl, alkylene, vinyl, cycloalkyl, allyl, or aryl and may be linear or branched; $R_{25}$ represents organosilicon, silanyl, siloxyl, or organo group; and p, q, r, and s satisfy the conditions of [4≦p+q+r+s≦100,000], and q and r and s may collectively or independently be zero. The organo groups may contain up to 18 carbon atoms but generally contain from about 1 to about 10 carbon atoms. Useful alkyl groups include —$CH_2$— and —$(CH_2)_t$— where t>1.

Contemplated polycarbosilanes include dihydridopolycarbosilanes in which $R_{20}$ is a substituted or unsubstituted alkylene or phenyl, $R_{21}$ group is a hydrogen atom and there are no appendent radicals in the polycarbosilane chain; that is, q, r, and s are all zero. Another preferred group of polycarbosilanes are those in which the $R_{21}$, $R_{22}$, $R_{23}$, $R_{24}$, $R_{25}$, and $R_{28}$ groups of Formula II are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

In the more preferred polycarbosilanes, the $R_{21}$ group of Formula II is a hydrogen atom and $R_{21}$ is methylene and the appendent radicals q, r, and s are zero. Other preferred polycarbosilane compounds of the invention are polycarbosilanes of Formula II in which $R_{21}$ and $R_{27}$ are hydrogen, $R_{20}$ and $R_{29}$ are methylene, and $R_{28}$ is an alkenyl, and appendent radicals q and r are zero. The polycarbosilanes may be prepared from well-known prior art processes or provided by manufacturers of polycarbosilane compositions. In the most preferred polycarbosilanes, the $R_{21}$ group of Formula II is a hydrogen atom; $R_{24}$ is —$CH_2$—; q, r, and s are zero and p is from 5 to 25. These most preferred polycarbosilanes may be obtained from Starfire Systems, Inc. Specific examples of these most preferred polycarbosilanes follow:

| Polycarbosilane | Weight Average Molecular Weight (Mw) | Polydispersity | Peak Molecular Weight (Mp) |
| --- | --- | --- | --- |
| 1 | 400-1,400 | 2-2.5 | 330-500 |
| 2 | 330 | 1.14 | 320 |
| 3 (with 10% allyl groups) | 10,000-14,000 | 10.4-16 | 1160 |
| 4 (with 75% allyl groups) | 2,400 | 3.7 | 410 |

As can be observed in Formula II, the polycarbosilanes utilized may contain oxidized radicals in the form of siloxyl groups when r>0. Accordingly, $R_{25}$ represents organosilicon, silanyl, siloxyl, or organo group when r>0. It is to be appreciated that the oxidized versions of the polycarbosilanes (r>0) operate very effectively in, and are well within the purview of the present invention. As is equally apparent, r can be zero independently of p, q, and s the only conditions being that the radicals p, q, r, and s of the Formula II polycarbosilanes must satisfy the conditions of [4<p+q+r+s<100,000], and q and r can collectively or independently be zero.

The polycarbosilane may be produced from starting materials that are presently commercially available from many manufacturers and by using conventional polymerization processes. As an example of synthesis of the polycarbosilanes, the starting materials may be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes may also be synthesized by the Grignard Reaction reported in U.S. Pat. No. 5,153,295 hereby incorporated by reference in its entirety.

An example of a preferred adhesion promoter having hydroxyl groups is phenol-formaldehyde resins or oligomers of the Formula III: —$[R_{30}C_6H_2(OH)(R_{31})]_u$— where $R_{30}$ is substituted or unsubstituted alkylene, cycloalkylene, vinyl, allyl, or aryl; $R_{31}$ is alkyl, alkylene, vinylene, cycloalkylene, allylene, or aryl; and u=3-100. Examples of useful alkyl groups include —$CH_2$— and —$(CH_2)_n$— where v>1. A particularly useful phenol-formaldehyde resin oligomer has a molecular weight of 1500 and is commercially available from Schenectady International Inc.

Another suitable adhesion promoter contemplated herein is to utilize an amine salt, such as those already disclosed herein, synthesized using at least one acid with a long tail or bulky group, such as nonafluorobutane-1-sulfonic acid (nfbs) or dodecylbenzenesulfonic acid (dbs) or to utilize an acid bonded to a silane having a reactive functional group, such as acid-TEOS. These contemplated embodiments prevent acid from diffusing from the absorbing composition in the absorbing composition/photoresist layered composition to the photoresist. By preventing this diffusion of acid, adhesion is greatly improved between the two layers.

The at least one adhesion promoter may also serve a dual purpose or multi-stage purpose. The adhesion promoter may be specifically chosen for a particular absorbing composition based on polarity and/or functional groups other than those characteristics needed by the adhesion promoter in order to promote adhesion in the absorbing composition. Once the adhesion promoter is incorporated into the composition it will act effectively as a "magnet" to attract the stripping and/or etching solution to the adhesion promoter by utilizing a difference in polarity between the adhesion promoters or by utilizing the functional groups on the adhesion promoter. This attraction effect by the adhesion promoter can be activated in several ways. For example, there may be an exothermic reaction that takes place when the adhesion promoter is incorporated into the absorbing composition at room temperature, there may be an external energy and/or heat that needs to be added to "activate" the adhesion promoter, there may not need to be any energy added to the composition depending on the chemical composition of the adhesion promoter, or there may be a pressure differential applied to the absorbing composition that will "activate" the adhesion promoter. However, whether energy is added or not once the adhesion promoter is added, it should be understood that, in this embodiment, the adhesion promoter is not heated or activated to the point where it is chemically modified or broken down until the lithography step is completed. Once the lithography step is completed, the absorbing composition comprising the adhesion promoter may be left unheated or further heated so that the adhesion promoter's chemical composition can change to make it further compatible with the composition. At this point, the coating or film can be further processed, as described in the earlier embodiments.

Catalysts

In other contemplated embodiments, at least one catalyst may be added to the inorganic material in order to improve etch selectivity and/or stripping selectivity through establishing a cross-linked matrix. Catalysts may also be added in conjunction with the porogen to expedite pore formation. As used herein, the term "catalyst" means any substance that affects the rate of the chemical reaction by lowering the activation energy for the chemical reaction. In some cases, the catalyst will lower the activation energy of a chemical reaction without itself being consumed or undergoing a chemical change. Contemplated catalysts to add irrespective of the porogen addition may comprise acids, such as $HNO_3$, HCl, lactic acid, acetic acid, oxalic acid, succinic acid, maleic acid and the like. Contemplated porogen depolymerization catalysts include simple acids as described above, superacid photosensitive molecules such as triarylsulfonium, triaryloxonium, or diaryliodonium salts, free radical generators typically used for vinyl-based, acryl-based (and other multiple-bond monomer-based polymers) polymerization and other free-radical based chemistries (such as benozyl peroxide, azobisisobutyronitrile).

Crosslinking Agent

At least one crosslinking agent may be added to the coating material/composition as a material modification agent. As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

In some embodiments, a heat-activated condensation catalyst may be added to the inorganic material and/or composition as the material modification agent or in addition to the material modification agent in order to improve the planarization ability of the composition. In these embodiments, a condensation catalyst is introduced into the coating material. These condensation catalysts are generally only activated at a particular temperature, such as an elevated temperature. Thus, at one temperature (such as room temperature) the inorganic solution/system maintains a low molecular weight, thus enabling good planarization ability over the wafer and/or substrate topography. When the temperature is elevated (such as to greater than 50° C.), the condensation catalyst catalyzes the Si—OH condensation reaction, which results in a more dense structure and, in some cases, improved photolithographic performance overall. Contemplated condensation catalysts comprise those catalysts that can aid in maintaining a stable silicate solution. The metal-ion-free catalyst is selected from the group consisting of onium compounds and nucleophiles. The catalyst may be, for example an ammonium compound, an amine, a phosphonium compound or a phosphine compound. Non-exclusive examples of such include tetraorganoammonium compounds and tetraorganophosphonium compounds including tetramethylammonium acetate (TMAA), tetramethylammonium hydroxide (TMAH), tetrabutylammonium acetate (TBAA), cetyltrimethylammonium acetate (CTAA), tetramethylammonium nitrate (TMAN), triphenylamine, trioctylamine, tridodecylamine, triethanolamine, tetramethylphosphonium acetate, tetramethylphosphonium hydroxide, triphenylphosphine, trimethylphosphine, trioctylphosphine, and combinations thereof. In preferred embodiments, TMAN is used and can be obtained by either dissolving TMAN in water or by converting TMAA or TMAH to TMAN by using nitric acid. The composition may further comprise a non-metallic, nucleophilic additive which accelerates the crosslinking of the composition. These include dimethyl sulfone, dimethyl formamide, hexamethylphosphorous triamide (HMPT), amines and combinations thereof. Examples of several useful crosslinking agents are disclosed in commonly owned and pending PCT Application Serial No.: PCT/US02/15256 (Publication No. WO 03/088344), which is also herein incorporated herein in its entity.

pH Tuning Agent

The pH tuning agent is a compound, material or solution that is added to the absorbing composition and/or coating material in order to "tune" or adjust the pH of the final material so that it is compatible or more compatible with any chosen resist material, including those with absorption peaks around 365 nm, 248 nm, 193 nm and 157 nm. pH tuning agents contemplated herein are those also found in commonly assigned PCT Application Serial No.: PCT/US01/45306 filed on Nov. 15, 2001, which is incorporated by reference in its entirety.

It should be appreciated, however, that the pH tuning agent not only adjusts the pH of the absorbing material, coating and/or film, but it also influences the chemical performance and characteristics, mechanical performance and structural makeup of the absorbing material, coating and/or film that is part of the layered material, electronic component or semiconductor component, such that the absorbing material, coating and/or film is more compatible with the resist material that is coupled to it. More specifically, the pH tuning agent strongly influences the polymeric characteristics, the structural makeup and the spatial orientation that results in optimized film architecture by increasing the surface properties of the anti-reflective coating for optimal resist performance. In other words, a pH tuning agent that merely adjusts the pH of the spin-on material without influencing the mechanical properties and structural makeup of the absorbing material, coating and/or film or the coupled resist material is not contemplated herein. Also, it should be understood that several pH tuning agents may also be appropriate as densifying agents, catalysts or both. Each of the material modification agents discussed herein may be classified in more than one category.

Contemplated pH tuning agents must perform two separate and sometimes related functions: a) to influence the pH of the composition to which it is being added; and b) to influence the mechanical performance, chemical properties and/or structural makeup of the inorganic material, coating and/or film, which can also been stated as strongly influencing the polymeric characteristics, the structural makeup and the spatial orientation that results in enhancing the surface properties of the inorganic coating for optimal performance.

Contemplated pH tuning agents are partly designed to influence the pH of the composition to which it is added. The class of potential pH tuning agents comprises a) any suitable acidic or basic solution, compound, and/or component and/or b) any suitable strength or concentration of an acidic or basic solution, compound and/or component. This compilation of suitable pH "influencers" is the larger set of compound from which the ultimate pH tuning agent is chosen, because the pH "influencer" must also be able to influence the mechanical performance and/or structural makeup of the inorganic material, coating and/or film while also making the absorbing composition, coating and/or film compatible or more compatible with coupled layers. By this, for example, it is meant that the chosen pH tuning agent is also designed to match the solubility parameter, the molecular weight, the melting point or some other physical characteristic of the material. In other words, the pH tuning agent and the absorbing composition and/or coating material cannot be physically incompatible, depending on the desirable physical characteristic, even if the pH tuning agent performs its first function of influencing the pH of the mixture. In preferred embodiments, the desirable physical characteristic is the solubility parameter or the molecular weight. In more preferred embodiments, the desirable physical characteristic is the solubility parameter.

Examples of some suitable pH tuning agents comprise various molar concentrations of the class of amines, such as γ-aminoalkyltrialkoxysilanes, specifically γ-aminopropyltriethoxysilanes (APTEOS); water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; propylene glycol methyl ether acetate (PGMEA); amine-based oligomers, including those oligomers with inorganic atoms such as silicon, and combinations thereof. Contemplated molar concentrations of the pH tuning agent include pure, 10 Molar, 1.0 Molar, 0.1 Molar and 0.01 Molar concentrations, depending on the pH agent chosen for the resist material.

Additional examples of pH tuning agents include those adhesion promoters discussed above, namely tetramethylammonium acetate (TMAA), tetramethylammonium hydroxide (TMAH), tetrabutylammonium acetate (TBAA), cetyltrimethylammonium acetate (CTAA) and tetramethylammonium nitrate (TMAN).

The pH tuning agent may also serve a dual purpose or multi-stage purpose. The pH tuning agent may be specifically chosen for a particular absorbing composition or coating material based on polarity and/or functional groups other than those characteristics needed by the pH tuning agent in order to "tune" the inorganic composition. Once the pH tuning agent is incorporated into the composition it will act effectively as a "magnet" to attract the stripping and/or etching solution to the pH tuning agent by utilizing a difference in polarity between the pH tuning agent or by utilizing the functional groups on the pH tuning agent. This attraction effect by the pH tuning agent can be activated in several ways. For example, there may be an exothermic reaction that takes place when the pH tuning agent is incorporated into the absorbing composition at room temperature, there may be an external energy and/or heat that needs to be added to "activate" the pH tuning agent, there may not need to be any energy added to the composition depending on the chemical composition of the pH tuning agent, or there may be a pressure differential applied to the inorganic composition that will "activate" the pH tuning agent. However, whether energy is added or not once the pH tuning agent is added, it should be understood that, in this embodiment, the pH tuning agent is not heated or activated to the point where it is chemically modified or broken down until the lithography step is completed. Once the lithography step is completed, the absorbing composition comprising the pH tuning agent may be left unheated or further heated so that the pH tuning agent's chemical composition can change to make it further compatible with the composition. At this point, the coating or film can be further processed, as described in the earlier embodiments.

Densifying Agent

At least one densifying agent may be added to the absorbing compositions disclosed herein. The densifying agent or compound is similar to those previously mentioned in other material modification sections. It should be understood that many of the compounds mentioned in this and other sections overlap in that some of these compounds may be densifying agents and catalysts or densifying agents and pH tuning agents. The densifying agent comprises at least one compound, material or solution that is added to the absorbing compositions described herein in order to "tune" or adjust the density of the final composition so that the density or other related physical characteristics of the final material are increased relative to the reference material. As used herein, the "reference material" is that material that comprises each component of the contemplated composition described herein except the densifying agent. The "reference material" is meant to be a benchmark composition to which contemplated compositions may be compared.

It should be appreciated, however, that the densifying agent not only adjusts the density of the absorbing composition, but it also influences the chemical performance and characteristics, mechanical performance and structural makeup of the final composition that is part of the layered material, electronic component or semiconductor component, such that the final composition is more compatible with the resist material that is coupled to it. More specifically, the densifying agent strongly influences the polymeric characteristics, the structural makeup and the spatial orientation that results in increasing the surface properties of the underlying coating, including not only anti-reflective coatings but other layers and layered materials, for optimal resist performance.

Like other material modification agents disclosed herein, contemplated densifying agents must perform two separate and sometimes related functions: a) to influence the physical properties of the composition to which it is being added; and b) to influence the mechanical performance and/or structural makeup of the composition, which can also been stated as strongly influencing the polymeric characteristics, the structural makeup and the spatial orientation that results in increasing the surface properties of the layer, coating and/or material, such as an anti-reflective coating, for optimal resist and/or component performance.

Contemplated densifying agents are partly designed to influence the density of the composition to which it is added. The class of potential densifying agents comprises a) any suitable acidic or basic solution, compound, and/or component and/or b) any suitable strength or concentration of an acidic or basic solution, compound and/or component. This compilation of suitable density "influencers" is the larger set of compound from which the ultimate densifying agent is chosen, because the density "influencer" must also be able to influence the mechanical performance and/or structural makeup of the final composition while also making the final absorbing composition compatible or more compatible. By this, for example, it is meant that the chosen densifying agent is also designed to match the solubility parameter, the molecular weight, the melting point or some other physical characteristic of the inorganic materials, spin-on inorganic materials and/or spin-on-glass materials. In other words, the densifying agent and the inorganic materials, spin-on inorganic materials and/or spin-on-glass materials cannot be physically incompatible, depending on the desirable physical characteristic. In preferred embodiments, the desirable physical characteristic is the solubility parameter or the molecular weight. In more preferred embodiments, the desirable physical characteristic is the solubility parameter.

Examples of some suitable densifying agents or density-tuning agents comprise various molar concentrations of the class of amines, such as γ-aminoalkyltrialkoxysilanes and nitrogen-based salts of those silane compounds, specifically γ-aminopropyltriethoxysilanes (APTEOS) and APTEOS-N; water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; acetate-based compounds, such as tetra-methyl ammonium acetate (TMAA), APTEOS-acetate and ammonium acetate; nitrate-based compounds, such as tetra-methyl ammonium nitrate (TMAN—a nitric acid stabilized form of TMAA) and ammonium nitrate; amine-based oligomers, including those oligomers with inorganic atoms such as silicon, and combinations thereof. Contemplated molar concentrations of the densifying agent include pure, 10 Molar, 1.0 Molar, 0.1 Molar and 0.01 Molar concentrations, depending on the densifying agent chosen for the resist material.

One contemplated method of making a contemplated composition includes combining at least one absorbing composition, at least one densifying agent (material modification agent), an acid/water mixture, such as a nitric acid/water mixture, and at least one solvent to form a reaction mixture; and refluxing the reaction mixture to form the contemplated composition. The composition formed is then diluted with at least one solvent to provide coating solutions that produce films of various thicknesses. The densifying agent may also and alternatively be added during the refluxing step or after the refluxing step. The densifying agent may also be added during the dilution stage where the thickness of the films is being determined. In other suitable embodiments as mentioned, an incorporatable absorbing compound may be added during the steps used to form the reaction mixture.

In another contemplated method of making a contemplated composition, at least one absorbing composition, at least one densifying agent, and at least one solvent can be combined to form a reaction mixture. The reaction mixture is then refluxed to form the contemplated composition. The composition formed is diluted with at least one solvent to provide coating solutions that produce films of various thicknesses. The densifying agent in this method may either be a variation of the conventional acid/water mixture, in that a different acid may be added, less acid may be added, or more water may be added. The densifying agent may also be added during the dilution step.

More specifically, a reaction mixture including silane reactants, for example HTEOS, or TEOS and MTEOS, or, TMOS and MTMOS; or, alternatively, tetrachlorosilane and methyltrichlorosilane, at least one densifying agent, such as APTEOS-N or APTEOS; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, formic acid, phosphoric acid, hydrochloric acid or acetic anhydride are alternatively used in the acid mixture. The resulting mixture is refluxed for between approximately 1 and 24 hours to produce the absorbing composition. As mentioned earlier, the densifying agent may be added during or after the refluxing step, depending on the resist material chosen. Also, as mentioned earlier, the acid concentration and/or strength and the water concentration in the acid/water mixture may be varied in order to become a densifying agent, depending on the resist material chosen for the specific layered material, electronic component or semiconductor component application.

The density-tuned coating solutions (which may or may not be absorbing coating solutions) are applied to various substrates to form layered materials, layers used in semiconductor processing, or layers used in electronic components, depending on the specific fabrication process, typically by conventional spin-on deposition techniques. These techniques include a dispense spin, a thickness spin, and thermal bake steps, to produce suitable coating. Typical processes include a thickness spin of between 1000 and 4000 rpm for about 20 seconds and two or three bake steps at temperatures between 80° C. and 300° C. for about one minute each. The density-tuned coatings, according to the present invention exhibit refractive indices between about 1.3 and about 2.0 and extinction coefficients greater than approximately 0.07. It should also be noted that the density-tuned coatings contemplated herein have increased refractive index measurements relative to their non-density-tuned counterparts.

Porogens

At least one porogen may be added to the inorganic-based composition or inorganic material in order to increase etch selectivity and/or stripping selectivity of the absorbing composition and/or coating material or composition. Without being bound to any particular theory, it is understood that in one aspect of the subject matter herein the addition of at least one porogen to the absorbing composition and/or coating material may result in pores or voids being formed in the material, coating and/or film. The pores or voids may be formed as a result of structural rearrangement or loss of material such that a pore or void or increase in free volume is left behind. The pores or voids in the material, coating and/or film create additional surface area in the coating or film which ultimately increases the etch selectivity and/or stripping selectivity of the material, coating and/or film. The porosity of the fill material, generally, is about the same as the porosity of the dielectric material, and in both instances, the porosity is greater than the porosity of the photoresist material. These dry etch selectivities are sometimes necessary to maintain proper transfer of the critical dimension from photoresist patterning through etch. The porogen's molecular weight can also be used to determine if the porogen is compatible with the absorbing composition and/or coating compound's matrix in the material. This compatibility quotient is related to the solubility parameters of the absorbing composition and/or coating compound's matrix. In an ideal case the porogen should match the solubility parameter of the matrix coating formulation before bake, so that when formulation molecular weights are known, appropriate molecular weights of the porogen can be determined by matching the solubility parameters with the matrix. Solubility parameters may be determined experimentally by relationships to the film defects, dielectric constant, wet etching tests, defect inspection through microscopes or scanning electron microscopy, or by calculation using group contribution methods or by molecular models of cohesive energy. (review ref Physical Properties of Polymers Handbook, Chapter 16 "Solubility Parmaters" Y. Du, Y. Xue, H. L. Frisch pp 227-239; James E. Mark Ed., 1996, American Institute of Physics, Woodbury, N.Y.).

As used herein, the term "pore" includes voids and cells in a material and any other term meaning space occupied by gas in the material. The term "pore" may also include a differential in material density wherein the free volume has been increased ("porous nature" has been introduced). Appropriate gases include relatively pure gases and mixtures thereof. Air, which is predominantly a mixture of $N_2$ and $O_2$ is commonly distributed in the pores, but pure gases such as nitrogen, helium, argon, $CO_2$ or CO are also contemplated. Pores are typically spherical but may alternatively or additionally include tubular, lamellar, discoidal, voids having other shapes, or a combination of the preceding shapes and may be open or closed. The term "porogen" as used herein may have a variety of mechanisms available to form the pore but in general is a material which upon removal leaves behind either a "pore" or a "void" or a material that can rearrange to create a "pore" or "void". In one embodiment, a porogen is a decomposable material that is radiation, thermally, chemically or moisture decomposable, degradable, depolymerizable or otherwise capable of breaking down and includes solid, liquid or gaseous material.

In another aspect of the subject matter taught herein, the porogen may serve a dual purpose or multi-stage purpose. The porogen may be specifically chosen for a particular coating composition based on polarity and/or functional groups. Once the porogen is incorporated into the composition, either pre-bake (no significant pores/voids) or post-bake (pores/voids present in material), it will act effectively as a "magnet" to attract the stripping and/or etching solution to the porogen by utilizing a difference in polarity between the porogen or by utilizing the functional groups on the porogen. This attraction effect by the porogen can be activated in several ways. For example, there may be an exothermic reaction that takes place when the porogen is incorporated into the absorbing composition and/or coating material at room temperature, there may be an external energy and/or heat that needs to be added to "activate" the porogen or there may be a pressure differential applied to the absorbing composition and/or coating material that will "activate" the porogen. The porogen may be added to the absorbing composition as a material modification agent without ever intending the porogen to create pores and/or voids. However, once the lithography step is completed, the absorbing composition and/or coating material comprising the porogen may be further heated so that the porogen can form a pore or void or the porogen may be left in the absorbing composition without creating a pore or void. At this point, if pores or voids are formed in the material, coating and/or film the pores/voids will create additional surface area in the coating or film which ultimately increases the etch selectivity and/or stripping selectivity of the material, coating and/or film, as described in the earlier embodiments.

In some contemplated embodiments, a decomposed porogen is removable from or can volatilize or diffuse through a partially or fully cross-linked matrix to create pores in a subsequently fully-cured matrix and thus, lower the matrix's dielectric constant and enhance the sacrificial properties. In another embodiment, the porogen might be a material, which does not decompose but can be dissolved out of the matrix leaving behind the "pore". In a third embodiment the porogen might be a material that does not decompose but is volatile enough to dissipate at specific elevated temperatures such as in the 250-350° C. range. Supercritical materials, such as $CO_2$, may be used to remove the porogen and decomposed porogen fragments. Preferably, for a thermally decomposable porogen, the porogen comprises a material having a decomposition temperature greater than the minimum crosslinking temperature of the material. Preferably, the present novel porogens have a degradation or decomposition temperature of up to about 300° C., and in some cases greater than about 300° C. Preferably, the degraded or decomposed porogens volatilize at a temperature greater than the minimum cross-linking temperature of the material with which the porogen is combined. Preferably, the degraded or decomposed porogens volatilize at a temperature between about 50° to about 450° C.

Known porogens, such as linear polymer, star polymers, cross-linked polymeric nanospheres, block copolymers, and hyperbranched polymers may be used in contemplated embodiments with the inorganic-based compounds and materials. Suitable linear polymers are polyethers, such as poly (ethylene oxide) and poly(propylene oxide); polyacrylates such as poly(methylmethacrylate); aliphatic polycarbonates such as poly(propylene carbonate) and poly(ethylene carbonate); polyesters; polysulfones; polystyrene (including monomer units selected from halogenated styrene and hydroxy-substituted styrene); poly(α-methylstyrene); and other vinyl-based polymers. Useful polyester porogens include polycaprolactone; polyethylene terephthalate; poly(oxyadipoyloxy-1,4-phenylene); poly(oxyterephthaloyloxy-1,4-phenylene); poly(oxyadipoyloxy-1,6-hexamethylene); polyglycolide, polylactide (polylactic acid), polylactide-glycolide, polypyruvic acid, polycarbonate such as poly(hexamethylene carbonate) diol having a molecular weight from about 500 to about 2500; and polyether such as poly(bisphenol A-co-epichlorohydrin) having a molecular weight from about 300 to about 6500. Suitable crosslinked, insoluble nanospheres (prepared as nanoemulsions) are suitably comprised of polystyrene or poly(methylmethacrylate). Suitable block copolymers are poly-gylcolids, polylactic acid, poly (styrene-co-α-methylstyrene, poly(styrene-ethylene oxide), poly(etherlactones), poly(estercarbonates) and poly(lactonelactide). Suitable hyperbranched polymers are hyper-branched polyester, e.g. hyperbranched poly(caprolactone), and polyethers such as polyethylene oxide and polypropylene oxide. Another useful porogen is ethylene glycol-poly(caprolactone). Useful polymer blocks include polyvinylpyridines, hydrogenated polyvinyl aromatics, polyacrylonitriles, polysiloxanes, polycaprolactams, polyurethanes, polydienes such as polybutadienes and polyisoprenes, polyvinyl chlorides, polyacetals and amine-capped alkylene oxides. Other useful thermoplastic materials include polyisoprenes, polytetrahydrofurans and polyethyloxazolines.

Other suitable porogens suitable for use in contemplated embodiments include polymers, preferably those which contain one or more reactive groups, such as hydroxyl or amino. Within these general parameters, a suitable polymer porogen for use in the compositions and methods disclosed herein is, e.g. a polyalkylene oxide, a monoether of a polyalkylene oxide, a diether of a polyalkylene oxide, bisether of a polyalkylene oxide, an aliphatic polyester, an acrylic polymer, an acetal polymer, a poly(caprolactone), a poly(valeractone), a poly(methlymethoacrylate), a poly(vinylbutyral) and/or combinations thereof. When the porogen is a polyalkylene oxide monoether, one particular embodiment is a $C_1$ to about $C_6$ alkyl chain between oxygen atoms and a $C_1$ to about $C_6$ alkyl ether moiety, and wherein the alkyl chain is substituted or unsubstituted, e.g., polyethylene glycol monomethyl ether, polyethylene glycol dimethyl ether, or polypropylene glycol monomethyl ether.

Porogens comprising at least two fused aromatic rings wherein each of the fused aromatic rings has at least one alkyl substituent thereon and a bond exists between at least two of the alkyl substituents on adjacent aromatic rings may be used in contemplated embodiments. Preferred porogens include unfunctionalized polyacenaphthylene homopolymer, functionalized polyacenaphthylene homopolymer, the polyacenaphthylene copolymers described below, poly(2-vinyl-naphthalene) and vinyl anthracene, and blends with each other. Other useful porogens include adamantane, diamantane, fullerene and polynorbornene. Each of these porogens, including those listed above, may be blended with one another or other porogen material, such as polycaprolactone, polystyrene and polyester. Useful blends include unfunctionalized polyacenaphthylene homopolymer and polycaprolactone. The more preferred porogens are unfunctionalized polyacenaphthylene homopolymer, functionalized polyacenaphthylene homopolymer, polyacenaphthylene copolymer and polynorbornene.

Useful polyacenaphthylene homopolymers may have weight average molecular weights ranging from preferably about 300 to about 20,000; more preferably about 300 to about 10,000; and most preferably about 1000 to about 7000 and may be polymerized from acenaphthylene using different initiators such as 2,2'-azobisisobutyronitrile (AIBN); di-tert-butyl azodicarboxylate; di-phenylazodicarboxylate; 1,1'-azobis(cyclohezanecarbonitrile); benzoyl peroxide (BPO); t-butyl peroxide; and boron trifluoride diethyl etherate. The polyacenaphthylene homopolymer may have functional end groups such as triple bonds or double bonds to the chain end or cationic polymerization quenched with a double or triple bond alcohol, such as allyl alcohol, propargyl alcohol, butynol, butenol or hydroxyethylmethacrylate.

Useful polyacenaphthylene copolymers may be linear polymers, star polymers or hyperbranched polymers. The comonomer may have a bulky side group that will result in copolymer conformation that is similar to that of polyacenaphthylene homopolymer or a nonbulky side group that will result in copolymer conformation that is dissimilar to that of polyacenaphthylene homopolymer. Comonomers having a bulky side group include vinyl pivalate; tert-butyl acrylate; styrene; α-methylstyrene; tert-butylstyrene; 2-vinylnaphthalene; 5-vinyl-2-norbornene; vinyl cyclohexane; vinyl cyclopentant; 9-vinylanthracene; 4-vinylbiphenyl; tetraphenylbutadiene; stilbene; tert-butylstilbene; and indene; and preferably vinyl pivalate. Hydridopolycarbosilane may be used as an additional co-monomer or copolymer component with acenaphthylene and at least one of the preceding comonomers. An example of a useful hydridopolycarbosilane has 10% or 75% allyl groups. Comonomers having a nonbulky side group include vinyl acetate, methyl acrylate, methyl methacrylate, and vinyl ether and preferably vinyl acetate.

When discussing pore generation, the term "degrade" refers to the breaking of covalent bonds. Such breaking of bonds may occur in numerous ways including heterolytic and homolytic breakage. The breaking of bonds need not be complete, i.e., not all breakable bonds must be cleaved. Furthermore, the breaking of bonds may occur in some bonds faster than in others. Ester bonds, for example, are generally less stable than amide bonds, and therefore, are cleaved at a faster rate. Breakage of bonds may also result in the release of fragments differing from one another, depending on the chemical composition of the degraded portion.

In a preferred embodiment of the pore generation process, for thermally degradable porogens, thermal energy is applied to the porogen containing material to substantially degrade or decompose the porogen into its starting components or monomers. As used herein, "substantially degrade" preferably means at least about 40 weight percent of the porogen degrades or decomposes. In more preferred embodiments, at least about 50 weight percent of the porogen degrades or decomposes, and in most preferred embodiments, at least about 80 weight percent of the porogen degrades or decomposes. In another embodiment, the porogen is dissolved out in either a separate process stage or in combination with other stages of process, such as during the photolithography development or during the actual wet stripping of the porogen containing material.

For a contemplated embodiment, thermal energy is also applied to volatilize the substantially degraded or decomposed porogen out of the inorganic compound matrix. Preferably, the same thermal energy is used for both the degradation and volatilization steps. As the amount of volatilized degraded porogen increases, the resulting porosity of the material, coating and/or film increases.

Any suitable procedure or condition may be used to remove or at least partially remove the at least one porogen, including heat, dissolution in solvents, preferential etching, exposure to radiation, electromagnetic radiation, such as ultraviolet, x-ray, laser or infrared radiation; mechanical energy, such as sonication or physical pressure; or particle radiation, such as gamma ray, alpha particles, neutron beam or electron beam as taught by commonly assigned patent publication PCT/US96/08678 and U.S. Pat. Nos. 6,042,994; 6,080,526; 6,177,143; and 6,235,353, which are incorporated herein by reference in their entireties.

Solvents

At least one high-boiling solvent may be added to the absorbing material, coating and/or film. Without being bound to any particular theory, it is understood that the addition of a high-boiling solvent prevents voiding and improves planarization by making the film a "slow drying" film. As used herein, the phrase "high boiling solvents" means that the solvent volatilizes at a temperature at, near and/or preferably slightly above the drying and/or curing temperature of the material, coating and/or film. Preferred high boiling solvents include glycerol, dibutylether, ethyl lactate dibutylglycerol, dimethyl sulfoxide (DMSO), dimethylformamide (DMF), N-methyl-pyrrolidone (NMP), di-methyl-acetamide (DMAc), high boiling aromatic-based solvents, petroleum ether, the carbitol family, and the glycol ether family. High boiling point solvents can also act as porogens, such as dipropyleneglycol, poly(ethylene) oxide or ethyl lactate.

To further describe the above-contemplated embodiment, the solvent may serve a dual purpose or multi-stage purpose. The solvent may be specifically chosen for a particular coating composition based on polarity and/or functional groups other than those characteristics needed by the solvent to blend with or solvate the components of the coating composition. Once the solvent is incorporated into the composition it can act effectively as a "magnet" to attract the stripping and/or etching solution to the solvent by utilizing a difference in polarity between the solvent or by utilizing the functional groups on the solvent. This attraction effect by the solvent can be activated in several ways. For example, there may be an exothermic reaction that takes place when the solvent is incorporated into the absorbing composition and/or coating material at room temperature, there may be an external energy and/or heat that needs to be added to "activate" the solvent or there may be a pressure differential applied to the absorbing composition and/or coating material that will "activate" the solvent. However, whether energy is added or not once the solvent is added, it should be understood that, in this embodiment, the solvent is not heated or activated to the point where it is no longer present until the lithography step is completed. Once the lithography step is completed, the absorbing composition and/or coating material comprising the solvent may be further heated so that the solvent can evaporate. At this point, the coating or film can be further processed, as described in the earlier embodiments.

Typical solvents are also those solvents that are able to solvate the monomers and polymers contemplated herein to be used as coating compositions and materials. Contemplated solvents include any suitable pure or mixture of organic, organometallic or inorganic molecules that are volatilized at a desired temperature. The solvent may also comprise any suitable pure or mixture of polar and non-polar compounds. In preferred embodiments, the solvent comprises water, ethanol, propanol, acetone, toluene, ethers, cyclohexanone, butyrolactone, methylethylketone, methylisobutylketone, N-methylpyrrolidone, polyethyleneglycolmethylether, mesitylene, ethyl lactate, PGMEA, anisole, and families of poly-ether solvents such as carbitols (which consitute a family of ethyleneglycol ethers capped by hydroxy, alkoxy or carboxy groups) and analogous propyleneglycol ethers.

Capping Agent

At least one capping agent may also be added to the coating composition as a material modification agent. As used herein, the term "capping agent" means a terminating monomer that effectively controls the molecular weight of a particular polymer by "capping" the end of the polymer. In contemplated embodiments, the capping agent comprises a silane monomer with only one reactive group, such as an ethoxy reactive group, with the rest of the monomer being methyl groups. Furthermore, the silane monomer is added late in the parent reaction that forms the inorganic composition. Any suitable terminating monomer may be used in this application, including silane compositions such as TMEOS.

Methods of Production

According to another aspect of the subject matter disclosed herein, methods for synthesizing the absorbing compositions described herein are provided. Absorbing materials are typically synthesized from a variety of silane reactants including, for example, triethoxysilane (HTEOS), tetraethoxysilane (TEOS), methyltriethoxysilane (MTEOS), dimethyldiethoxysilane, tetramethoxysilane (TMOS), dimethyldiethoxysilane, methyltrimethoxysilane (MTMOS), trimethoxysilane, dimethyldimethoxysilane, trimethylethoxysilane (TMEOS), phenyltriethoxysilane (PTEOS), phenyltrimethoxysilane (PTMOS), diphenyldiethoxysilane, diphenyldimethoxysilane, tetracetoxysilane (TAS), methyltriacetoxysilane (MTAS), phenyltriacetoxysilane (PTAS), dimethyldiacetoxysilane, and, diphenyldiacetoxysilane. However, gallium, arsenic, germanium, boron and similar atoms and materials may also be used in conjunction with silicon atoms or as the sole atomic material to produce an absorbing material.

Halosilanes, including chlorosilanes, such as trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants.

In general, to produce the absorbing compositions, the absorbing compounds, such as absorbing compounds 1-41, or combinations thereof, are combined with the silane reactants during the synthesis of the absorbing materials. The material modification agent, such as the at least adhesion promoter, at least one pH tuning agent, at least one porogen, at least one high-boiling solvent, at least one crosslinking agent at least one catalyst and/or at least one capping agent, and/or a combination thereof may also be combined with the silane reactants during the synthesis of the absorbing composition or once the synthesis is complete, as in the case of the at least one capping agent.

One contemplated method of making an absorbing composition includes combining at least one inorganic-based composition, at least one absorbing compound, at least one material modification agent, such as at least one adhesion promoter, at least one pH tuning agent, at least one porogen, at least one high-boiling solvent, at least one crosslinking agent at least one catalyst and/or at least one capping agent, and/or a combination thereof, an acid/water mixture, such as a nitric acid/water mixture, and at least one solvent to form a reaction mixture; and heating to a temperature about or above 40° C. or refluxing the reaction mixture to form the absorbing composition. The absorbing composition formed is then diluted with at least one solvent to provide coating solutions that produce films of various thicknesses. The material modification agent, such as the at least one adhesion promoter, at least one pH tuning agent, at least one porogen, at least one high-boiling solvent, at least one crosslinking agent at least one catalyst and/or at least one capping agent and/or a combination thereof may also and alternatively be added during the refluxing step or after the refluxing/heating step.

In another contemplated method of making an absorbing composition, at least one inorganic-based composition, at least one absorbing compound, at least one material modification agent, such as at least one adhesion promoter, at least one pH tuning agent, at least one porogen, at least one high-boiling solvent, at least one crosslinking agent at least one catalyst and/or at least one capping agent and/or a combination thereof, and at least one additional solvent can be combined to form a reaction mixture. The reaction mixture is then heating to a temperature about or above 40° C. or refluxed to form the absorbing composition. The absorbing composition formed is diluted with at least one solvent to provide coating solutions that produce films of various thicknesses. The pH tuning agent in this method may either be a variation of the conventional acid/water mixture, in that a different acid may be added, less acid may be added, or more water may be added. Regardless of the pH tuning agent chosen, however, the basic principal still remains—which is that not only the pH is influenced by the pH tuning agent, but the chemical, mechanical and physical properties of the ARC are also influenced resulting in a more compatible resist/ARC couple.

More specifically, a reaction mixture including silane reactants, for example HTEOS, or TEOS and MTEOS, TMEOS or TMOS and MTMOS; or, alternatively, tetrachlorosilane and methyltrichlorosilane, at least one absorbing compound, such as absorbing compounds 1-41; at least one pH tuning agent; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, lactic acid, oxalic acid, formic acid, phosphoric acid, hydrochloric acid or acetic anhydride are alternatively used in the acid mixture. The resulting mixture is heated to a temperature about or above 40° C. or refluxed for between approximately 1 and 24 hours to produce the absorbing solution. As mentioned earlier, the material modification agent, such as the at least one adhesion promoter, at least one pH tuning agent, at least one porogen, at least one high-boiling solvent, at least one crosslinking agent at least one catalyst and/or at least one capping agent, and/or a combination thereof may be added during or after the heating/refluxing step, depending on the resist material chosen. Also, as mentioned earlier, the acid concentration and/or strength and the water concentration in the acid/water mixture may be varied in order to become a pH tuning agent, depending on the resist material chosen for the specific layered material, electronic component or semiconductor component application.

The absorbing material can be diluted with appropriate solvents to achieve coating solutions that produce films of various thicknesses. Suitable dilutant solvents include acetone, 2-propanol, ethanol, butanol, methanol, propylacetate, ethyl lactate, propylene glycol methyl ether acetate, and propylene glycol propyl ether, referred to commercially as Propasol-P. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol. Optionally, surfactants, can be utilized and data/observations for these optional surfactants are presented below in the Examples section; however, these data and observations are not exhaustive of the studies conducted and do not represent all of the surfactants tested. For example, the following classes of surfactants were tested: polyacrylates (both ionic and non-ionic) (BYK brand surfactants, specifically BYK 306, 307, 308, 380 and 381), functional polydimethylsiloxanes (Tagopren brand surfactants), silicones, fluorinated alkylesters (FC brand surfactants, specifically FC4430, FC430 or FC4432 provided by 3M (Minneapolis, Minn.)), polyether and aliphatic hydrocarbon chain surfactants (Brij surfactants), the product Megaface R08 (provided by DIC (Japan)), or generally the class of fluorocarbon surfactants, are also added to the coating solution. Furthermore, several viscosity agents may be added to the coating solution to effect the viscosity of the coating solution, such as BYK 410 and BYK 420. The coating solution is typically between about 0.5 and 20% polymer by weight. Prior to use, the coating solution is filtered by standard filtration techniques.

According to a second method of forming absorbing materials, a reaction mixture including at least one silane reactant, at least one absorbing compound, such as absorbing compounds 1-41, at least one material modification agent, including at least one adhesion promoter, at least one pH tuning agent, at least one porogen, at least one high-boiling solvent, at least one crosslinking agent at least one catalyst and/or at least one capping agent, and/or a combination thereof, and an additional solvent or combination of solvents is formed in a reaction vessel. The reaction mixture is heated to about or above a temperature of 40° C. and held at the desired temperature for between approximately 1 and 24 hours. The silane reactants and solvents are as described in the first method above. An acid/water mixture, as described above, is added to the reaction mixture while stirring. The resulting mixture is heated to about of above a temperature of 40° C. and held at the desired temperature for between approximately 1 and 24 hours to produce the absorbing material. The absorbing material is diluted and filtered as described above to form a coating solution. Again, as mentioned earlier, the at least one material modification agent may be added during or after the first heating step.

A method of forming an absorbing organohydridosiloxane material includes forming a mixture of a dual phase solvent which includes both a non-polar solvent and a polar solvent and a phase transfer catalyst; adding at least one organotrihalosilane, hydridotrihalosilane; adding at least one material modification agent and at least one absorbing compound, such as absorbing compounds 1-41, to provide a dual phase reaction mixture; and reacting the dual phase reaction mixture for between 1 and 24 hours to produce the absorbing organohydridosiloxane polymer. The phase transfer catalyst includes but is not limited to tetrabutylammonium chloride and benzyltrimethylammonium chloride. Exemplary non-polar solvents include, but are not limited to, pentane, hexane, heptane, cyclohexane, benzene, toluene, xylene, halogenated solvents such as carbon tetrachloride and mixtures thereof. Useful polar solvents include water, alcohols, and alcohol and water mixtures. The absorbing polymer solution is diluted and filtered as described above to form a coating solution.

In another embodiment, the catalyst may reside on a solid phase, with the polymerization proceeding on the surface. The support materials may include typical silica-based ion-exchange resins that have an attached acid group such as sulfonic acid, or any other acid-containing polymer (such as polylactide, polyacrylic acid, polyvinylsulfonic acid) that is insoluble in the solvent conditions used.

In other embodiments, the water content of the composition during and after the synthesis and/or preparation of the absorbing coating composition can be controlled in order to control the molecular weight growth of the polymer. Controlling the water content has a similar effect as the capping agent to the polymer molecular weight growth.

Alternatively, yet another method of making an absorbing composition requires at least one inorganic-based monomer to be added after the polymerization reaction has started in a "staged silane addition" manner. Any remaining silane monomers, the incorporatable absorbing compound that absorbs light at wavelengths less than about 375 nm, and the at least one material modification agent is then added to the reaction mixture.

Applications

The coating materials and solutions disclosed herein may be applied to various substrates and/or surfaces to form sacrificial via fill layers, layered materials, layers used in semiconductor processing, or layers used in electronic components, depending on the specific fabrication process, typically by conventional spin-on deposition techniques, vapor deposition or chemical vapor deposition. These techniques include a dispense spin, a thickness spin, and thermal bake steps, to produce an inorganic coating. Typical processes include a thickness spin of between 1000 and 4000 rpm for about 20 seconds and one to three bake steps at temperatures between 80° C. and 300° C. for about one minute each. The inorganic coatings, according to the present invention exhibit refractive indices between about 1.3 and about 2.0 and extinction coefficients greater than approximately 0.07.

Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In more preferred embodiments, the substrate comprises a material common in the packaging and circuit board industries such as silicon, copper, glass, and another polymer.

Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These coating materials, coating solutions and films are quite compatible with other materials that might be used for layered materials and devices, such as adamantane-based compounds, diamantane-based compounds, silicon-core compounds, organic dielectrics, and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/50812 filed Dec. 31, 2001; U.S. application Ser. No. 09/538,276; U.S. application Ser. No. 09/544,504; U.S. application Ser. No. 09/587,851; U.S. Pat. No. 6,214,746; U.S. Pat. No. 6,171,687; U.S. Pat. No. 6,172,128; U.S. Pat. No. 6,156,812, U.S. Application Ser. No. 60/350,187 filed Jan. 15, 2002; and U.S. 60/347,195 filed Jan. 8, 2002, which are all incorporated herein by reference in their entirety.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Analytical Test Methods

Refractive Index: The refractive index (n) measurements are performed together with the thickness measurements using a n&k Analyzer spectrophotometer.

Absorption coefficient: The absorption coefficient (k) measurements are performed together with the thickness measurements using a n&k Analyzer spectrophotometer.

Molecular Weight: The molecular weight (Mw) measurements are performed by using Gas Phase Chromatography.

% Via Fill: The % Via Fill measurements are performed using a via-fill wafer along with a Scanning Electron Microscope.

Wet Strip Rate (in BOE, TMAH, NE-89 or other wet chemicals): The wafer is dip-coated with film into the contemplated wet chemicals at various temperature, e.g., room temperature, 50° C., 75° C., etc for various period of time, e.g., 15 sec., 30 sec., 1 min, 2 min, 5 min, or 10 min. Measure the film thickness before dipping and after dipping. Wet strip rate is calculated by the film thickness change per unit time.

Isothermal Gravimetric Analysis (ITGA) Weight Loss: Total weight loss was determined on the TA Instruments 2950 Thermogravimetric Analyzer (TGA) used in conjunction with a TA Instruments thermal analysis controller and associated software. A Platinel II Thermocouple and a Standard Furnace with a temperature range of about 25° C. to about 1000° C. and heating rate of about 0.1° C. to about 100° C./min were used. A small amount of sample (about 7 to about 12 mg) was weighed on the TGA's balance (resolution: about 0.1 g; accuracy: to +about 0.1%) and heated on a platinum pan. Samples were heated under nitrogen with a purge rate of about 100 ml/min (about 60 ml/min going to the furnace and about 40 ml/min to the balance). Sample was equilibrated under nitrogen at about 20° C. for about 20 minutes, then the temperature was raised to about 130° C. at a rate of about 10° C./minute and held at about 130° C. for about 1 minute. Temperature was then ramped to about 250° C. at a rate of about 10° C./minute and held at about 250° C. for about 3 minutes. The weight loss at about 250° C. for the about 90 seconds period was calculated.

FTIR analysis: FTIR spectra were taken using a Nicolet Magna 550 FTIR spectrometer in transmission mode. Substrate background spectra were taken on uncoated substrates. Film spectra were taken using the substrate as background. Film spectra were then analyzed for change in peak location and intensity. Methods for measuring FTIR of any of the contemplated compositions or solutions may be found in commonly-assigned US Patent Application Serial No.: U.S. 20030151031 filed on Aug. 14, 2003, which is incorporated herein in its entirety.

Contact angle: Methods for measuring contact angle of any of the contemplated compositions or solutions may be found in commonly-assigned PCT Application Serial No.: PCT/US02/36327, which is incorporated herein in its entirety.

pH measurement: Methods for measuring pH of any of the contemplated compositions or solutions may be found in commonly-assigned PCT Application Serial No.: PCT/US01/45306, which is incorporated herein in its entirety.

Symbols and Abbreviations:
AC/Absorb. Comp.=Absorbing Composition
POR=porous
ER=Etch Rate
Pre=Pre-immersion SOG Film Average Thickness in Angstroms
WER=Wet Etch Rate
Rev A=an organosiloxane polymer at a pH of 1.5
Rev C=the components of Rev A plus 600 ppm of acidified TMAA at a pH of 1.5
TMAH=tetramethylammonium hydroxide
TMAA=tetramethylammonium acetate
DPG=dipropylene glycol BOE=buffered oxide etchant
193=193 nm
248=248 nm Some of the methods of synthesizing the absorbing compositions and/or coating materials described herein are illustrated in the following examples. The solutions and coatings prepared in the following examples are tuned and/or prepared in order to be compatible with several photoresist materials, including those that absorb around 157 nm, 193 nm, 248 nm, and 375 nm. An example of the 193 nm resist material is an acrylate resist material.

Example 1

Tables 3-9 show temperature matrices developed using several contemplated absorbing compositions and different concentrations of TMAH aqueous solutions used as wet stripping agent. The tables show the bake sequences, % aqueous TMAH, Etch Rate (ER) and pH. As shown, "Rev A" indicates an organosiloxane polymer at a pH of 1.5. As shown, "Rev C" comprises "Rev A" and 600 ppm of acidified TMAA at a pH of 1.5.

Example 2

FIGS. 2-5 show the TGA data for TMAA (FIG. 2), TMAN (FIG. 3), APTEOS triflate (FIG. 4), and ammonium triflate (FIG. 5) after 90 seconds on a 250° C. baking plate.

Example 3

Figure 6:
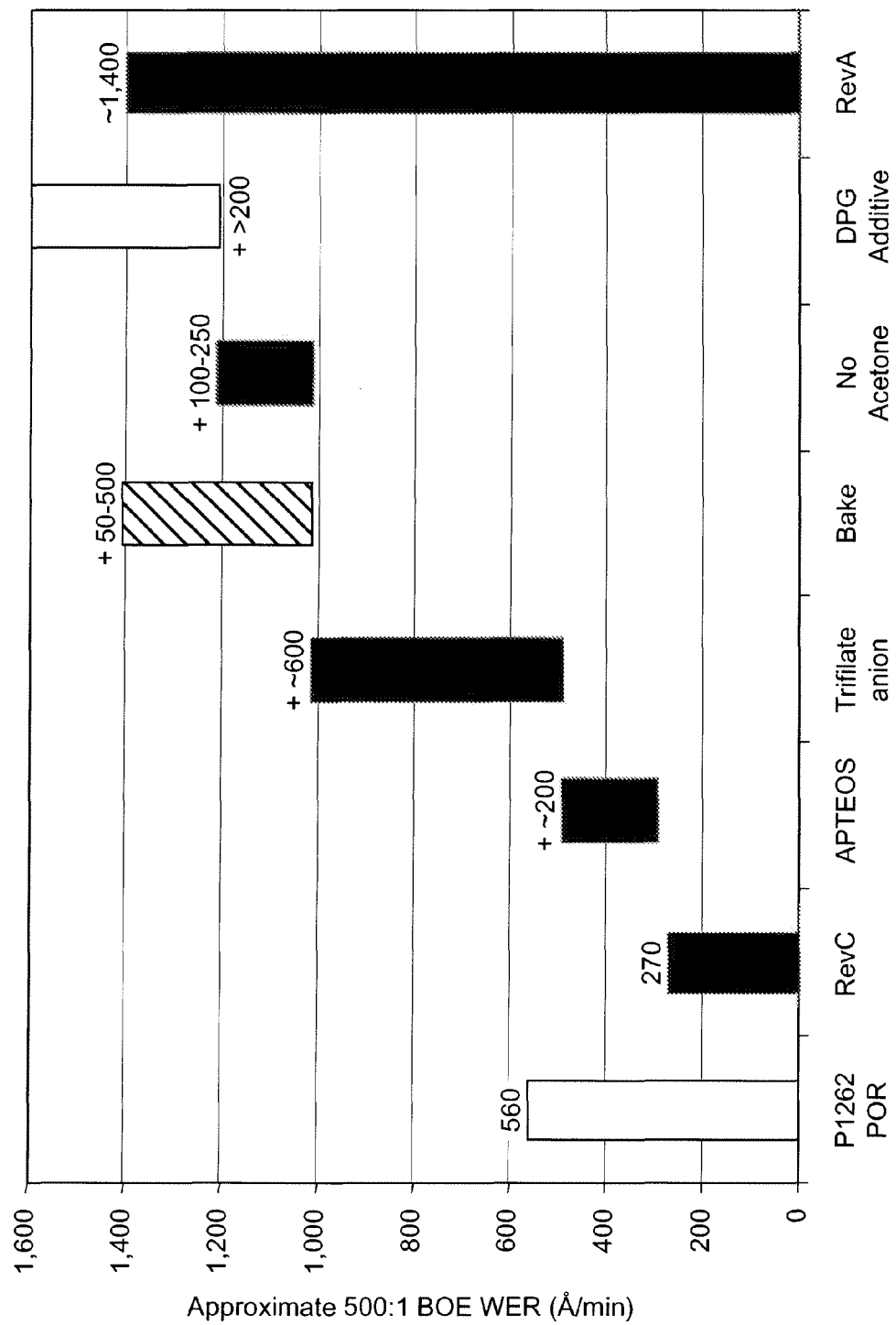
FIG. 6 shows the effect on wet etch rate for a contemplated absorbing composition.
Figure 7:
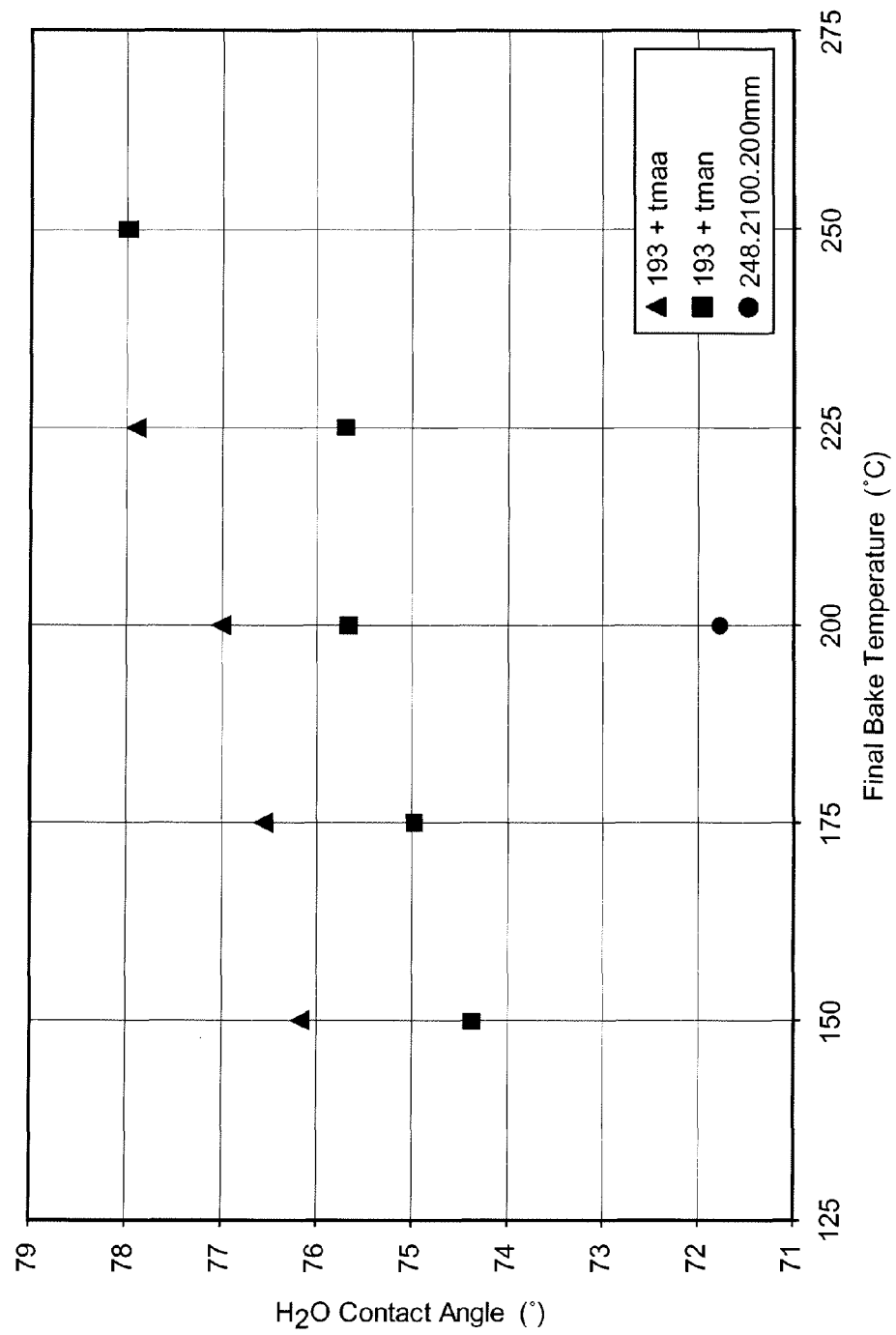
FIG. 7 shows wet etch rate data and film property data for contemplated absorbing compositions.
Figure 8:
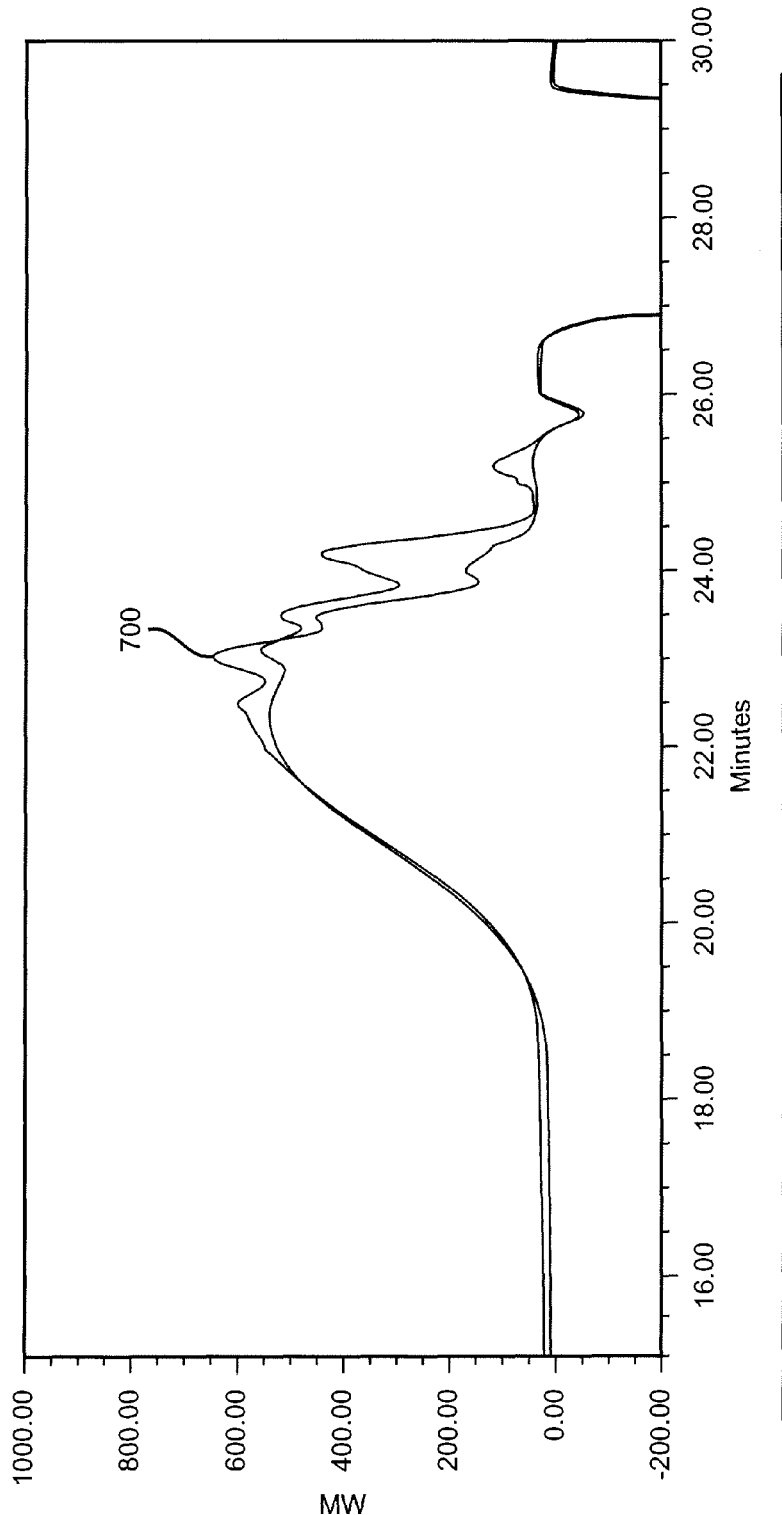
FIG. 8 shows wet etch rate data and film property data for contemplated absorbing compositions.
Figure 9:
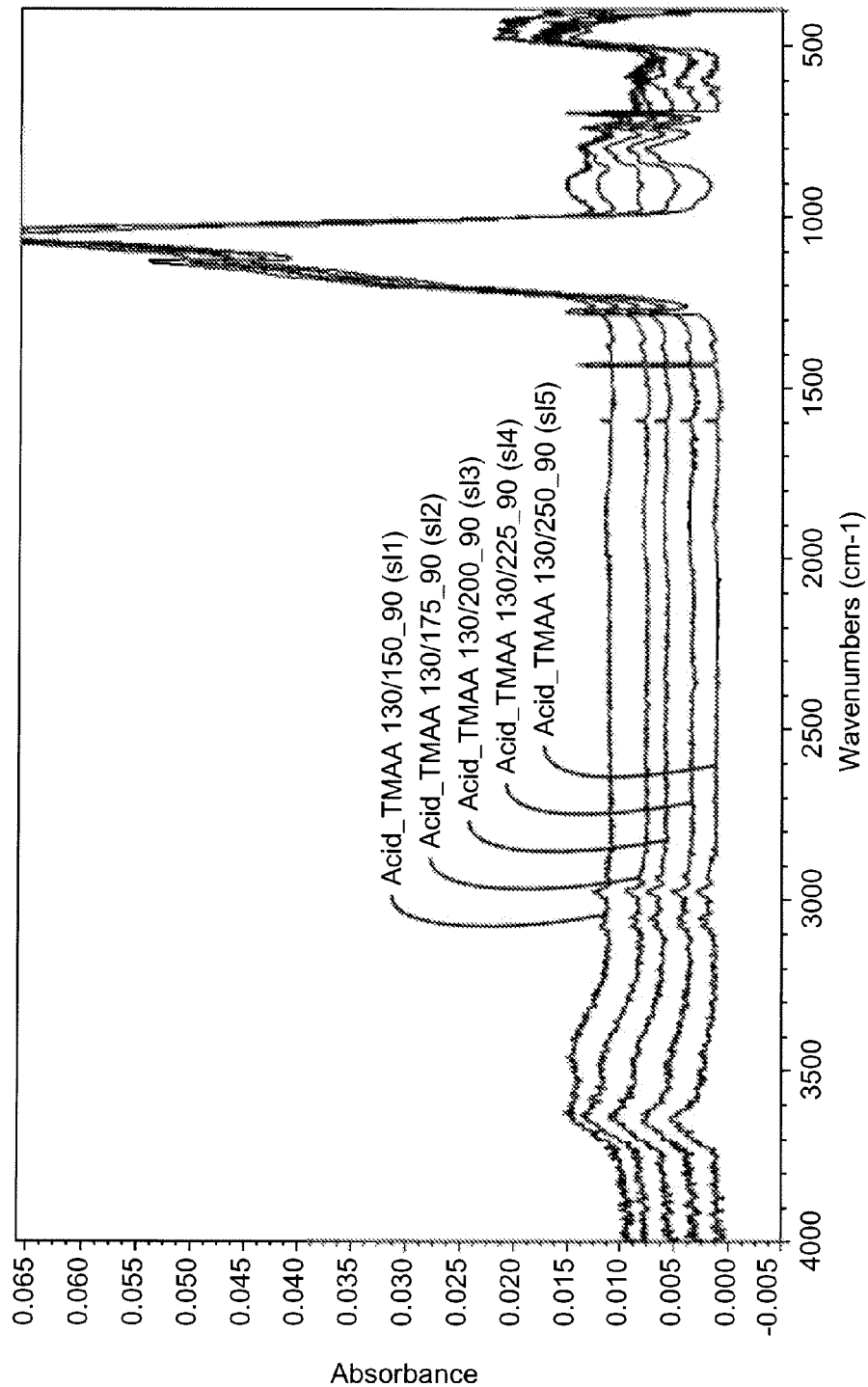
FIG. 9 shows wet etch rate data and film property data for contemplated absorbing compositions.
Figure 10:
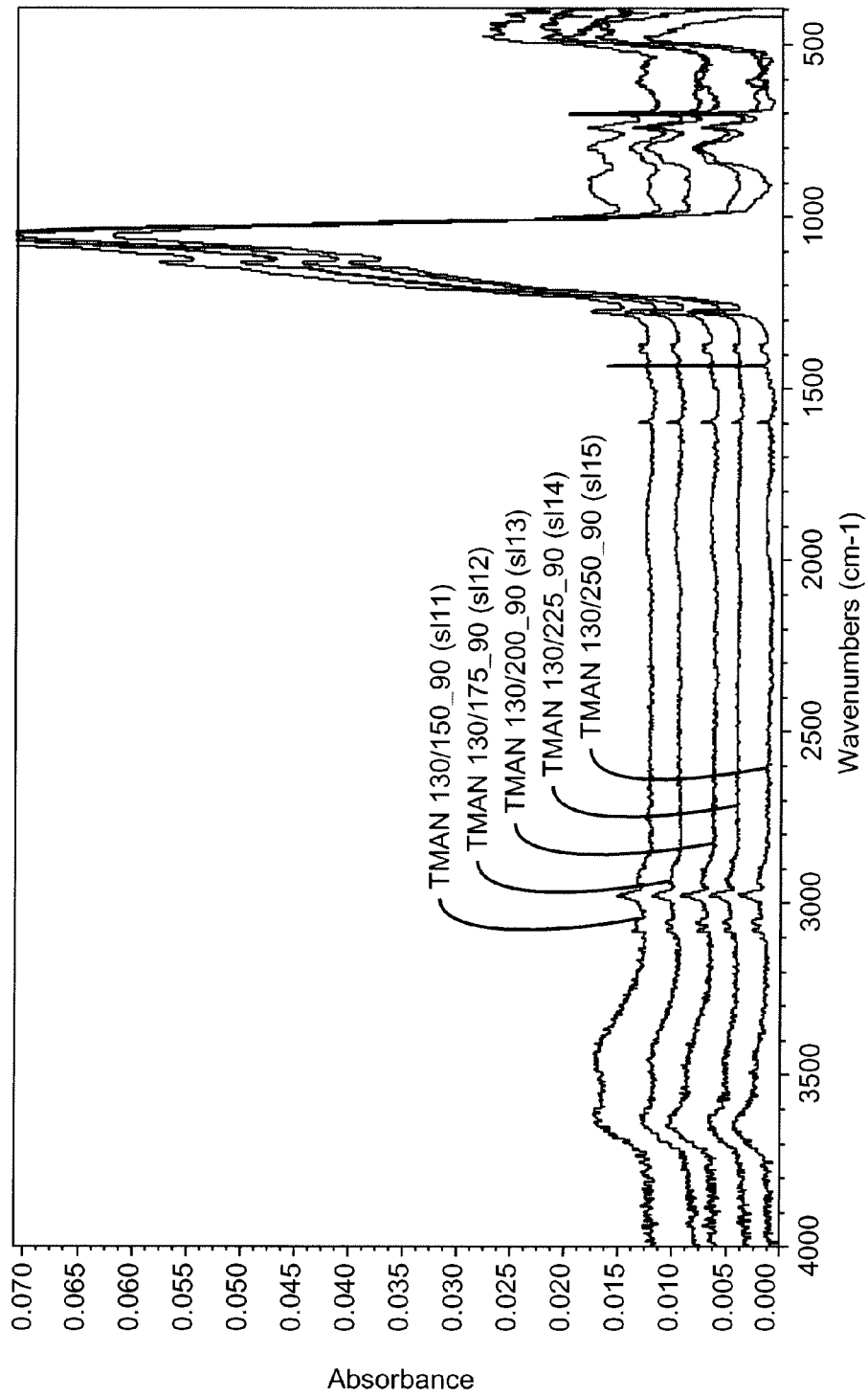
FIG. 10 shows wet etch rate data and film property data for contemplated absorbing compositions.
Figure 11:
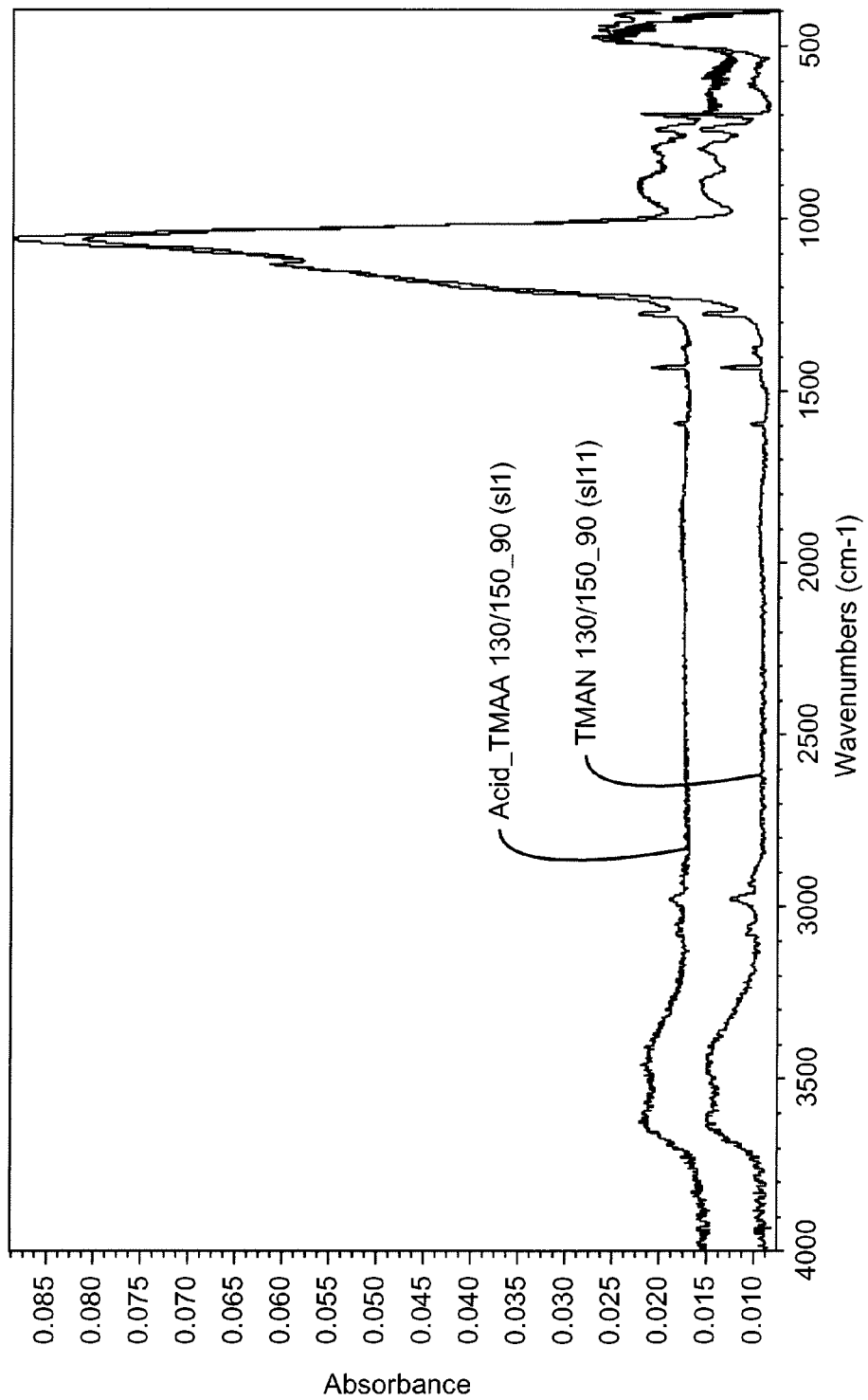
FIG. 11 shows wet etch rate data and film property data for contemplated absorbing compositions.
Figure 12:
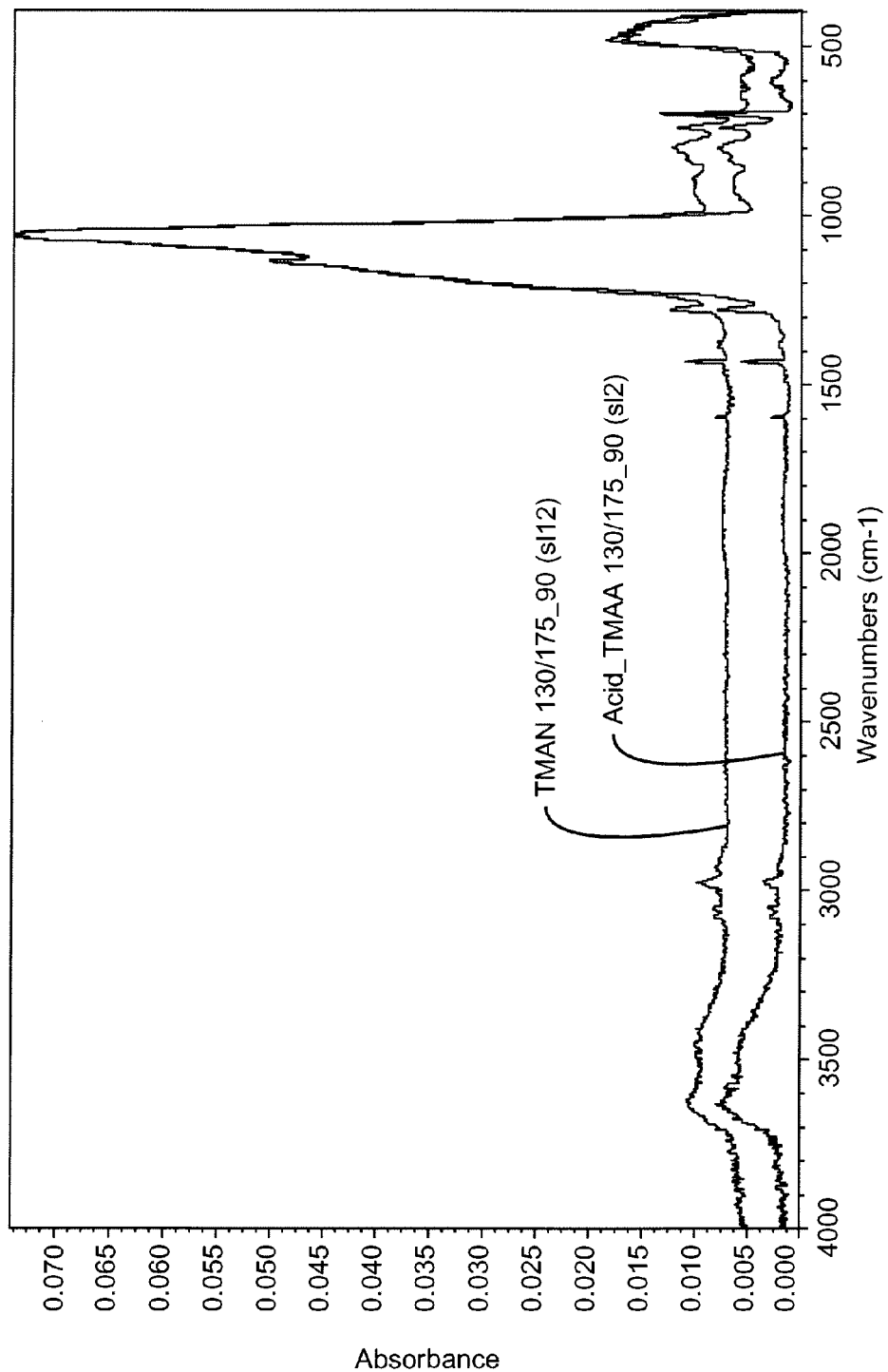
FIG. 12 shows wet etch rate data and film property data for contemplated absorbing compositions.
Figure 13:
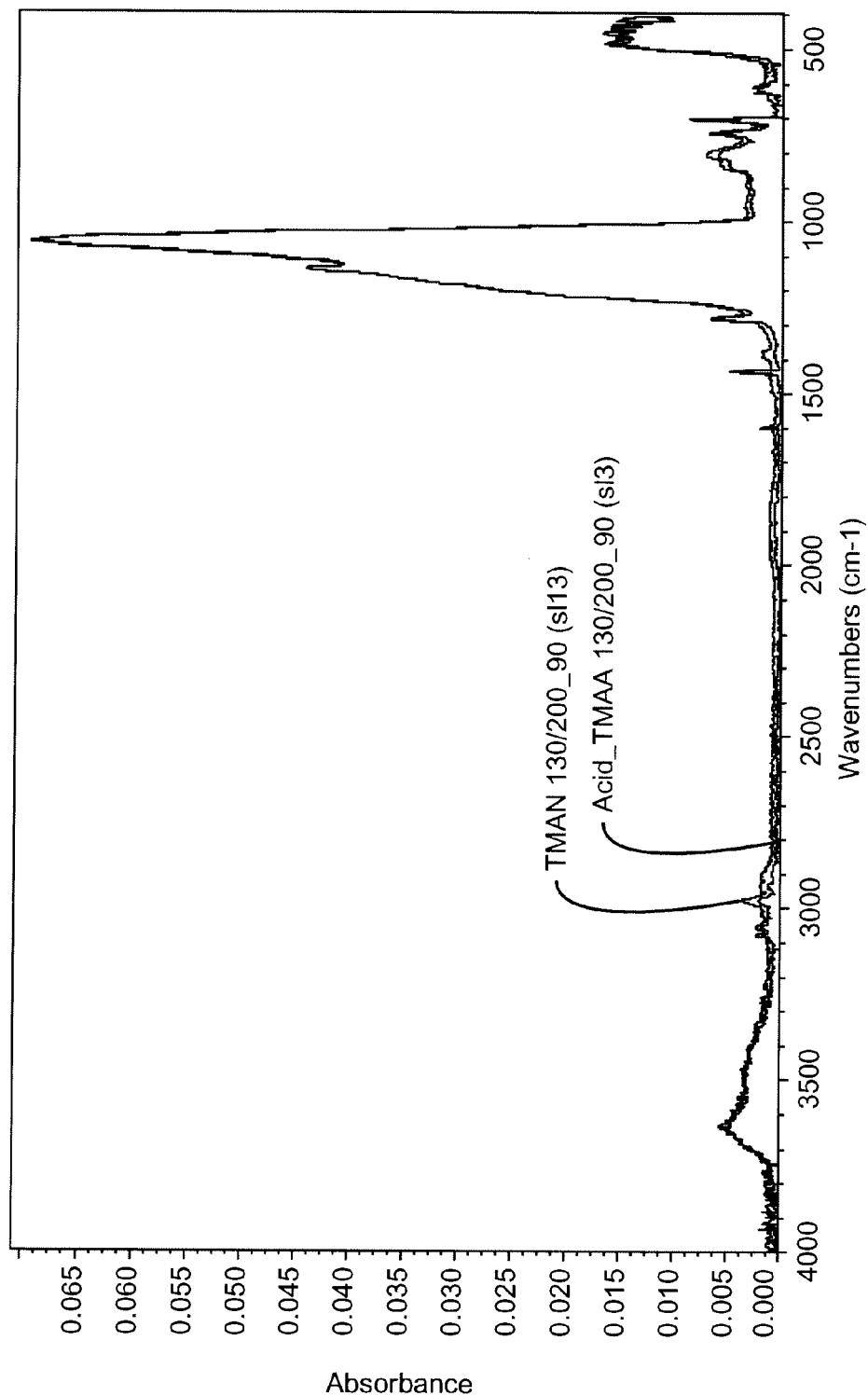
FIG. 13 shows wet etch rate data and film property data for contemplated absorbing compositions.
Figure 14:
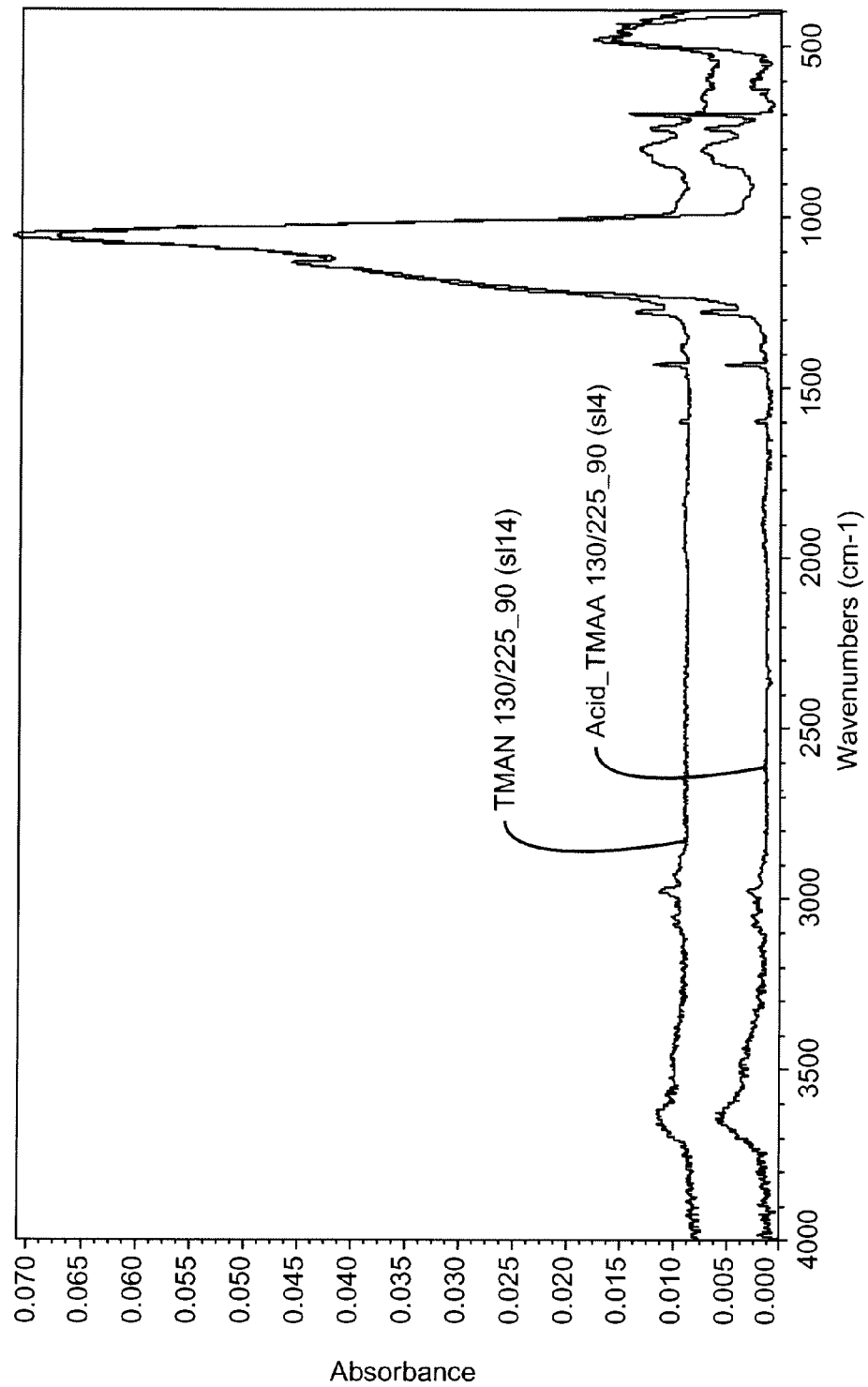
FIG. 14 shows wet etch rate data and film property data for contemplated absorbing compositions.
Figure 15:
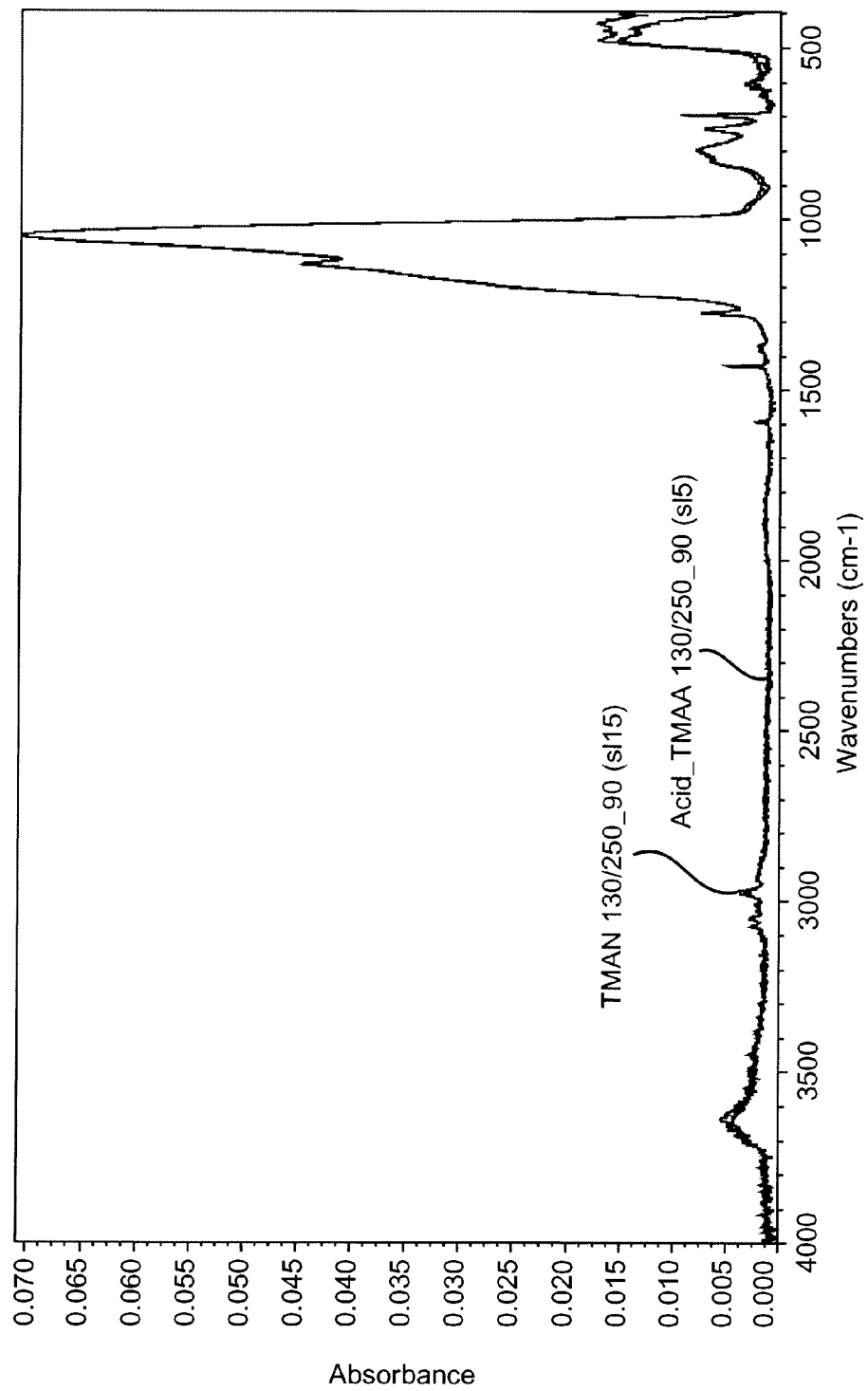
FIG. 15 shows wet etch rate data and film property data for contemplated absorbing compositions.
Figure 16:
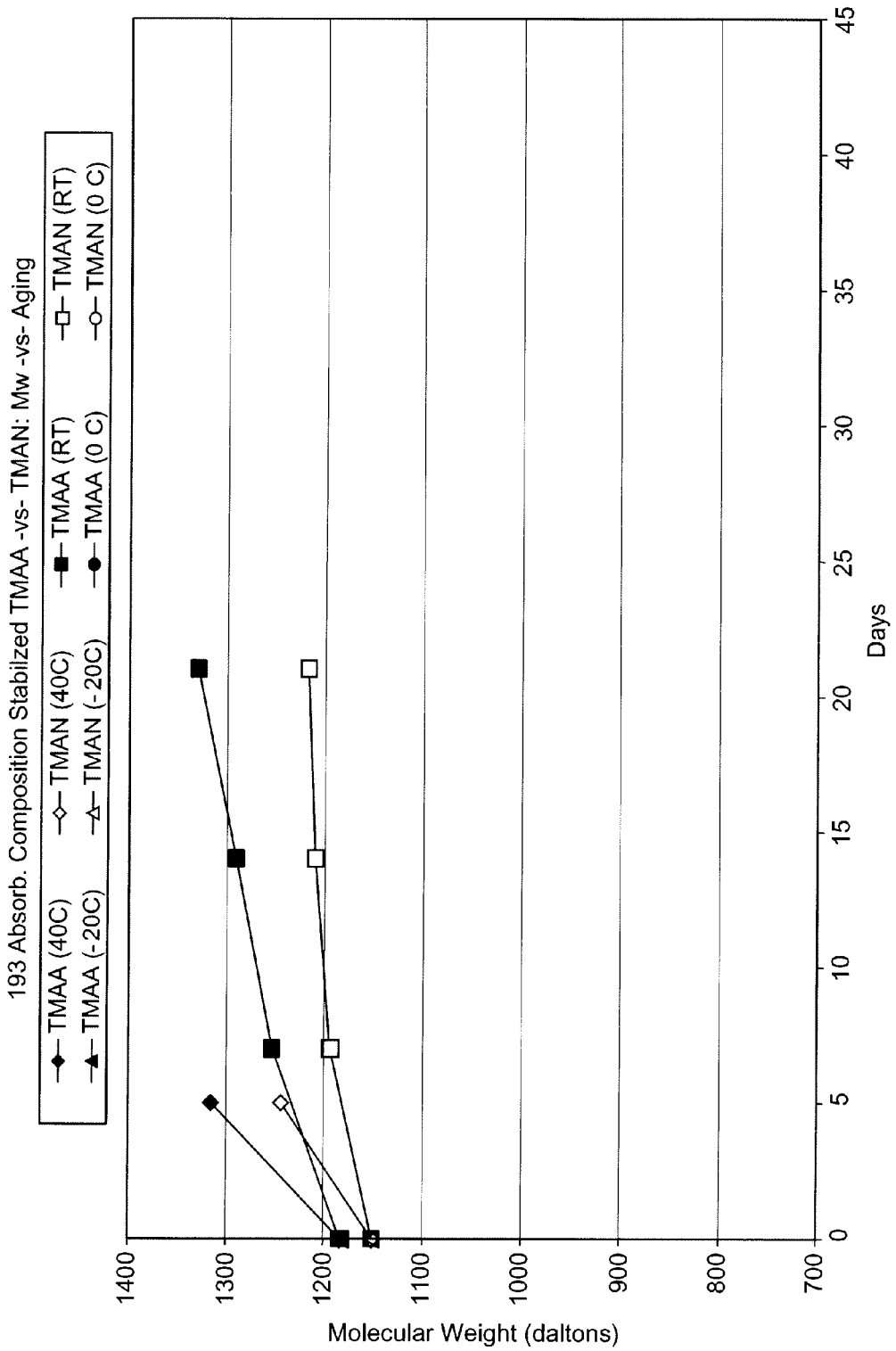
FIG. 16 shows solution aging studies for contemplated absorbing compositions.
Figure 17:
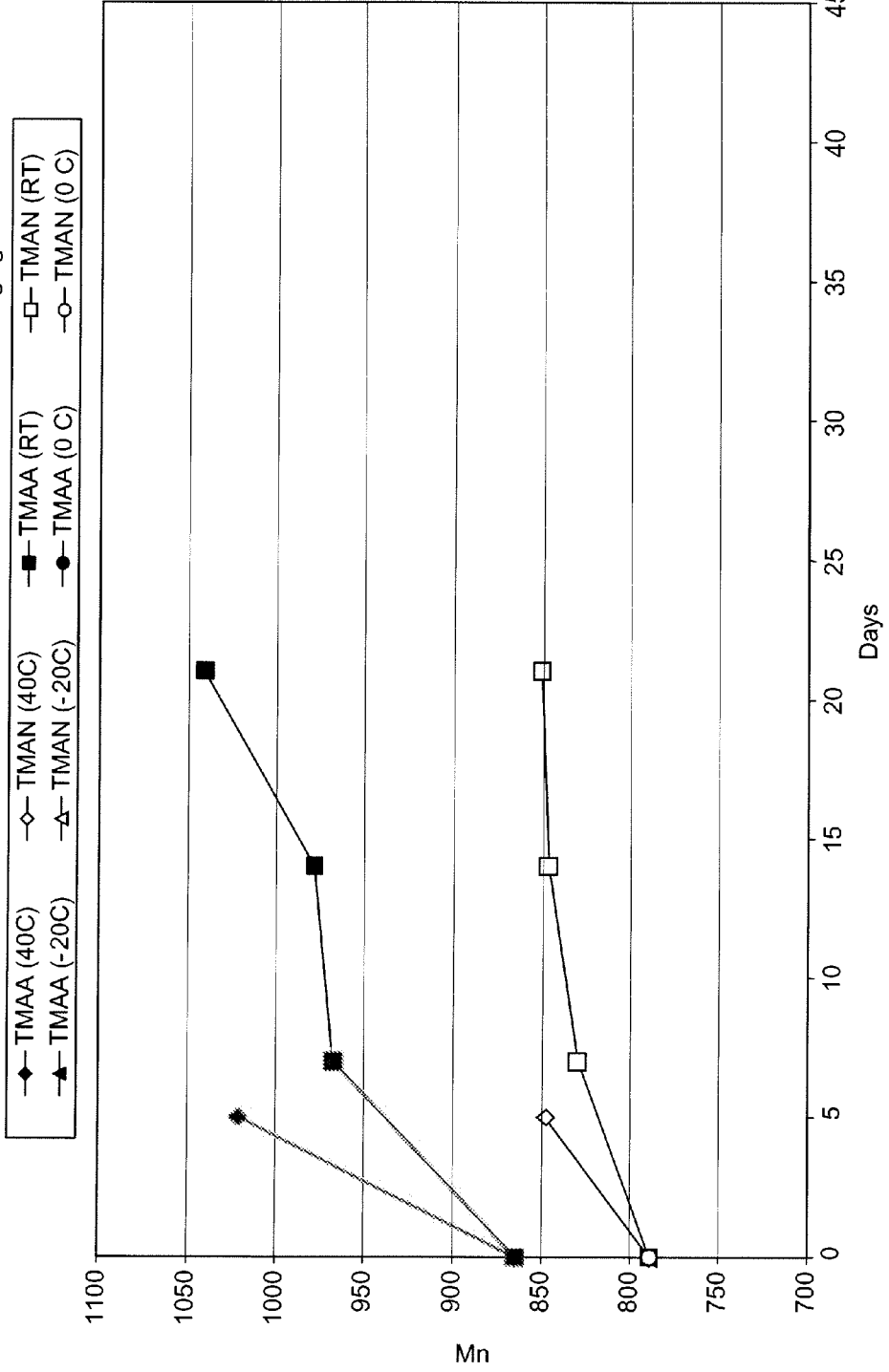
FIG. 17 shows solution aging studies for contemplated absorbing compositions.
Figure 18:
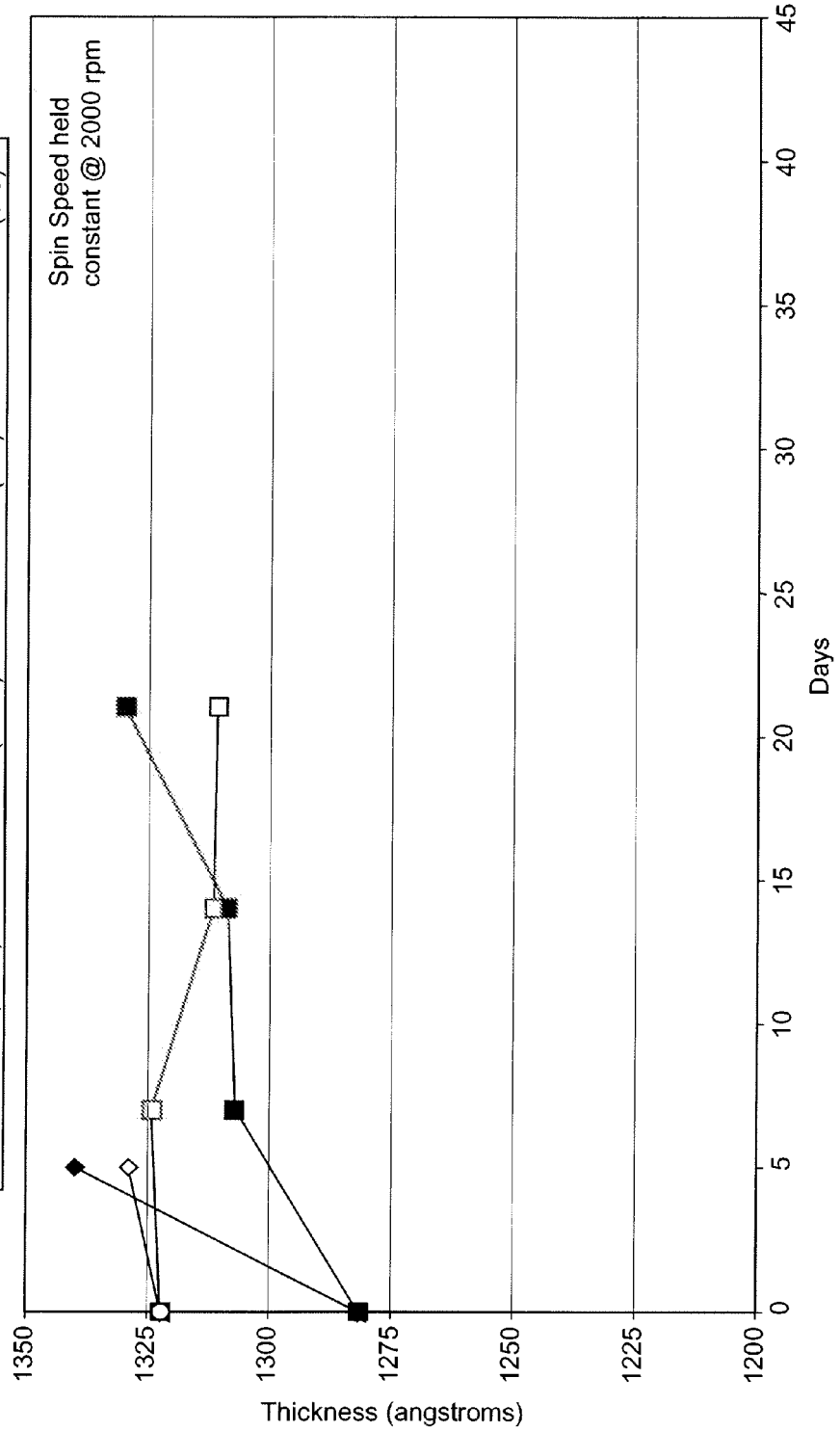
FIG. 18 shows solution aging studies for contemplated absorbing compositions.
Figure 19:
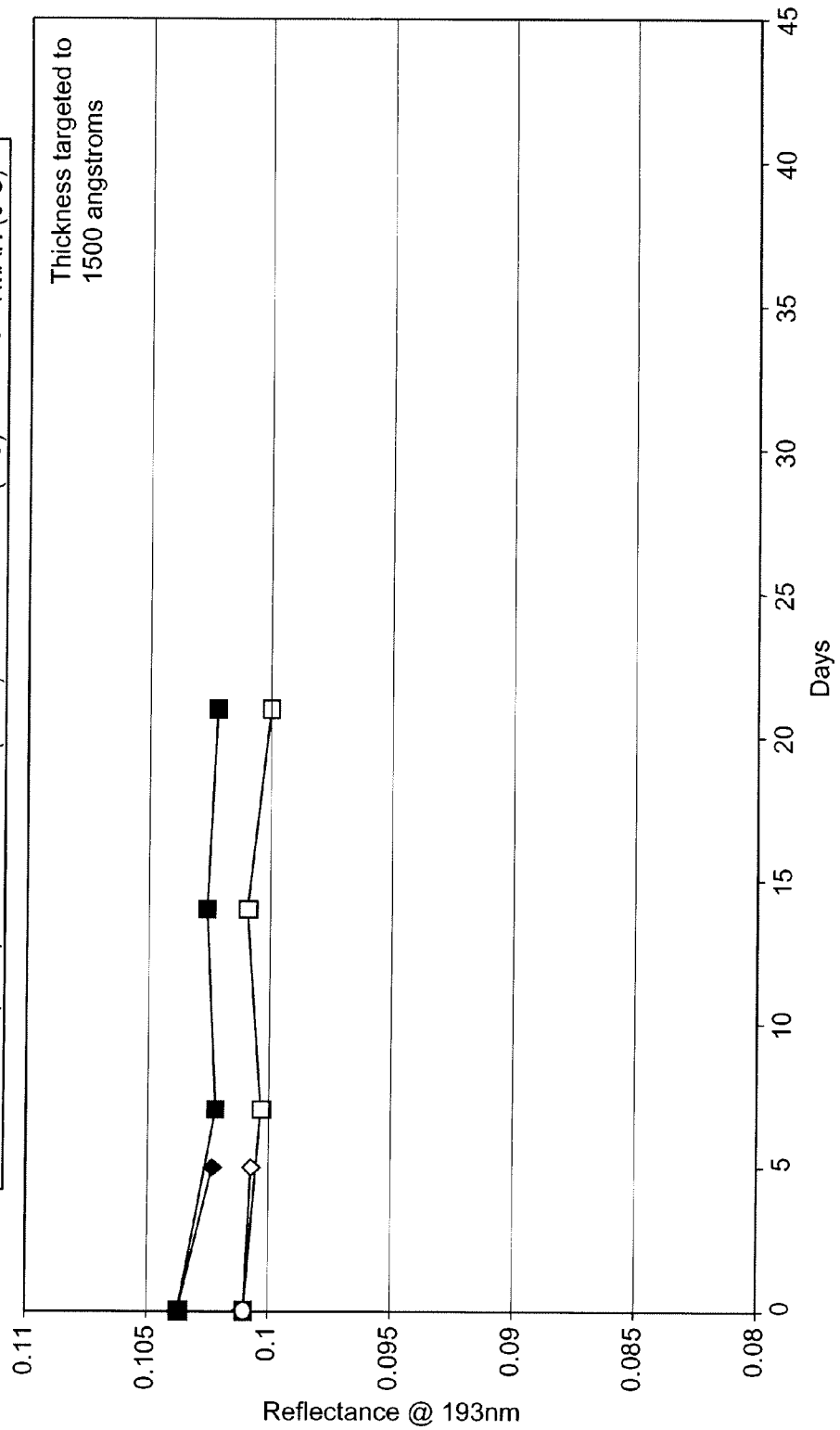
FIG. 19 shows solution aging studies for contemplated absorbing compositions.
Figure 20:
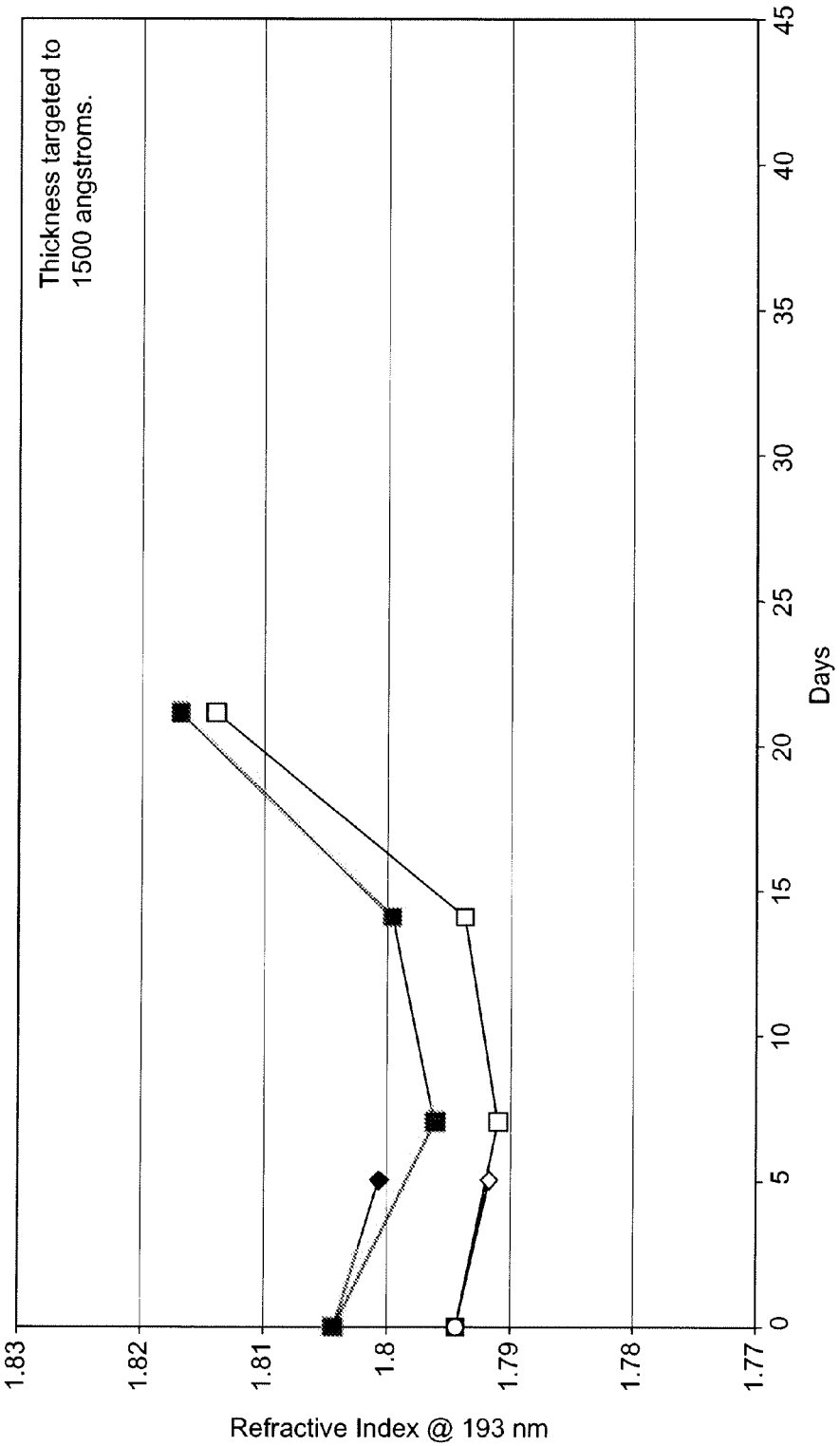
FIG. 20 shows solution aging studies for contemplated absorbing compositions.
Figure 21:
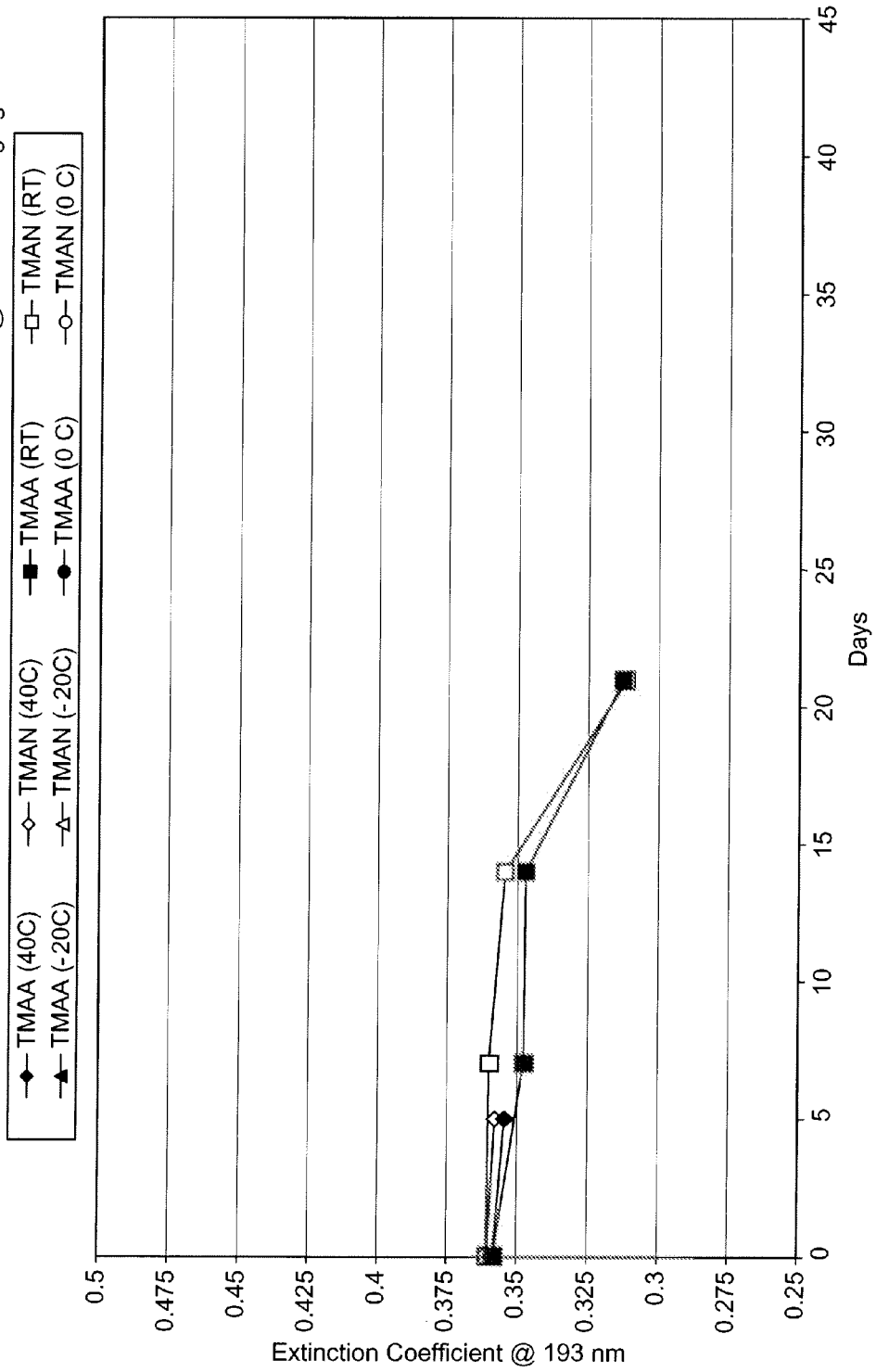
FIG. 21 shows solution aging studies for contemplated absorbing compositions.
Figure 22:
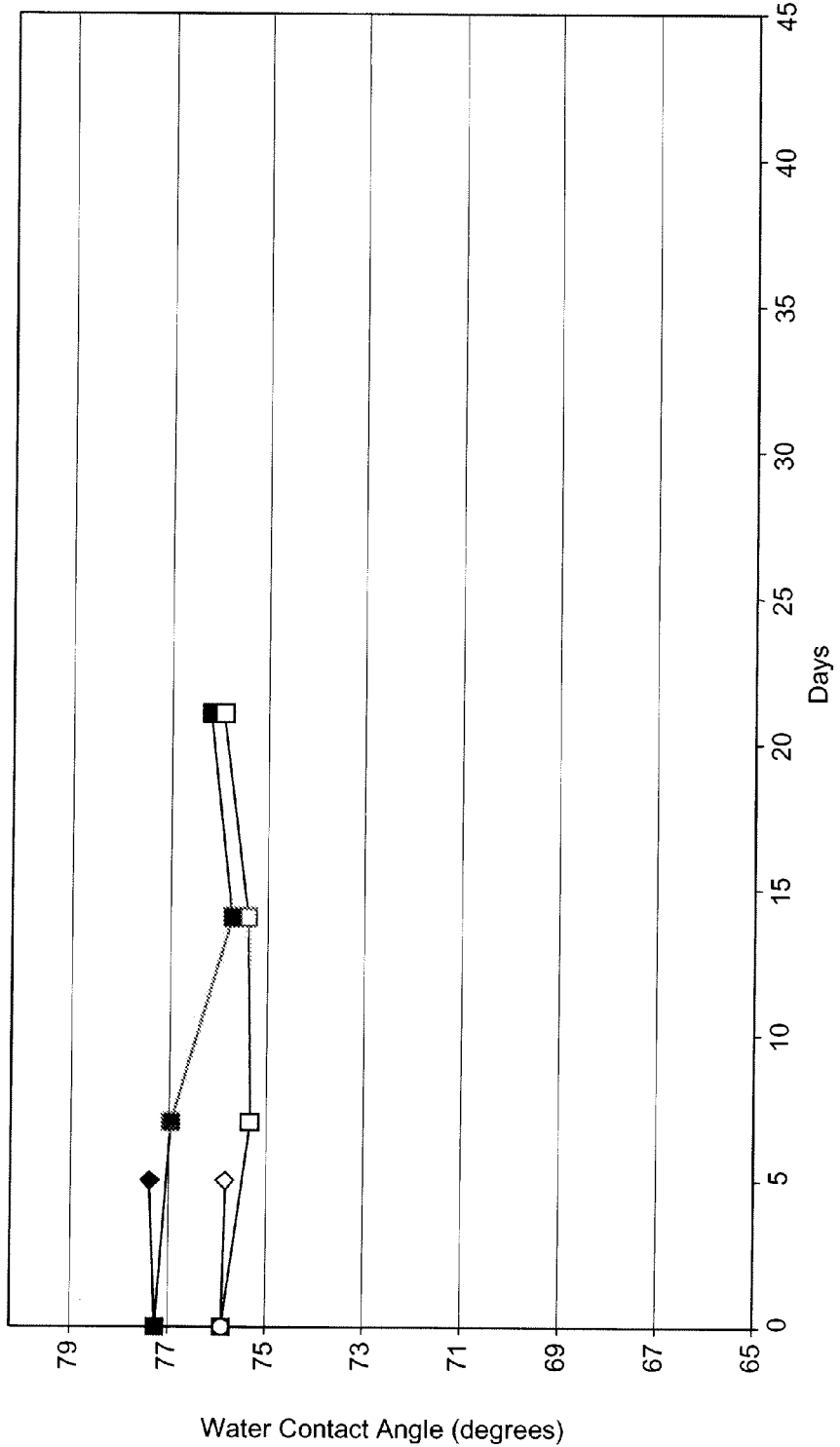
FIG. 22 shows solution aging studies for contemplated absorbing compositions.
Figure 23:
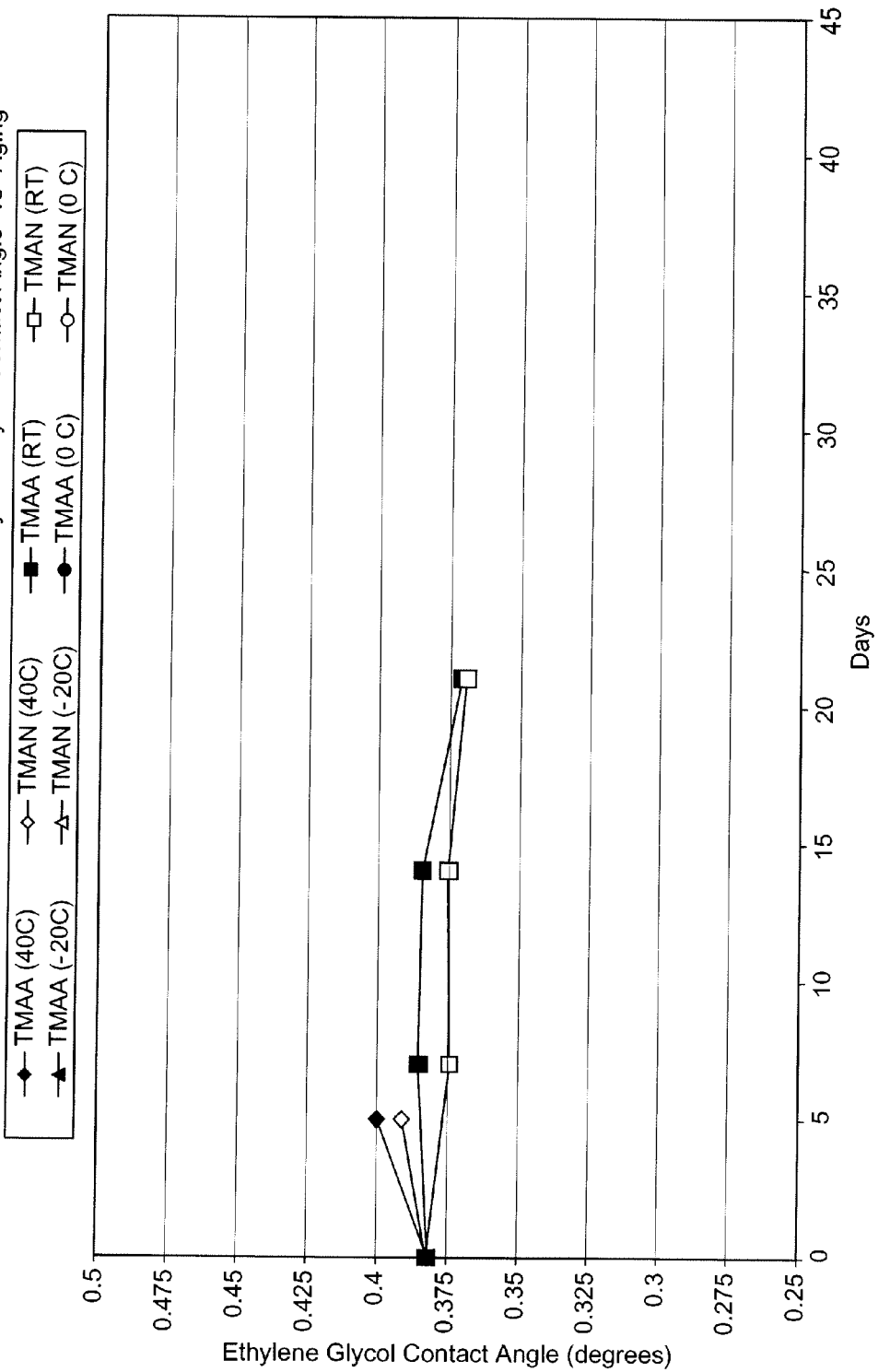
FIG. 23 shows solution aging studies for contemplated absorbing compositions.
Figure 24:
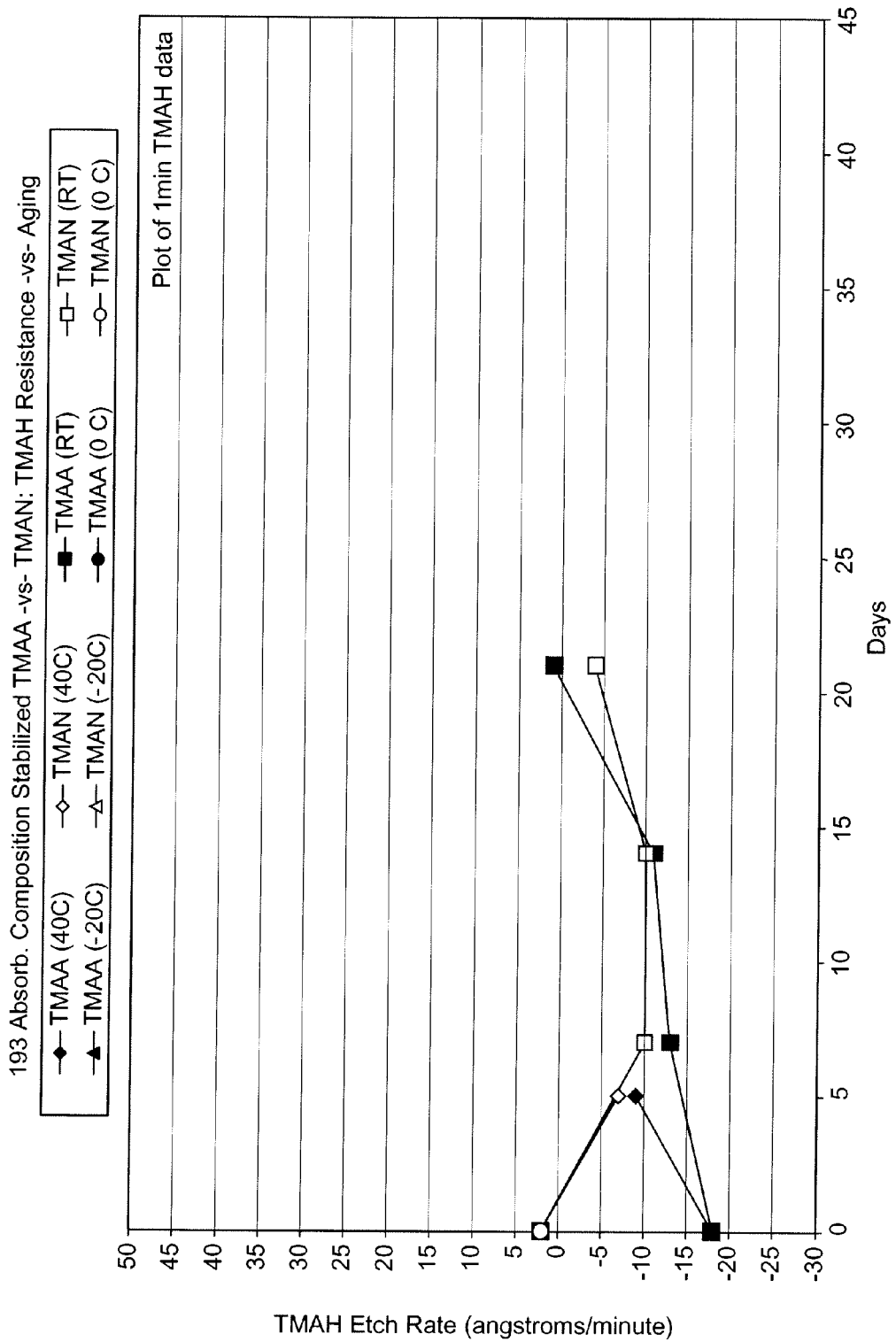
FIG. 24 shows solution aging studies for contemplated absorbing compositions.
Figure 25:
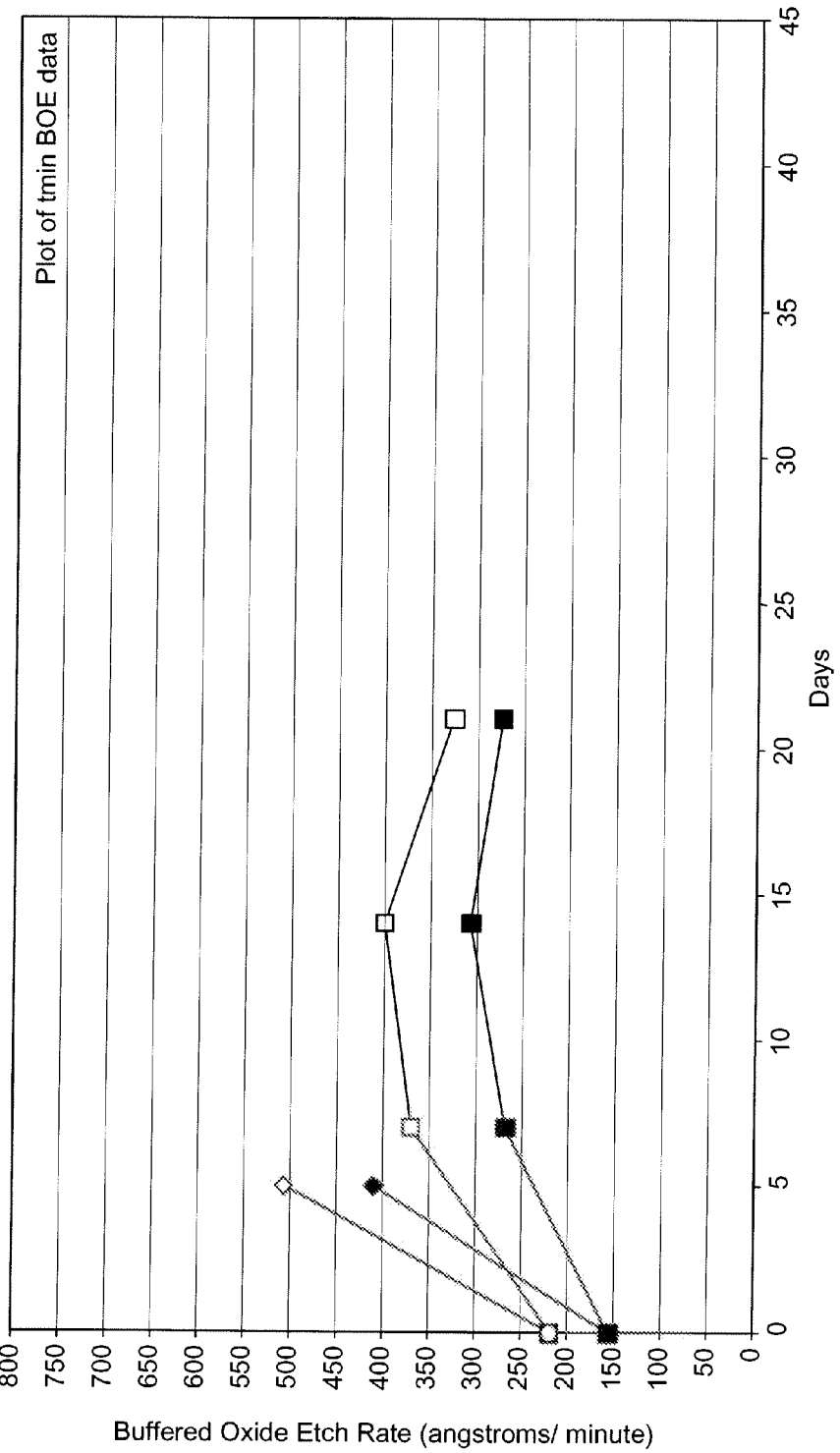
FIG. 25 shows solution aging studies for contemplated absorbing compositions.

FIG. 6 shows the effect of each route on the wet etch rate of a contemplated absorbing composition and/or coating material. The Raw Data developed through the determination of the wet etch rate (WER) of a contemplated absorbing composition and/or coating material using APTEOS-tosylate and TMAH-tosylate/TMAH-triflate are shown in Tables 10 and 11.

Example 4

Table 12 shows the nitrogen content of a contemplated absorbing composition that comprises a material modification agent, specifically, "N" containing adhesion promoter. Table 13 and FIGS. 7-15 show wet etch rate data and film property data for the compositions in Table 11.

Example 5

A solution aging study is presented in this Example and results shown in Table 14 and FIGS. 16-25 for two contemplated absorbing compositions. The solution aging conditions are as follows:
40° C. storage for 5 days
Room temperature storage for 1 month
0° C. storage for 6 months
−20° C. storage for 6 months
The response testing was as follows:
GPC (Mn, Mw, MP, Mz, Mz+1, polydispersity)
Film thickness at 130/240 C Bake for 90 seconds
Reflectance, Refractive Index and Extinction Coefficient @193 nm
TMAH resistance
500:1 BOE Strip Rate
Contact Angle (Water & Ethylene Glycol)

Example 6

A film aging study is presented in this Example and results shown in Tables 15-16 for two contemplated absorbing compositions. The film aging conditions for room temperature storage are as follows:
1 hour
3 hours
8 hours
24 hours
48 hours
The response testing was as follows:
TMAH resistance
500:1 BOE Strip Rate

Example 7

Tables 17-19 show wet etch rate studies on three different absorbing compositions as compared to the "Rev A" composition that comprises organosiloxane polymer at a pH of 1.5. Table 17 shows an absorbing composition that comprises the components of "Rev A", along with 1070 ppm of APTEOS triflate at a pH of 1.5. Table 18 shows an absorbing composition that comprises the components of "Rev A", along with 1070 ppm of APTEOS triflate and 1.5% DPG at a pH of 1.5. Table 19 shows an absorbing composition that comprises the components of "Rev A", along with 1070 ppm of APTEOS MSA and 1.5% DPG at a pH of 1.5. Table 20 shows the same compositions mentioned above with respect to molecular weight growth and aging.

Example 8

Table 21 shows wet etch rate studies on different absorbing compositions as compared to the "Rev A" composition that comprises organosiloxane polymer at a pH of 1.5 and 5.5. The experimental compositions comprise the "Rev A" composition along with 1070 ppm APTEOS nitrate and four different concentrations of DPG.

Example 9

Figure 26:
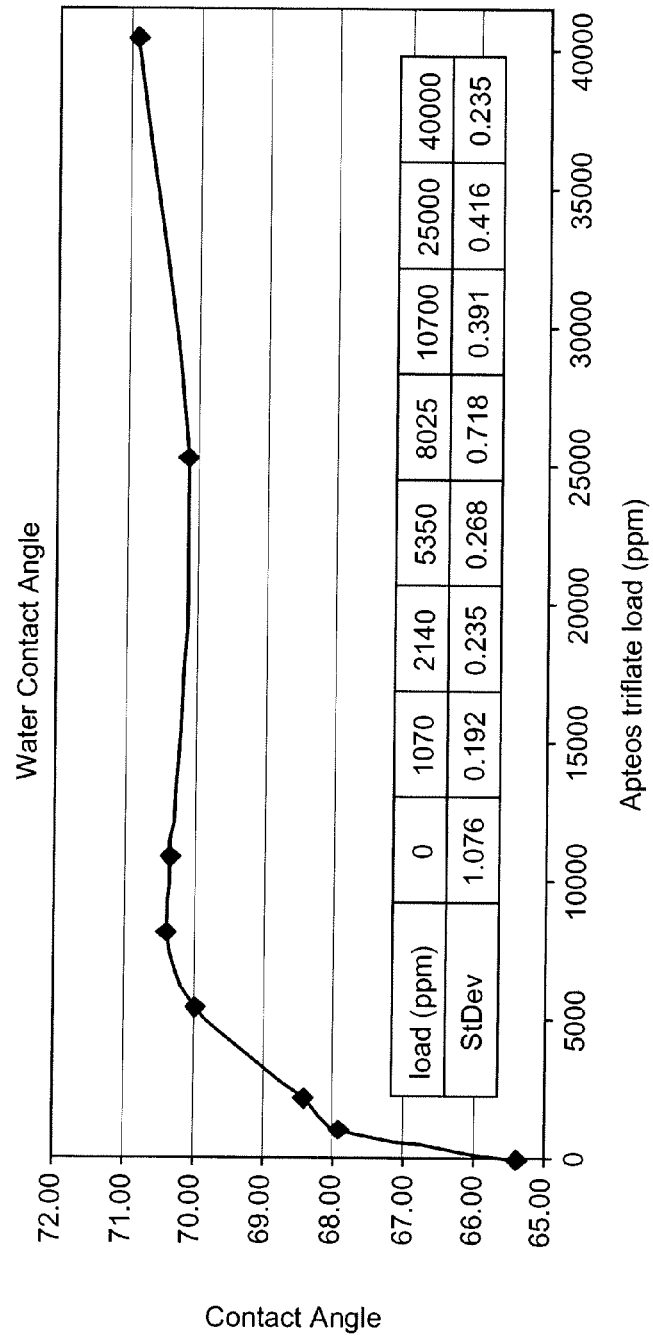
FIG. 26 shows water contact angle, n & k data and molecular weight data for a contemplated embodiment.
Figure 27:
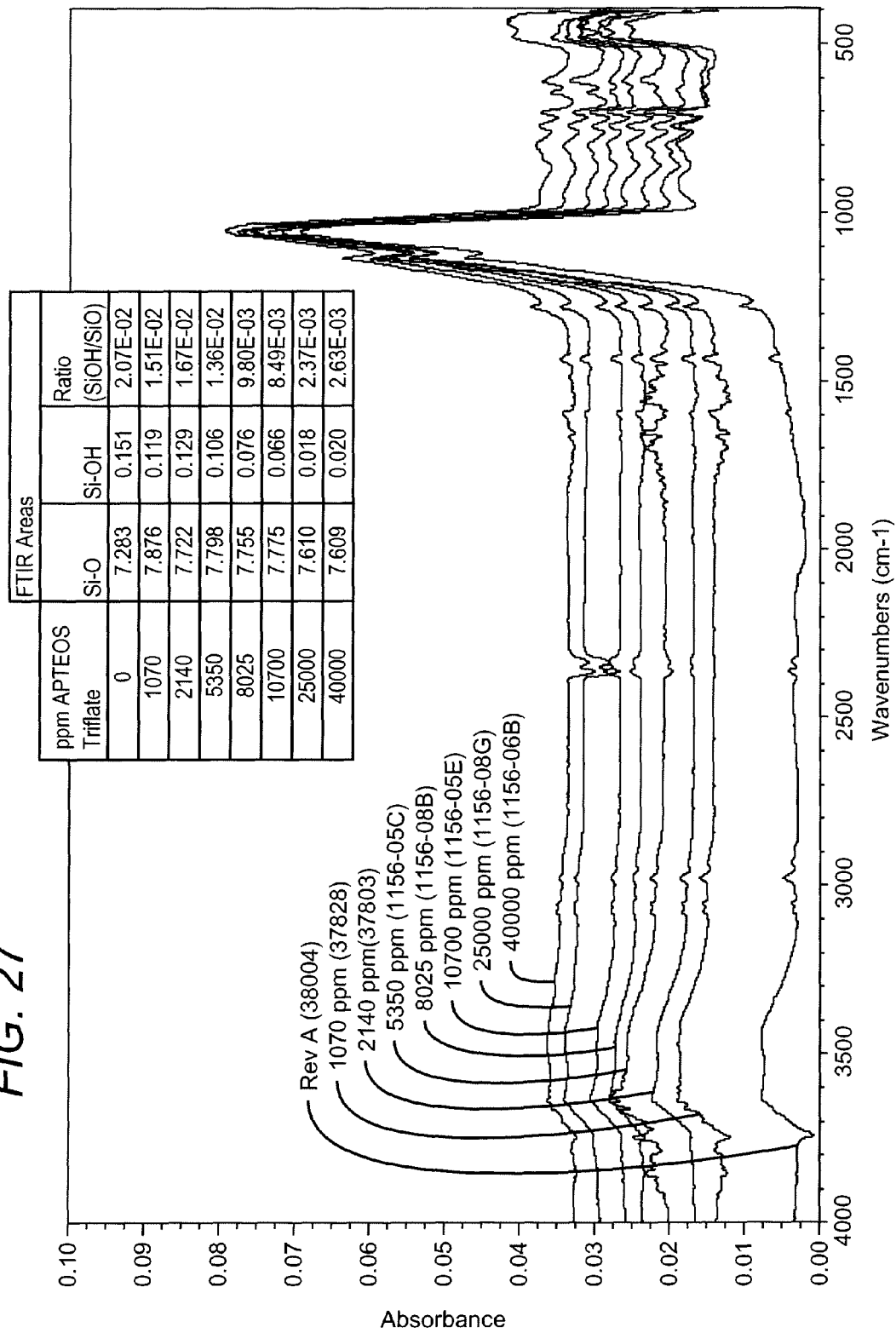
FIG. 27 shows FTIR data for a contemplated embodiment.

FIG. 26 and Tables 22-23 show the water contact angle, n & k and molecular weight of an organosiloxane polymer at pH of 1.5 and different concentrations of APTEOS triflate. FIG. 27 shows the FTIR data for the organosiloxane polymer mentioned with different loads of APTEOS triflate. Table 24 shows the wet etch rate of one of the organosiloxane polymer compositions that has a high load of APTEOS triflate.

TABLE 3

| Description | 248 Absorbing Comp. | 193 Absorbing Comp. POR | 193 Absorbing Comp. Rev A | 193 Absorbing Comp. Rev C | 193 Absorbing Comp. Rev C |
|---|---|---|---|---|---|
| Bake Sequence | 130/200° C. 50 sec each | 150/250° C. | 130/200° C. | 130/200° C. 90 sec each | 130/240° C. |
| 500:1BOE  30 sec | 1224 | | 2012 | 248 | 133 |
| @ 21° C.    1 min | 1000 | 560 | [1568] | 306 | 201 |
|              2 min | [880] | | | | |

TABLE 3-continued

| | | Pre | ER | Pre | ER | Pre | ER | Pre | ER | Pre | ER |
|---|---|---|---|---|---|---|---|---|---|---|---|
| TMAH 2.3% aq. | 1 min @ 23° C. | 3529 | 50 | 2731 | 5 | 2694 | 57 | 2691 | −12 | 2695 | −7 |
| TMAH | 50° C. | 3534 | 429 | 2715 | 2 | 2663 | 100 | 2686 | −19 | 2701 | 0 |
| | 75° C. | 3596 | 1795 | 2720 | 117 | 2702 | 781 | 2720 | 36 | 2672 | 13 |
| 5.0% aq. | 23° C. | 3526 | [398] | 2705 | −13 | 2679 | 43 | 2739 | −1 | 2693 | −15 |
| TMAH | 50° C. | 3487 | 2102 | 2774 | 3 | 2723 | 298 | 2702 | −10 | 2672 | −28 |
| | 75° C. | 3530 | >3530 | 2709 | 226 | 2699 | 1212 | 2709 | 53 | 2725 | 21 |
| 10.0% aq. | 23° C. | 3497 | >3497 | 2670 | −2 | 2687 | 166 | 2702 | −18 | 2670 | −31 |
| TMAH | 50° C. | 3525 | >3525 | 2670 | 78 | 2670 | 716 | 2693 | −12 | 2679 | 40 |
| | 75° C. | 3519 | >3519 | 2670 | 557 | 2706 | >2706 | 2709 | 102 | 2688 | 364 |

| Description | 193 Absorbing Comp. Rev C (no acetone) +5% DPG | 193 Absorbing Comp. + 383 ppm TMAH triflate | 193 Absorbing Comp. + 383 ppm TMAH triflate | 193 Absorbing Comp. + 1070 ppm APTEOS triflate | 193 Absorbing Comp. + 383 ppm TMAH triflate +3% DPG |
|---|---|---|---|---|---|
| Bake Sequence | 130/200° C. | 130/200° C. | 130/240° C. 90 sec each | 130/240° C. | 130/240° C. |

| | | | | | | | | | | | |
|---|---|---|---|---|---|---|---|---|---|---|---|
| 500:1BOE @ 21° C. | 30 sec | 411 | | | | 962 | | 933 | | [1116] | |
| | 1 min | 531 | | TBD | | 820 | | [1030] | | [1069] | |
| | 2 min | 536 | | | | 854 | | | | | |
| TMAH | 1 min @ | Pre | ER | Pre | ER | Pre | ER | Pre | ER | Pre | ER |
| 2.3% aq. | 23° C. | 2312 | −12 | 2670 | 22 | 2676 | 8 | 2699 | 9 | 3543 | 44 |
| TMAH | 50° C. | 2331 | 6 | 2693 | 11 | 2663 | −5 | 2705 | −14 | 3516 | >3516 |
| | 75° C. | 2323 | 71 | 2694 | 88 | 2677 | 71 | 2692 | 143 | 3588 | >3588 |
| 5.0% aq. | 23° C. | 2311 | −8 | 2702 | 28 | 2716 | 14 | 2698 | 39 | 3563 | 129 |
| TMAH | 50° C. | 2327 | −11 | 2688 | 40 | 2673 | 26 | 2752 | 93 | 3519 | >3519 |
| | 75° C. | 2361 | 120 | 2686 | 211 | 2673 | 130 | 2685 | 202 | 3503 | >3503 |
| 10.0% aq. | 23° C. | 2318 | −8 | 2691 | 26 | 2672 | 9 | 2700 | 45 | 3469 | 1240 |
| TMAH | 50° C. | 2327 | 11 | 2693 | 156 | 2666 | 91 | 2576 | 100 | 3483 | >3483 |
| | 75° C. | 2316 | 275 | 2731 | 410 | 2653 | 285 | 3543 | 1443 | 3532 | >3532 |

TABLE 4

| Description | 248 Absorbing Comp. | 193 Absorbing Comp. Rev C | 193 Absorbing Comp. +1070 ppm APTEOS triflate | 193 Absorbing Comp. +1070 ppm APTEOS triflate | 193 Absorbing Comp. +1070 ppm APTEOS triflate | 193 Absorbing Comp. +1070 ppm APTEOS triflate +1.5% DPG |
|---|---|---|---|---|---|---|
| pH | N/A | <1 | <1 | <1 | <1 | <1 |
| Bake Sequence | 130/200° C. 50 sec | 130/160° C. | 130/160° C. | 130/200° C. 90 s | 130/240° C. | 130/200° C. |

| | | Pre | ER | Pre | ER | Pre | ER | Pre | ER | Pre | ER | Pre | ER |
|---|---|---|---|---|---|---|---|---|---|---|---|---|---|
| 500:1 BOE | 1 min @ 20° C. | 3533 | [873] | 1676 | 268 | 2741 | [1098] | 2724 | [1071] | 2737 | [1026] | 3211 | [1532] |
| TMAH | 1 min @ | Pre | ER | Pre | ER | Pre | ER | Pre | ER | Pre | ER | Pre | ER |
| 2.3% aq. | 23° C. | 3527 | 75 | 1690 | 0 | 2720 | 5 | 2747 | 28 | 2710 | 29 | 3172 | 51 |
| TMAH | 50° C. | 3524 | 572 | 1676 | 7 | 2722 | −1 | 2729 | −7 | 2713 | −11 | 3199 | [2093] |
| | 75° C. | 3540 | 1565 | 1676 | 28 | 2743 | 127 | 2743 | 97 | 2692 | 61 | 3188 | >3181 |
| 5.0% aq. | 23° C. | 3534 | [480] | 1681 | 8 | 2701 | 16 | 2722 | 23 | 2702 | 16 | 3179 | [539] |
| TMAH | 50° C. | 3543 | >3488 | 1676 | 12 | 2709 | 80 | 2717 | 58 | 2705 | 38 | 3183 | >3183 |
| | 75° C. | 3527 | >3527 | 1687 | 45 | 2715 | 272 | 2713 | 192 | 2671 | 150 | 3166 | >3166 |
| 10.0% aq. | 23° C. | 3539 | >3477 | 1690 | 11 | 2734 | 39 | 2741 | 36 | 2716 | 54 | 3201 | [1942] |
| TMAH | 50° C. | 3532 | >3532 | 1682 | 17 | 2736 | 259 | 2749 | 224 | 2731 | 168 | 3173 | >3173 |
| | 75° C. | 3533 | >3533 | 1674 | 109 | 2701 | 515 | 2726 | 518 | 2731 | 394 | 3186 | >3186 |

TABLE 5

| Description | 193 Absorbing Comp. +1070 ppm APTEOS triflate +1.5% DPG | 193 Absorbing Comp. +1070 ppm APTEOS triflate +3% DPG | 193 Absorbing Comp. +1070 ppm APTEOS triflate +3% DPG | 193 Absorbing Comp. +170 ppm Ammonium triflate +3% DPG | 193 Absorbing Comp. +170 ppm Ammonium triflate +3% DPG | 193 Absorbing Comp. +170 ppm Ammonium triflate |
|---|---|---|---|---|---|---|
| pH | <1 | <1 | <1 | <1 | <1 | <1 |
| Bake Sequence | 130/240° C. | 130/200° C. | 130/240° C. 90 s | 130/200° C. | 130/200° C. | 130/240° C. |

| | | Pre | ER | Pre | ER | Pre | ER | Pre | ER | Pre | ER | Pre | ER |
|---|---|---|---|---|---|---|---|---|---|---|---|---|---|
| 500:1 BOE | 1 min @ 20° C. | 3214 | [1432] | 3507 | [1176] | 3548 | [1065] | 2751 | [1113] | 2971 | [1514] | 2982 | [1459] |
| TMAH | 1 min @ | Pre | ER | Pre | ER | Pre | ER | Pre | ER | Pre | ER | Pre | ER |

TABLE 5-continued

| Description | | 193 Absorbing Comp. +1070 ppm APTEOS triflate +1.5% DPG | | 193 Absorbing Comp. +1070 ppm APTEOS triflate +3% DPG | | 193 Absorbing Comp. +1070 ppm APTEOS triflate +3% DPG | | 193 Absorbing Comp. +170 ppm Ammonium triflate +3% DPG | | 193 Absorbing Comp. +170 ppm Ammonium triflate +3% DPG | | 193 Absorbing Comp. +170 ppm Ammonium triflate | |
|---|---|---|---|---|---|---|---|---|---|---|---|---|---|
| 2.3% aq. TMAH | 23° C. | 3218 | 123 | 3523 | 83 | 3564 | 29 | 2732 | 19 | 2951 | 38 | 2972 | 30 |
| | 50° C. | 3184 | 1163 | 3510 | >3510 | 3529 | >3529 | 2746 | 76 | 2997 | 655 | 2960 | 421 |
| | 75° C. | 3203 | >3202 | 3505 | >3505 | 3519 | >3519 | 2736 | 325 | 2977 | >2977 | 2992 | >2854 |
| 5.0% aq. TMAH | 23° C. | 3194 | 102 | 3533 | [1125] | 3519 | [482] | 2744 | 33 | 2972 | 223 | 2952 | 54 |
| | 50° C. | 3175 | >3175 | 3505 | >3505 | 3479 | >3479 | 2725 | 254 | 2983 | [2060] | 2943 | 1407 |
| | 75° C. | 3165 | >3165 | 3495 | >3495 | 3487 | >3487 | 2750 | 558 | 2973 | >2973 | 2953 | >2953 |
| 10.0% aq. TMAH | 23° C. | 3200 | [592] | 3563 | [3203] | 3496 | 1748 | 2702 | 124 | 2979 | 1014 | 2949 | 455 |
| | 50° C. | 3176 | >3176 | 3504 | >3504 | 3496 | >3496 | 2761 | 619 | 2983 | >2983 | 2949 | >2949 |
| | 75° C. | 3187 | >3187 | 3534 | >3534 | 3500 | >3477 | 2766 | 991 | 2986 | >2986 | 2992 | >2992 |

TABLE 6

| Description | | 193 Absorbing Comp. | | 193 Absorbing Comp. +1070 ppm APTEOS triflate +0.5% DPG | | 193 Absorbing Comp. +1070 ppm APTEOS triflate +1.5% DPG | | 193 Absorbing Comp. +1070 ppm "optimized" APTEOS triflate +0.25% DPG | | 193 Absorbing Comp. +1070 ppm "optimized" APTEOS triflate +0.5% DPG | | 193 Absorbing Comp. +1070 ppm "optimized" APTEOS triflate +1% DPG | | 193 Absorbing Comp. +1070 ppm "optimized" APTEOS triflate +1.5% DPG | |
|---|---|---|---|---|---|---|---|---|---|---|---|---|---|---|
| pH | | N/A | | <1 | | <1 | | <2 | | <2 | | <2 | | <2 | |
| Bake Sequence | | 130/200° C. 50 sec | | 130/200° C. 90 sec | | 130/200° C. | | 130/200° C. | | 130/200° C. 90 sec | | 130/200° C. | | 130/200° C. | |
| 500:1 BOE | 1 min @ 20° C. | Pre 3487 | ER [977] | Pre 2869 | ER [1409] | Pre 3177 | ER [1601] | Pre 2879 | ER [1512] | Pre 2902 | ER [1602] | Pre 2907 | ER [1607] | Pre 2947 | ER [1850] |
| TMAH | 1 min @ | Pre | ER | Pre | ER | Pre | ER | Pre | ER | Pre | ER | Pre | ER | Pre | ER |
| 2.3% aq. TMAH | 23° C. | 3492 | 127 | 2874 | 18 | 3190 | 16 | 2854 | 28 | 2934 | 42 | 2957 | 55 | 2960 | 54 |
| | 50° C. | 3463 | 723 | 2886 | 94 | 3190 | 1806 | 2893 | 279 | 2887 | 447 | 2955 | 798 | 2958 | 735 |
| | 75° C. | 3494 | 1987 | 2875 | 861 | 3203 | >3203 | 2864 | [1519] | 2885 | >2979 | 2987 | >2987 | 2984 | >2984 |
| 5.0% aq. TMAH | 23° C. | 3496 | [812] | 2893 | 17 | 3182 | 93 | 2853 | 55 | 2898 | 96 | 2927 | 158 | 3038 | 258 |
| | 50° C. | 3520 | >3520 | 2857 | 356 | 3189 | >3189 | 2844 | 739 | 2910 | 1095 | 2932 | [1969] | 2973 | [2916] |
| | 75° C. | 3506 | >3506 | 2858 | [1660] | 3184 | >3184 | 2850 | >2771 | 2926 | >2926 | 2926 | >2926 | 3006 | >3006 |
| 10.0% aq. TMAH | 23° C. | 3499 | >3499 | 2877 | 163 | 3187 | 2803 | 2871 | 715 | 2967 | [1362] | 2977 | [2258] | 2992 | 1991 |
| | 50° C. | 3522 | >3522 | 2848 | 1196 | 3215 | >3215 | 2899 | >2899 | 2906 | >2903 | 2942 | >2942 | 2958 | >2958 |
| | 75° C. | 3542 | >3542 | 2851 | >2851 | 3186 | >3186 | 2885 | >2885 | 2897 | >2987 | 2991 | >2991 | 2976 | >2976 |

TABLE 7

| Description | | 193 Absorbing Comp. +170 ppm ammonium triflate +0.25% DPG | | 193 Absorbing Comp. +170 ppm ammonium triflate +0.5% DPG | | 193 Absorbing Comp. +170 ppm ammonium triflate +1% DPG | | 193 Absorbing Comp. +383 ppm TMAH – MSA | | 193 Absorbing Comp. +383ppm TMAH – MSA 1.5% DPG | | 193 Absorbing Comp. +1070 ppm APTEOS – MSA | | 193 Absorbing Comp. +1070 ppm APTEOS – MSA +1.5% DPG | |
|---|---|---|---|---|---|---|---|---|---|---|---|---|---|---|
| pH | | <2 | | <2 | | <2 | | <2 | | <2 | | <2 | | <2 | |
| Bake Sequence | | 130/200° C. | | 130/200° C. 90 sec | | 130/200° C. | | 130/200° C. | | 130/200° C. 90 sec | | 130/200° C. | | 130/200° C. 90 sec | |
| 500:1 BOE | 1 min @ 20° C. | Pre 2804 | ER [1102] | Pre 2830 | ER [1149] | Pre 2931 | ER [1283] | Pre 2823 | ER 723 | Pre 2816 | ER 895 | Pre 2768 | ER 935 | Pre 2839 | ER 1086 |
| TMAH | 1 min @ | Pre | ER | Pre | ER | Pre | ER | Pre | ER | Pre | ER | Pre | ER | Pre | ER |
| 2.3% aq. TMAH | 23° C. | 2786 | 23 | 2821 | [1149] | 2924 | 54 | 2812 | 40 | 2828 | 40 | 2777 | 19 | 2834 | 26 |
| | 50° C. | 2827 | 86 | 2835 | 120 | 2891 | 201 | 2769 | 12 | 2810 | 18 | 2765 | 23 | 2831 | 48 |
| | 75° C. | 2762 | 415 | 2854 | 678 | 2897 | 1132 | 2755 | 123 | 2848 | 293 | 2794 | 209 | 2812 | 507 |
| 5.0% aq. TMAH | 23° C. | 2777 | 29 | 2841 | 27 | 2883 | 40 | 2773 | 11 | 2811 | 23 | 2821 | 36 | 2868 | 23 |
| | 50° C. | 2785 | 206 | 2871 | 278 | 2903 | 464 | 2797 | 22 | 2852 | 34 | 2763 | 45 | 2871 | 115 |
| | 75° C. | 2809 | 586 | 2843 | 278 | 2937 | 1827 | 2779 | 167 | 2824 | 457 | 2804 | 283 | 2848 | 695 |
| 10.0% aq. TMAH | 23° C. | 2785 | 102 | 2840 | 138 | 2885 | 223 | 2770 | 10 | 2827 | 29 | 2806 | 34 | 2811 | 26 |
| | 50° C. | 2782 | 605 | 2818 | 775 | 2914 | 1533 | 2843 | 81 | 2790 | 840 | 2792 | 610 | 2863 | 387 |
| | 75° C. | 2781 | 1100 | 2846 | [1696] | 2878 | [2878] | 2799 | 441 | 2793 | 849 | 2777 | 589 | 2847 | [1515] |

TABLE 8

| Description | 193 Absorbing Comp. +2140 ppm "optimized" APTEOS triflate + 0.16% DPG | | 193 Absorbing Comp. +2140 ppm "optimized" APTEOS triflate + 0.25% DPG | | 193 Absorbing Comp. +170 ppm "optimized" Ammonium triflate + 0.75% DPG | | 193 Absorbing Comp. +170 ppm "optimized" Ammonium triflate + 1% DPG | | 193 Absorbing Comp. +225 ppm "optimized" Ammonium triflate + 0.75% DPG | | 193 Absorbing Comp. +225 ppm "optimized" Ammonium triflate + 1% DPG | | 193 Absorbing Comp. +340 ppm "optimized" Ammonium triflate + 1% DPG | |
|---|---|---|---|---|---|---|---|---|---|---|---|---|---|---|
| pH | <2 | | <2 | | <2 | | <2 | | <2 | | <2 | | <2 | |
| Bake Sequence | 130/200° C. 90 sec | | 130/200° C. | | 130/200° C. 90 sec | | 130/200° C. | | 130/200° C. 90 sec | | 130/200° C. | | 130/200° C. 90 sec | |
| 500:1 BOE 1 min @ 20° C. | Pre 2970 | ER [1527] | Pre 2933 | ER [1486] | Pre 2933 | ER [1313] | Pre 2696 | ER [1130] | Pre 2902 | ER [1272] | Pre 2938 | ER [1314] | Pre 2970 | ER [1396] |
| TMAH 2.3% aq. TMAH 1 min @ 23° C. | Pre 2995 | ER 78 | Pre 2962 | ER 76 | Pre 2905 | ER 70 | Pre 2913 | ER 64 | Pre 2920 | ER 77 | Pre 2935 | ER 88 | Pre 2949 | ER 63 |
| 50° C. | 2965 | 248 | 2947 | 195 | 2929 | 171 | 2929 | 211 | 2908 | 167 | 2932 | 220 | 2951 | 215 |
| 75° C. | 2970 | [1608] | 2946 | 1166 | 2914 | 1035 | 2959 | 1341 | 2941 | 1077 | 2962 | 1369 | 2998 | 1565 |
| 5.0% aq. TMAH 23° C. | 2959 | 137 | 2932 | 103 | 2905 | 87 | 2924 | 90 | 2936 | 91 | 2929 | 133 | 2960 | 105 |
| 50° C. | 2968 | 591 | 2942 | 462 | 2915 | 405 | 2914 | 486 | 2923 | 412 | 2980 | 567 | 2991 | 548 |
| 75° C. | 2943 | [2608] | 2983 | 1565 | 2948 | 1398 | 2932 | [2138] | 2945 | [1664] | 2940 | [2166] | 2974 | >2974 |
| 10.0% aq. TMAH 23° C. | 2982 | 186 | 2937 | 147 | 2915 | 99 | 2944 | 124 | 2919 | 124 | 2962 | 117 | 2989 | 189 |
| 50° C. | 3012 | 1616 | 2950 | 1187 | 2934 | 1028 | 2978 | 1274 | 2909 | 1170 | 2908 | 1253 | 3008 | 1476 |
| 75° C. | 1966 | >2966 | 2971 | >2971 | 2879 | [2878] | 2923 | 2923 | 2932 | >2932 | 2937 | >2937 | 2972 | >2972 |

TABLE 9

| Description | 248 Absorbing Comp. | | 193 Absorbing Comp. +1070 ppm "optimized" APTEOS triflate + 0% DPG | | 193 Absorbing Comp. +1070 ppm "optimized" APTEOS triflate + 0.08% DPG | | 193 Absorbing Comp. +1070 ppm "optimized" APTEOS triflate + 0.16% DPG | |
|---|---|---|---|---|---|---|---|---|
| pH | <2 | | <2 | | <2 | | <2 | |
| Bake Sequence | 130/200° C. 50 sec | | 130/200° C. | | 130/200° C. 90 sec | | 130/200° C. | |
| 500:1 BOE 1 min @ 20° C. | Pre 3565 | ER [1013] | Pre 2887 | ER [1354] | Pre 2900 | ER [1356] | Pre 2942 | ER [1467] |
| TMAH 2.3% aq. TMAH 1 min @ 23° C. | Pre 3544 | ER 134 | Pre 2866 | ER 72 | Pre 2885 | ER 73 | Pre 2921 | ER 72 |
| 50° C. | 3561 | 803 | 2858 | 105 | 2894 | 142 | 2952 | 175 |
| 75° C. | 3598 | [2559] | 2902 | 622 | 2925 | 833 | 2916 | 1191 |
| 5.0% aq. TMAH 23° C. | 3559 | >3530 | 2861 | 81 | 2901 | 101 | 2930 | 91 |
| 50° C. | 3539 | >3539 | 2848 | 256 | 2874 | 339 | 2902 | 456 |
| 75° C. | 3565 | >3563 | 2893 | 789 | 2912 | 1124 | 2941 | 1612 |
| 10.0% aq. TMAH 23° C. | 3563 | >2563 | 2850 | 93 | 2892 | 132 | 2917 | 156 |
| 50° C. | 3580 | >3580 | 2892 | 704 | 2870 | 851 | 2936 | 1211 |
| 75° C. | 3545 | >3545 | 2893 | [1493] | 2886 | [2142] | 2914 | [2914] |

| Description | 193 Absorbing Comp. +1070 ppm "optimized" APTEOS triflate + 0.25% DPG | | 193 Absorbing Comp. +1600 ppm "optimized" APTEOS triflate + 0.08% DPG | | 193 Absorbing Comp. +1600 ppm "optimized" APTEOS triflate + 0.16% DPG | | 193 Absorbing Comp. +1600 ppm "optimized" APTEOS triflate + 0.25% DPG | |
|---|---|---|---|---|---|---|---|---|
| pH | <2 | | <2 | | <2 | | <2 | |
| Bake Sequence | 130/200° C. | | 130/200° C. | | 130/200° C. 90 sec | | 130/200° C. | |
| 500:1 BOE 1 min @ 20° C. | Pre 2974 | ER [1450] | Pre 2884 | ER [1351] | Pre 2910 | ER [1450] | Pre 2984 | ER [1565] |
| TMAH 2.3% aq. TMAH 1 min @ 23° C. | Pre 2956 | ER 87 | Pre 2919 | ER 79 | Pre 2909 | ER 77 | Pre 2944 | ER 33 |
| 50° C. | 2933 | 242 | 2906 | 166 | 2984 | 249 | 2960 | 266 |
| 75° C. | 2982 | 1506 | 2885 | 893 | 2925 | 1089 | 2987 | [1854] |
| 5.0% aq. TMAH 23° C. | 2941 | 100 | 2875 | 79 | 2904 | 85 | 2966 | 137 |
| 50° C. | 2970 | 588 | 2917 | 410 | 2931 | 487 | 2987 | 640 |
| 75° C. | 2927 | [2504] | 2907 | 1198 | 2952 | [1672] | 2981 | [2920] |
| 10.0% aq. TMAH 23° C. | 2956 | 226 | 2865 | 115 | 2947 | 158 | 2960 | 222 |
| 50° C. | 2977 | 1548 | 2894 | 934 | 2918 | 1186 | 2950 | 1771 |
| 75° C. | 2939 | >2939 | 2879 | [2267] | 2967 | >2967 | 2960 | >2960 |

TABLE 10

| Descriptions | | 248 Absorbing Comp. | 193 Absorbing Comp. + 1070 ppm APTEOS tosylate | 193 Absorbing Comp. + 1070 ppm APTEOS tosylate | 193 Absorbing Comp. + 1070 ppm APTEOS tosylate + 5% DPG | 193 Absorbing Comp. + 1070 ppm APTEOS tosylate + 5% DPG |
|---|---|---|---|---|---|---|
| pH | | 1.5 | <1 | <1 | <1 | <1 |
| Bake temp. (C.)/Time (Sec.) | | 150/250 C. -- 50 sec | 130/200 C. -- 90 sec | 130/240 C. -- 90 sec | 130/200 C. -- 90 sec | 130/240 C. -- 90 sec |
| Metrics | | ER (A/min) | ER (A/min) | ER (A/min) | ER (A/min) | ER (A/min) |
| 2.5% TMAH @ 21° C. | 1 min | 219 | 13 | 19 | 51 | 14 |
| | 2 min | 167 | 13 | 4 | 43 | 10 |
| 500:1BOE @ 21° C. | 30 sec | | | | | |
| | 1 min | | | | | |
| | 2 min | | | | | |

ER: Etch Rate (A/min);
Pre: Pre-Immersion SOG Film Average Thickness in Angstrom;

 ER > 1000 A/min

 ER < 1000 A/min

> Bare Si post-etch
[ ] Post-etch film is highly non-uniformed.

TABLE 11

| Descriptions | | 248 Absorbing Comp. | 193 Absorbing Comp. Rev A + 383 ppm TMAH triflate | 193 Absorbing Comp. Rev A + 383 ppm TMAH tosylate |
|---|---|---|---|---|
| pH | | N/A | <1 | <1 |
| Bake temp. (C.)/Time (Sec.) | | 130/200 C. -- 50 sec | 130/240 C. -- 90 sec | 130/240 C. -- 90 sec |
| Metrics | | ER (A/min) | ER (A/min) | ER (A/min) |
| 2.5% TMAH @ 21° C. | 1 min | 219 | 11 | 16 |
| | 2 min | 167 | 4 | 8 |
| 500:1BOE @ 21° C. | 30 sec | | | |
| | 1 min | | | |
| | 2 min | | | |

ER: Etch Rate (A/min);
Pre: Pre-Immersion SOG Film Average Thickness in Angstrom;

 ER > 1000 A/min

 ER < 1000 A/min

> Bare Si post-etch
[ ] Post-etch film is highly non-uniformed.

TABLE 12

| | "N" wt/Si comp. Wt (ppm) | "N" mole/Si comp. Wt (ppm) | "N" mole/Si comp. Wt (ppm) (consider 95% TMAA and 96% TMAN |
|---|---|---|---|
| AS_TMAA | 589 | 4.422 | 4.201 |
| TMAN | 601.2 | 4.416 | 4.239 |

TABLE 13

| | | 193 Absorbing Composition + TMAA | | | | |
|---|---|---|---|---|---|---|
| Bake temp. (C.)/Time (Sec.) Metrics | | 130/150° C. - 90 sec ER (A/min) | 130/175° C. - 90 sec ER (A/min) | 130/200° C. - 90 sec ER (A/min) | 130/225° C. - 90 sec ER (A/min) | 130/250° C. - 90 sec ER (A/min) |
| 2.5% TMAH @ 21° C. | 1 min | −1 | 5 | −7 | −2 | −3 |
| PGMEA @ 21° C. | 6 min | 0.4 | −0.6 | −0.4 | −0.2 | −0.9 |
| 500:1BOE @ 21° C. | 30 sec | 358 | 251 | 206 | 165 | 144 |
| | 1 min | 331 | 273 | 215 | 191 | 176 |

TABLE 13-continued

| | | 193 Absorbing Composition + TMAN | | | | | 248 Absorb. |
|---|---|---|---|---|---|---|---|
| Bake temp. (C.)/ Time (Sec.) Metrics | | 150/150° C. - 50 sec ER (A/min) | 130/175° C. - 90 sec ER (A/min) | 130/200° C. - 90 sec ER (A/min) | 130/225° C. - 90 sec ER (A/min) | 130/250° C. - 90 sec ER (A/min) | Comp. 130/200° C. - 60 sec ER (A/min) |
| 2.5% TMAH @ 21°C. | 1 min | 1 | −3 | −1 | 1 | 3 | 882 |
| PGMEA @ 21° C. | 6 min | −0.7 | −0.2 | −0.7 | 0.1 | −0.1 | 21 |
| 500:1BOE @ 21° C. | 30 sec | 574 | 403 | 261 | 238 | 186 | 1140 |
| | 1 min | 552 | 413 | 312 | 244 | 198 | 983 |

Spin Coated @ 7 PM on May 22, 2003; Wet Process

TABLE 14

| Descriptions | | 193 Absorbing Comp. + 600 ppm TMAN | 193 Absorbing Comp. + 600 ppm Stabilized TMAA | 248 Absorbing Comp. |
|---|---|---|---|---|
| pH | | 1.7 | 0.5 | N/A |
| Bake temp. (C.)/ Time (Sec) | | 130/240 C. - 90 sec | 130/240 C. - 90 sec | 130/200 C. - 50 sec |
| DIWater Contact Angle Metrics | | 78.7 ER (A/min) | 78.9 ER (A/min) | 74.9 ER (A/min) |
| 2.5% TMAH @ 21° C. | 1 min | −7 | −9 | 45 |
| | 2 min | −8 | −10 | 47 |
| 500:1BOE @ 21° C. | 30 sec | 263 | 277 | 785 |
| | 1 min | 506 | 410 | 937 |
| | 2 min | 413 | 366 | 720 |
| DIWater Contact Angle Metrics | | 77.5 ER (A/min) | 78 ER (A/min) | 74.2 ER (A/min) |
| 2.5% TMAH @ 21° C. | 1 min | −10 | −13 | 12 |
| | 2 min | −8 | −1 | 30 |
| 500:1BOE @ 21° C. | 30 sec | 230 | 174 | 715 |
| | 1 min | 370 | 268 | 796 |
| | 2 min | 370 | 230 | 670 |
| DIWater Contact Angle Metrics | | 79.2 ER (A/min) | 77.2 ER (A/min) | 72 ER (A/min) |
| 2.5% TMAH @ 21° C. | 1 min | −10 | −11 | 24 |
| | 2 min | −9 | −7 | 40 |
| 500:1BOE @ 21° C. | 30 sec | 223 | 215 | 931 |
| | 1 min | 400 | 307 | 964 |
| | 2 min | 405 | 313 | [720] |
| DIWater Contact Angle Metrics | | 77.5 ER (A/min) | 78.3 ER (A/min) | 70 ER (A/min) |
| 2.5% TMAH @ 21° C. | 1 min | −4 | 1 | 96 |
| | 2 min | −6 | −1 | 96 |
| 500:1BOE @ 21° C. | 30 sec | 266 | 256 | 935 |
| | 1 min | 326 | 274 | 912 |
| | 2 min | [351] | [319] | [722] |

TABLE 15

| Descriptions | | 248 Absorbing Comp. | 193 Absorbing Comp. + 600 ppm Stabilized TMAA | 193 Absorbing Comp. + 600 ppm TMAN |
|---|---|---|---|---|
| Bake temp. (C.) | | 130/200 C. | 130/240 C. | 130/240 C. |
| DIWater Contact Angle Metrics | | ER (A/min) | ER (A/min) | ER (A/min) |
| 2.5% TMAH @ 21° C. | 1 min | 67 | −3 | −5 |
| | 2 min | 62 | −2 | −6 |
| 500:1BOE @ 21° C. | 30 sec | 815 | 158 | 219 |
| | 1 min | 688 | 171 | 252 |
| | 2 min | 621 | 173 | 312 |
| NE - 14 @ 21° C. | 30 sec | 2833 | | |
| | 1 min | >2815 | | |

TABLE 15-continued

| Descriptions | | 248 Absorbing Comp. | 193 Absorbing Comp. + 600 ppm Stabilized TMAA | 193 Absorbing Comp. + 600 ppm TMAN |
|---|---|---|---|---|
| DIWater Contact Angle Metrics | | ER (A/min) | ER (A/min) | ER (A/min) |
| 2.5% TMAH @ 21° C. | 1 min | 31 | −2 | −6 |
| | 2 min | 49 | −2 | −4 |
| 500:1BOE @ 21° C. | 30 sec | 230 | 154 | 195 |
| | 1 min | 753 | 181 | 303 |
| | 2 min | [605] | 188 | 320 |
| NE - 14 @ 21° C. | 30 sec | 2636 | | |
| | 1 min | >2710 | | |
| DIWater Contact Angle Metrics | | ER (A/min) | ER (A/min) | ER (A/min) |
| 2.5% TMAH @ 21° C. | 1 min | 74 | −8 | 2 |
| | 2 min | 80 | −2 | 1 |
| 500:1BOE @ 21° C. | 30 sec | 839 | 165 | 234 |
| | 1 min | 742 | 188 | 282 |
| | 2 min | 655 | 188 | 315 |
| NE - 14 @ 21° C. | 30 sec | 3040 | | |
| | 1 min | >2792 | | |

TABLE 16

| Descriptions | | 248 Absorbing Comp. | 193 Absorbing Comp. + 600 ppm Stabilized TMAA | 193 Absorbing Comp. + 600 ppm TMAN |
|---|---|---|---|---|
| Bake temp. (C.) | | 130/200 C. | 130/240 C. | 130/240 C. |
| DIWater Contact Angle Metrics | | ER (A/min) | ER (A/min) | ER (A/min) |
| 2.5% TMAH @ 21° C. | 1 min | 53 | −2 | −1 |
| | 2 min | 56 | 1 | −6 |
| 500:1BOE @ 21° C. | 30 sec | 700 | 173 | 184 |
| | 1 min | 688 | 156 | 253 |
| | 2 min | 601 | 168 | 286 |
| NE - 14 @ 21° C. | 30 sec | 1732 | | |
| | 1 min | >2825 | | |

TABLE 17

| Description | | 248 Absorbing Comp. 248.2100.200 mm | 193 Absorbing Comp. Rev A | 193 Absorbing Comp. +1070 ppm "optimized" APTEOS triflate | 193 Absorbing Comp. +1070 ppm "optimized" APTEOS triflate | 193 Absorbing Comp. +1070 ppm "optimized" APTEOS triflate | 193 Absorbing Comp. +1070 ppm "optimized" APTEOS triflate | 193 Absorbing Comp. +1070 ppm "optimized" APTEOS triflate | 193 Absorbing Comp. +1070 ppm "optimized" APTEOS triflate | 193 Absorbing Comp. +1070 ppm "optimized" APTEOS triflate |
|---|---|---|---|---|---|---|---|---|---|---|
| pH | | N/A | 1.5 | <2 | <2 | <2 | <2 | <2 | <2 | <2 |
| Bake Sequence | | 130/200° C. 50 sec | 130/200° C. 90 sec | 130/180° C. | 130/200° C. | 130/200° C. | 130/220° C. 90 sec | 130/240° C. | 130/250° C. | 130/280° C. |
| 500:1 BOE | 1 min @ 20° C. ER | 748 | [1568] | [1405] | [1354] | 1311 | [1111] | 912 | 884 | [850] |
| TMAH 2.3% aq. TMAH | 1 min @ 23° C. 50° C. 75° C. | 76 780 1931 | 57 100 781 | 82 144 797 | 72 105 622 | 31 90 446 | 36 45 372 | −1 −8 228 | 2 19 179 | 27 4 129 |
| 5.0% aq. TMAH | 23° C. 50° C. 75° C. | no data >3522 >3566 | 43 298 1212 | 37 347 1261 | 81 256 789 | 1 222 782 | 21 123 624 | −15 47 406 | 20 38 321 | 0 46 211 |
| 10.0% aq. TMAH | 23° C. 50° C. 75° C. | >3511 >3536 >3571 | 166 716 >2706 | 196 766 [1981] | 93 704 [1493] | 60 485 1282 | 52 294 900 | 12 205 745 | 26 115 462 | 14 41 332 |

TABLE 18

| Description | | 248 Absorbing Comp. 248.2100.200 mm | 193 Absorbing Comp. Rev A +1070 ppm "optimized" APTEOS triflate + 1.5% DPG | 193 Absorbing Comp. Rev A +1070 ppm "optimized" APTEOS triflate + 1.5% DPG | 193 Absorbing Comp. Rev A +1070 ppm "optimized" APTEOS triflate + 1.5% DPG | 193 Absorbing Comp. Rev A +1070 ppm "optimized" APTEOS triflate + 1.5% DPG | 193 Absorbing Comp. Rev A +1070 ppm "optimized" APTEOS triflate + 1.5% DPG |
|---|---|---|---|---|---|---|---|
| pH | | N/A | <2 | <2 | <2 | <2 | <2 |
| Bake Sequence | | 130/200° C. 50 sec | 130/180° C. | 130/200° C. | 130/220° C. 90 sec | 130/240° C. | 130/260° C. |
| 500:1 BOE | 1 min @ 20° C. ER | [846] | [1608] | [1439] | [1282] | [1219] | [1113] |
| TMAH 2.3% aq. TMAH | 1 min @ 23° C. 50° C. 75° C. | 78 393 1988 | 74 386 2567 | 75 146 1483 | 18 123 1090 | 42 10 590 | 19 23 538 |
| 5.0% aq. TMAH | 23° C. 50° C. 75° C. | 818 >3509 >3484 | 110 959 >2862 | 54 400 >2867 | 27 275 1366 | 73 98 900 | 42 65 856 |
| 10.0% aq. TMAH | 23° C. 50° C. 75° C. | >3486 >3509 >3474 | 503 959 >2804 | 105 400 >2819 | 75 275 >2821 | 31 98 1616 | 28 65 1283 |

TABLE 19

| Description | | 248 Absorbing Comp. 248.2100.200 mm | 193 Absorbing Comp. Rev A | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG |
|---|---|---|---|---|---|---|---|---|---|
| pH | | N/A | 1.5 | <2 | <2 | <2 | <2 | <2 | <2 |
| Bake Sequence | | 130/200° C. 50 sec | 130/200° C. 90 sec | 130/180° C. 90 sec | 130/200° C. 90 sec | 130/220° C. 90 sec | 130/240° C. 90 sec | 130/250° C. 90 sec | 130/280° C. 90 sec |
| 500:1 BOE | 1 min @ 20° C. ER | 748 | [1568] | [1385] | 1086 | 852 | 801 | 800 | 755 |
| TMAH 2.3% aq. TMAH | 1 min @ 23° C. 50° C. 75° C. | 76 780 1931 | 57 100 781 | 54 131 1129 | 26 48 507 | 12 36 518 | −5 −35 201 | 21 20 242 | −3 −7 226 |

TABLE 19-continued

| Description | | 248 Absorbing Comp. 248.2100.200 mm | 193 Absorbing Comp. Rev A | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG | 193 Absorbing Comp. +1070 ppm "optimized" APTEOS MSA + 1.5% DPG |
|---|---|---|---|---|---|---|---|---|---|
| 5.0% aq. TMAH | 23° C. | no data | 43 | 46 | 23 | 4 | −24 | 13 | 17 |
| | 50° C. | >3522 | 298 | 444 | 115 | 78 | −15 | 28 | 10 |
| | 75° C. | >3566 | 1212 | >2889 | 695 | 686 | 372 | 466 | 383 |
| 10.0% aq. TMAH | 23° C. | >3511 | 166 | 94 | 26 | 32 | −6 | −6 | 12 |
| | 50° C. | >3536 | 716 | 906 | 387 | 168 | 58 | 82 | −19 |
| | 75° C. | >3571 | >2706 | >2831 | [1515] | 1172 | 746 | 970 | 513 |

TABLE 20

| Materials | pH | Days at 40° C. | Mn | Mw | Mp | Mz | Mz + 1 | PDI |
|---|---|---|---|---|---|---|---|---|
| 193 Absorb. Comp. Rev A + 1070 ppm "opt" apteos triflate | 1.732 | 0 | 780 | 1109 | 735 | 1488 | 1844 | 1.422 |
| | | 5 | 1062 | 1568 | 1329 | 2188 | 2853 | 1.476 |
| 193 Absorb. Comp. Rev A + 1070 ppm "opt" apteos triflate + 1.5% DPG | <2 | 0 | 891 | 1269 | 754 | 1722 | 2179 | 1.424 |
| | | 7 | 1058 | 1486 | 1198 | 1995 | 2520 | 1.404 |
| 193 Absorb. Comp. Rev A + 1070 ppm "opt" apteos msa + 1.5% DPG | <2 | 0 | 880 | 1241 | 749 | 1680 | 2127 | 1.41 |
| | | 7 | 1006 | 1410 | 1175 | 1887 | 2364 | 1.402 |
| 5 days at 40 C. 193AC | | | Mn | Mw | | 110 nm via fill | | |
| pH1.5 + 2000 ppm nitric acid acidified TMAA | | | 1289 | 1641 | | No voiding | | |

TABLE 21

| Description | | 248 Absorbing Comp. 248.2100.200 mm | 193 Absorbing Comp. Rev A | 193 Absorbing Comp. pH 5.5 | 193 Absorbing Comp. Rev A + 1070 ppm + APTEOS Nitrate | 193 Absorbing Comp. Rev A + 1070 ppm + APTEOS Nitrate + 1.5% DPG | 193 Absorbing Comp. Rev A + 1070 ppm + APTEOS Nitrate + 3% DPG | 193 Absorbing Comp. Rev A + 1070 ppm + APTEOS Nitrate + 6% DPG | 193 Absorbing Comp. Rev A + 1070 ppm + APTEOS Nitrate + 9% DPG |
|---|---|---|---|---|---|---|---|---|---|
| pH | | N/A | 1.5 | 5.5 | <2 | <2 | <2 | <2 | <2 |
| Bake Sequence | | 130/200° C. 50 sec N2 | 130/200° C. 90 sec N2 | 130/240° C. 60 sec N2 | 130/240° C. 90 sec N2 | 130/240° C. 90 sec N2 | 130/240° C. 90 sec N2 | 130/240° C. 90 sec N2 | 130/240° C. 90 sec N2 |
| 500:1 BOE | 1 min @ 20° C. | ER 675 | [1568] | ER 612 | ER 422 | ER [545] | ER 571 | ER 681 | ER 626 |
| TMAH 2.3% aq. TMAH | 1 min @ 23° C. | Pre 72 | ER 2694 | 57 | 1 | 28 | −7 | 40 | 56 | 62 |
| | 50° C. | 525 | 2663 | 100 | −11 | 42 | 6 | 28 | 20 | 26 |
| | 75° C. | 2018 | 2702 | 781 | 142 | 117 | 356 | 224 | 347 | 463 |
| 5.0% aq. TMAH | 23° C. | 485 | 2679 | 43 | 2 | 40 | −5 | 32 | 13 | 10 |
| | 50° C. | >3536 | 2723 | 298 | −9 | 20 | 18 | 17 | 21 | 13 |
| | 75° C. | >3527 | 2699 | 1212 | 339 | 119 | 508 | 259 | 524 | 776 |
| 10.0% aq. TMAH | 23° C. | >3461 | 2687 | 166 | −17 | 33 | −2 | 20 | 36 | 14 |
| | 50° C. | >3469 | 2670 | 716 | 142 | 41 | 81 | 106 | 50 | 80 |
| | 75° C. | >3514 | 2706 | >2706 | 859 | 219 | 1040 | 546 | 1075 | 1573 |

TABLE 22

| Description | Thickness | 1 dev | Reflectance @ 193 nm | n @ 193 nm | k @ 193 nm |
|---|---|---|---|---|---|
| 193 Rev A | 1469 | 12.2 | 9.77 | 1.8027 | 0.3811 |
| 193 Rev A + 1070 ppm APTEOS Triflate | 1502 | 15.4 | 10.26 | 1.8019 | 0.3469 |
| 193 Rev A + 2140 ppm APTEOS Triflate | 1514 | 12.1 | 10.33 | 1.7945 | 0.3304 |
| 193 Rev A + 5350 ppm APTEOS Triflate | 1509 | 15.4 | 10.18 | 1.7931 | 0.3362 |
| 193 Rev A + 8025 ppm APTEOS Triflate | 1512 | 9.7 | 10.19 | 1.7918 | 0.3329 |
| 193 Rev A + 10700 ppm APTEOS Triflate | 1506 | 12.7 | 10.15 | 1.7958 | 0.3427 |
| 193 Rev A + 25000 ppm APTEOS Triflate | 1500 | 12.2 | 10.14 | 1.7998 | 0.3526 |
| 193 Rev A + 40000 ppm APTEOS Triflate | 1533 | 10.5 | 10.16 | 1.7793 | 0.3276 |

TABLE 23

| ppm APTEOS Triflate | 400 Aging | Mn | Mw | Mp | Mz | Mz + 1 | Polydispersity |
|---|---|---|---|---|---|---|---|
| 193 Rev A + 1070 ppm APTEOS Triflate | 0 | 920 | 1283 | 759 | 1724 | 2173 | 1.395362 |
|  | 5 | 1279 | 1681 | 1405 | 2174 | 2706 | 1.314284 |
| 193 Rev A + 2140 ppm APTEOS Triflate | 0 | 754 | 1119 | 744 | 1562 | 2000 | 1.483957 |
|  | 5 | 955 | 1378 | 788 | 1897 | 2455 | 1.442483 |
| 193 Rev A + 5350 ppm APTEOS Triflate | 0 | 876 | 1226 | 754 | 1640 | 2046 | 1.3994 |
|  | 5 | 984 | 1367 | 779 | 1819 | 2268 | 1.38917 |
| 193 Rev A + 8025 ppm APTEOS Triflate | 0 | 877 | 1228 | 754 | 1646 | 2058 | 1.40051 |
|  | 5 | 988 | 1369 | 1112 | 1812 | 2247 | 1.38518 |
| 193 Rev A + 10700 ppm APTEOS Triflate | 0 | 875 | 1226 | 755 | 1642 | 2052 | 1.40143 |
|  | 5 | 1001 | 1396 | 1156 | 1860 | 2320 | 1.3942 |
| 193 Rev A + 25000 ppm APTEOS Triflate | 0 | 846 | 1204 | 764 | 1635 | 2060 | 1.42421 |
|  | 5 |  |  |  |  |  |  |
| 193 Rev A + 40000 ppm APTEOS Triflate | 0 | 835 | 1169 | 755 | 1930 | 1930 | 1.39928 |
|  | 5 | 846 | 1260 | 773 | 1726 | 2168 | 1.489298 |

TABLE 24

| Description | 248 Absorbing Comp. 248.2100.200 mm | 193 Absorbing Comp. Rev A | 193 Absorbing Comp. Rev A + 10,700 ppm APTEOS triflate (10×) | 193 Absorbing Comp. Rev A + 40,000 ppm APTEOS triflate (37×) |
|---|---|---|---|---|
| pH | N/A |  | <2.5 | <2.5 |
| Bake Sequence | 130/200° C. 50 sec N2 | 130/200° C. 90 sec N2 | 130/240° C. 90 sec N2 | 130/240° C. 90 sec N2 |
| 500:1 BOE 1 min @ 20° C. ER | 751 | [1568] | 776 | [1116] |
| TMAH 1 min @ |  |  |  |  |
| 2.3% aq. TMAH 23° C. | 5357 | 57 | 22 | 45 |
| 2.3% aq. TMAH 50° C. | 493 | 100 | −8 | 95 |
| 2.3% aq. TMAH 75° C. | 1488 | 781 | 334 | [2522] |
| 5.0% aq. TMAH 23° C. | 287 | 43 | −25 | −6 |
| 5.0% aq. TMAH 50° C. | [1604] | 298 | 69 | 809 |
| 5.0% aq. TMAH 75° C. | [2639] | 1212 | 309 | 2709 |
| 10.0% aq. TMAH 23° C. | >3491 | 166 | −8 | 17 |
| 10.0% aq. TMAH 50° C. | >3427 | 716 | 162 | 878 |
| 10.0% aq. TMAH 75° C. | >3443 | >2706 | 1440 | >2912 |

Thus, specific embodiments and applications of compositions and methods to produce absorbing compositions, coating materials, spin-on materials, spin-on inorganic materials and spin-on glass materials comprising at least one inorganic compound, at least one absorbing compound or material, and at least one material modification agent, such as at least one adhesion promoter, at least one pH tuning agent, at least one porogen, at least one high-boiling solvent, at least one crosslinking agent at least one catalyst and/or at least one capping agent, and/or a combination thereof have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. An absorbing composition comprising at least one inorganic-based compound, at least one organic-based absorbing compound, and at least one material modification agent, wherein the at least one material modification agent comprises at least one adhesion promoter and at least one crosslinking agent, at least one catalyst, at least one capping agent, at least one pH tuning agent or a combination thereof, wherein the at least one adhesion promoter comprises APTEOS triflate, APTEOS methanesulfonate, APTEOS nonafluorobutane-1-sulfonate, ammonium triflate, ammonium nonafluorobutane-1-sulfonate, ammonium methanesulfonate, ammonium, nitrate, TMAH triflate, TMAH nonafluorobutane-1-sulfonate, TMAH methanesulfonate, TMAH nitrate or a combination thereof, wherein the at least one adhesion promoter does not initiate crosslinking activity in the composition and wherein the absorbing compound absorbs light over at least an approximately 10 nm wide wavelength range at wavelengths less than 375 nm and wherein the at least one organic absorbing compound comprises anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-alkyl triethoxysilane, phenyltriethoxysilane, 10-phenanthrene carboxy-methyl triethoxysilane, 4-phenylazophenol, 4-ethoxyphenylazobenzene-4-carboxy-methyl triethoxysilane, 4-methoxyphenylazobenzene-4-carboxymethyl triethoxysilane or mixtures thereof.

2. The composition of claim 1, wherein the organic-based absorbing compound is an carbon-containing compound.

3. The composition of claim 1, wherein the range comprises wavelengths less than about 260 nm.

4. The composition of claim 1, wherein the at least one adhesion promoter further comprises phosphorus.

5. The composition of claim 1, wherein the at least one adhesion promoter further comprises an acid.

6. The composition of claim 1, the at least one adhesion promoter further comprises a neutral compound.

7. The composition of claim 1, wherein the at least one adhesion promoter further comprises a weak acid.

8. The composition of claim 1, wherein the at least one adhesion promoter further comprises a resin-based material.

9. The composition of claim 8, wherein the resin-based material comprises at least one of a phenolic-containing resin, a novolac resin, an organic acrylate resin or a styrene resin.

10. The composition of claim 1, wherein the adhesion promoter further comprises a polydimethylsiloxane-based material, an alkoxy or hydroxy-containing silane monomer, a vinyl-containing silane monomer, an acrylated silane monomer or a silyl hydride compound.

11. The composition of claim 1, wherein the inorganic-based compound comprises a silicon-based compound.

12. The composition of claim 11, wherein the silicon-based compound comprises a polymer.

13. The composition of claim 12, wherein the polymer comprises an organosiloxane compound.

14. The composition of claim 13, wherein the organosiloxane comprises methylsiloxane, methylsilsesquioxane, phenylsiloxane, phenylsilsesquioxane, acrylic siloxane polymers, methylphenylsiloxane, methylphenylsilsesquioxane, silicate polymers, silazane polymers or mixtures thereof.

15. The composition of claim 12, wherein the polymer comprises hydrogensiloxane, hydrogensilsesquioxane, organohydridosiloxane, silsesquioxane-based compounds, derivatives of silicic acid and organohydridosilsesquioxane polymers; copolymers of hydrogensilsesquioxane and an alkoxyhydridosiloxane, hydroxyhydridosiloxane, derivatives of silicic acid or mixtures thereof.

16. The composition of claim 12, wherein the polymer is of a general formula comprising $(H_{0-1.0}SiO_{1.5-2.0})_x$, where x is greater than about 4, and $(H_{0-1.0}SiO_{1.5-2.0})_n(R_{0-1.0}SiO_{1.5-2.0})_m$, where m is greater than 0, the sum of n and m is from about 4 to about 5000 and R is a $C_1$-$C_{20}$ alkyl group or a $C_6$-$C_{12}$ aryl group.

* * * * *